(12) United States Patent
Sung et al.

(10) Patent No.: US 11,961,943 B2
(45) Date of Patent: Apr. 16, 2024

(54) LIGHT EMITTING SEMICONDUCTOR DEVICE FOR ENHANCING LIGHT EXTRACTION EFFICIENCY

(71) Applicant: SUZHOU LEKIN SEMICONDUCTOR CO., LTD., Suzhou (CN)

(72) Inventors: Youn Joon Sung, Seoul (KR); Min Sung Kim, Seoul (KR); Eun Dk Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 250 days.

(21) Appl. No.: 17/461,601

(22) Filed: Aug. 30, 2021

(65) Prior Publication Data

US 2021/0399176 A1 Dec. 23, 2021

Related U.S. Application Data

(62) Division of application No. 16/331,015, filed as application No. PCT/KR2017/009954 on Sep. 11, 2017, now Pat. No. 11,569,416.

(30) Foreign Application Priority Data

Sep. 10, 2016 (KR) ........................ 10-2016-0116886
Sep. 13, 2016 (KR) ........................ 10-2016-0118241

(Continued)

(51) Int. Cl.
*H01L 33/38* (2010.01)
*H01L 33/12* (2010.01)
*H01L 33/32* (2010.01)

(52) U.S. Cl.
CPC .............. *H01L 33/38* (2013.01); *H01L 33/12* (2013.01); *H01L 33/32* (2013.01); *H01L 33/382* (2013.01); *H01L 2933/0016* (2013.01)

(58) Field of Classification Search
CPC .. H01L 33/38–387; H01L 33/12; H01L 33/44
See application file for complete search history.

(56) References Cited

U.S. PATENT DOCUMENTS 4,910,571 A    3/1990  Kasahara et al.
5,153,889 A   10/1992  Sugawara et al.
(Continued)

FOREIGN PATENT DOCUMENTS

CN   101447468 B    1/2011
CN   102254936 A   11/2011
(Continued)

OTHER PUBLICATIONS

English machine translation of WO 2016/063501 to Goto et al. (Year: 2016).*

*Primary Examiner* — Laura M Menz
*Assistant Examiner* — Candice Chan
(74) *Attorney, Agent, or Firm* — Birch, Stewart, Kolasch & Birch, LLP

(57) ABSTRACT

A semiconductor device including a semiconductor structure including a first semiconductor layer, a second semiconductor layer, and an active layer; a first electrode provided on a first surface of the first semiconductor layer; a second electrode provided on a first surface of the second semiconductor layer, the active layer being provided between the first surface of the first semiconductor layer and a second surface of the second semiconductor layer that is opposite to the first surface of the second semiconductor layer; a first insulation layer provided on the first surface of the first semiconductor layer, the first surface of the second semiconductor layer, and a side surface of the active layer; a first (Continued)

cover electrode provided on the first electrode; a second cover electrode provided on the second electrode, a second insulation layer provided on the first cover electrode, the second cover electrode, and the first insulation layer, wherein: the second insulation layer includes a first opening over the first cover electrode and a second opening over the second cover electrode, and a plan view of the semiconductor includes a light emitting region that includes a surface of the second cover electrode in the second opening of the second insulation layer, and a non-light emitting region that includes a surface of the first cover electrode in the second opening of the first insulation layer, and a first area of the non-light emitting region is smaller than a second area of the light emitting region.

4 Claims, 36 Drawing Sheets

(30) Foreign Application Priority Data

Sep. 13, 2016 (KR) .................. 10-2016-0118242
Jul. 28, 2017 (KR) .................. 10-2017-0096477

(56) References Cited

U.S. PATENT DOCUMENTS

| | | |
|---|---|---|
| 6,614,119 B1 | 9/2003 | Asahina et al. |
| 6,777,253 B2 | 8/2004 | Ishibashi et al. |
| 7,065,117 B2 | 6/2006 | Yamanaka |
| 8,154,042 B2 | 4/2012 | Aldaz et al. |
| 8,269,410 B2 | 9/2012 | Kijima et al. |
| 8,476,666 B2 | 7/2013 | Kim et al. |
| 8,488,644 B2 | 7/2013 | Imai et al. |
| 8,592,954 B2 | 11/2013 | Emura et al. |
| 8,969,898 B2 | 3/2015 | Onishi et al. |
| 8,994,001 B2 | 3/2015 | Son |
| 9,276,167 B2 | 3/2016 | Höppel |
| 9,401,452 B2 | 7/2016 | Northrup et al. |
| 9,450,151 B2 | 9/2016 | Choi et al. |
| 9,537,055 B2 | 1/2017 | Park et al. |
| 9,540,252 B1 | 1/2017 | Collins et al. |
| 9,590,141 B2 | 3/2017 | Tachibana et al. |
| 9,711,682 B2 | 7/2017 | Han et al. |
| 9,748,410 B2 | 8/2017 | Kinoshita et al. |
| 10,347,804 B2 | 7/2019 | Yoo et al. |
| 2002/0088985 A1 | 7/2002 | Komoto et al. |
| 2003/0006418 A1 | 1/2003 | Emerson et al. |
| 2003/0141506 A1 | 7/2003 | Sano et al. |
| 2005/0127391 A1 | 6/2005 | Yanamoto |
| 2005/0179045 A1 | 8/2005 | Ryu et al. |
| 2006/0131558 A1 | 6/2006 | Sato et al. |
| 2006/0260671 A1 | 11/2006 | Ohta et al. |
| 2007/0023777 A1 | 2/2007 | Sonobe et al. |
| 2007/0205375 A1 | 9/2007 | Ward et al. |
| 2008/0061308 A1 | 3/2008 | Yoon |
| 2008/0185606 A1 | 8/2008 | Sano et al. |
| 2008/0247435 A1 | 10/2008 | Choi |
| 2009/0140389 A1 | 6/2009 | Shiozawa et al. |
| 2010/0006884 A1 | 1/2010 | Ou et al. |
| 2010/0051978 A1 | 3/2010 | Katsuno et al. |
| 2010/0051987 A1 | 3/2010 | Katsuno et al. |
| 2010/0096652 A1 | 4/2010 | Choi et al. |
| 2011/0266568 A1 | 11/2011 | Aldaz et al. |
| 2011/0297997 A1 | 12/2011 | Izuka et al. |
| 2012/0040480 A1 | 2/2012 | Shieh et al. |
| 2012/0085986 A1 | 4/2012 | Iwanaga et al. |
| 2012/0112218 A1 | 5/2012 | Teng et al. |
| 2012/0141771 A1 | 6/2012 | Pan et al. |
| 2012/0292631 A1 | 11/2012 | Katsuno et al. |
| 2013/0082237 A1 | 4/2013 | Northrup et al. |
| 2013/0214320 A1 | 8/2013 | Onishi et al. |
| 2014/0034981 A1 | 2/2014 | Hung et al. |
| 2014/0084274 A1 | 3/2014 | Yamazaki et al. |
| 2014/0183446 A1 | 7/2014 | Nago et al. |
| 2014/0209955 A1 | 7/2014 | Kim et al. |
| 2014/0219304 A1 | 8/2014 | Lee et al. |
| 2014/0225143 A1 | 8/2014 | Kususe et al. |
| 2014/0239341 A1 | 8/2014 | Matsumura |
| 2015/0263305 A1 | 9/2015 | Premutico et al. |
| 2015/0318435 A1 | 11/2015 | Nago et al. |
| 2015/0380621 A1 | 12/2015 | Chae et al. |
| 2016/0005919 A1 | 1/2016 | Obata |
| 2016/0056338 A1 | 2/2016 | Park et al. |
| 2016/0111600 A1 | 4/2016 | Chae et al. |
| 2016/0149078 A1 | 5/2016 | Takeuchi et al. |
| 2016/0218262 A1 | 7/2016 | Aketa et al. |
| 2016/0247971 A1 | 8/2016 | Lee et al. |
| 2016/0284941 A1 | 9/2016 | Seo et al. |
| 2016/0365486 A1 | 12/2016 | Kim et al. |
| 2017/0025566 A1 | 1/2017 | Song et al. |
| 2017/0098736 A1 | 4/2017 | Lee et al. |
| 2017/0170360 A1 | 6/2017 | Bour et al. |
| 2017/0317236 A1 | 11/2017 | Lee et al. |
| 2018/0069150 A1 | 3/2018 | Oh et al. |
| 2018/0076355 A1 | 3/2018 | Hayashi et al. |
| 2018/0145219 A1 | 5/2018 | Kim et al. |
| 2018/0151778 A1 | 5/2018 | Park et al. |
| 2019/0181300 A1 | 6/2019 | Park et al. |
| 2019/0326473 A1 | 10/2019 | Choi et al. |

FOREIGN PATENT DOCUMENTS

| | | |
|---|---|---|
| CN | 102270722 B | 9/2014 |
| EP | 1 385 215 A2 | 1/2004 |
| EP | 1 453 160 A1 | 9/2004 |
| EP | 2 955 763 A1 | 12/2015 |
| EP | 2 988 339 A2 | 2/2016 |
| EP | 3 043 395 A1 | 7/2016 |
| EP | 3 073 539 A1 | 9/2016 |
| EP | 3 291 314 A1 | 3/2018 |
| JP | 7-106631 A | 4/1995 |
| JP | 2001-203385 A | 7/2001 |
| JP | 2003-110140 A | 4/2003 |
| JP | 2003-115642 A | 4/2003 |
| JP | 2004-104157 A | 4/2004 |
| JP | 2006-32779 A | 2/2006 |
| JP | 2006-41403 A | 2/2006 |
| JP | 2007-103690 A | 4/2007 |
| JP | 2007-134533 A | 5/2007 |
| JP | 2007-324585 A | 12/2007 |
| JP | 2008-171884 A | 7/2008 |
| JP | 2008-285758 A | 11/2008 |
| JP | 2009-135251 A | 6/2009 |
| JP | 2010-56322 A | 3/2010 |
| JP | 2010-62274 A | 3/2010 |
| JP | 2010-171272 A | 8/2010 |
| JP | 2011-187591 A | 9/2011 |
| JP | 2011-258670 A | 12/2011 |
| JP | 2012-49337 A | 3/2012 |
| JP | 2012-216603 A | 11/2012 |
| JP | 2013-105917 A | 5/2013 |
| JP | 2013-149889 A | 8/2013 |
| JP | 2013-171982 A | 9/2013 |
| JP | 2013-243254 A | 12/2013 |
| JP | 5474292 B2 | 4/2014 |
| JP | 2014-195055 A | 10/2014 |
| JP | 2014-241397 A | 12/2014 |
| JP | 2015-177023 A | 10/2015 |
| JP | 2015-216352 A | 12/2015 |
| JP | 2016-44095 A | 4/2016 |
| JP | 2016-66691 A | 4/2016 |
| JP | 2016-84822 A | 5/2016 |
| JP | 2016-184724 A | 10/2016 |
| JP | 2016-213448 A | 12/2016 |
| KR | 10-2010-0044726 A | 4/2010 |
| KR | 10-2014-0003351 A | 1/2014 |
| KR | 10-2014-006429 A | 1/2014 |
| KR | 10-2014-009979 A | 8/2014 |
| KR | 10-1458389 B1 | 11/2014 |
| KR | 10-2016-0037060 A | 4/2016 |
| KR | 10-2016-0056524 A | 5/2016 |

(56) References Cited

FOREIGN PATENT DOCUMENTS

| KR | 10-2016-0062659 A | 6/2016 |
|----|-------------------|--------|
| KR | 10-2016-0102774 A | 8/2016 |
| KR | 10-2016-0103686 A | 9/2016 |
| KR | 10-2016-0105126 A | 9/2016 |
| KR | 10-2016-0117010 A | 10/2016 |
| WO | WO 2005/101532 A1 | 10/2005 |
| WO | WO 2006/043422 A1 | 4/2006 |
| WO | WO 2010/146808 A1 | 12/2010 |
| WO | WO 2014/123092 A1 | 8/2014 |
| WO | WO 2015/156588 A1 | 10/2015 |
| WO | WO 2016/004374 A | 1/2016 |
| WO | WO 2016/063501 A | 4/2016 |
| WO | WO2016/159638 A1 | 10/2016 |
| WO | WO2016/163083 A1 | 10/2016 |
| WO | WO 2017/049053 A1 | 3/2017 |

\* cited by examiner (a)

(b)

(c)

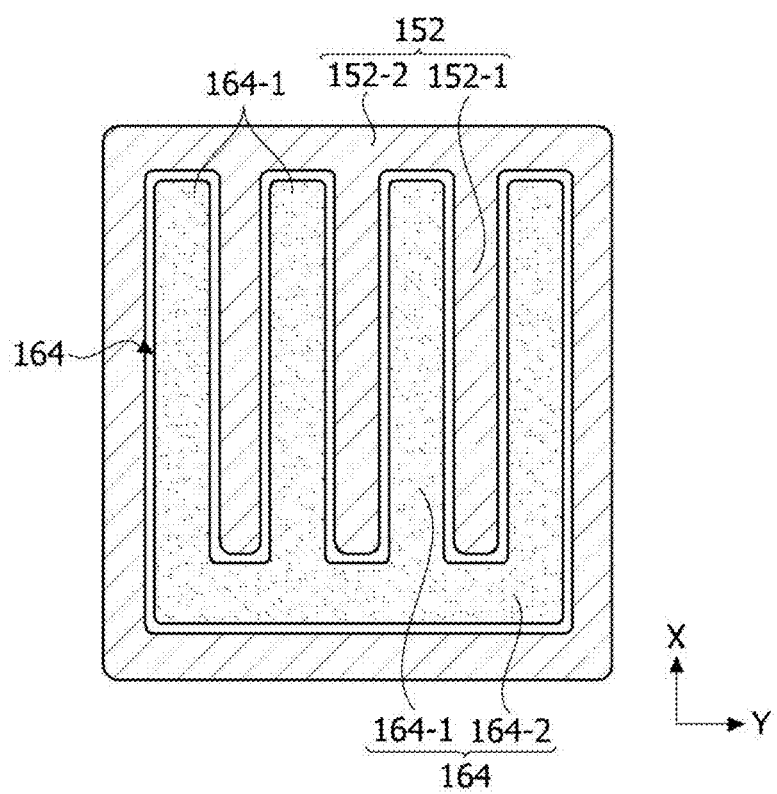

246 152 151 153
150

246 152 151 153 154
150

LIGHT EMITTING SEMICONDUCTOR DEVICE FOR ENHANCING LIGHT EXTRACTION EFFICIENCY

CROSS-REFERENCE TO RELATED APPLICATIONS

This Application is a Divisional of U.S. patent application Ser. No. 16/331,015 filed on Mar. 6, 2019, which is the National Phase of PCT International Application No. PCT/KR2017/009954 filed on Sep. 11, 2017, which claims the priority benefit under 35 U.S.C. 119(a) to Korean Patent Application Nos. 10-2017-0096477 filed on Jul. 28, 2017, 10-2016-0118242 filed on Sep. 13, 2016, 10-2016-0118241 filed on Sep. 13, 2016 and 10-2016-0116886 filed Sep. 10, 2016, all filed in the Republic of Korea, and all of which are hereby expressly incorporated by reference into the present application.

BACKGROUND OF THE INVENTION

Field of the Invention

Embodiments relate to semiconductor devices.

Discussion of the Related Art

Semiconductor devices including compounds such as GaN and AlGaN have many merits such as wide and adjustable band gap energy and thus may be variously used as light emitting devices, light receiving devices, various kinds of diodes, or the like.

In particular, light emitting devices using group III-V or II-VI compound semiconductors or light emitting devices such as a laser diode may implement various colors such as red, green, blue, and ultraviolet due to the development of thin film growth technology and device materials, and may implement efficient white light rays by using fluorescent materials or combining colors. These light emitting devices also have advantages with respect to low power consumption, semi-permanent life span, fast response time, safety, and environmental friendliness compared to conventional light sources such as a fluorescent lamp, an incandescent lamp, or the like.

In addition, when light receiving devices such as optical detectors or solar cells are produced using group III-V or II-VI compound semiconductors, an optical current may be generated by light absorption in various wavelength ranges through development of device materials. Thus, light may be used in various wavelength ranges from gamma rays to radio wavelength regions. Also, the light receiving devices have the advantages of fast response time, stability, environmental friendliness, and ease of adjustment of device materials and may be easily used to power control or microwave circuits or communication modules.

Accordingly, semiconductor devices are being extensively used in the transmission modules of optical communication means, light emitting diode backlights substituted for cold cathode fluorescence lamps (CCFL) forming the backlights of liquid crystal display (LCD) devices, white light emitting diode lamps to be substituted for fluorescent bulbs or incandescent bulbs, car headlights, traffic lights, and sensors for detecting gas or fire. In addition, semiconductor devices may also be extensively used in high-frequency application circuits or other power control devices and even communication modules.

In particular, a light emitting device that emits light in an ultraviolet wavelength range may be used for curing, medical, and sterilization purposes due to its curing or sterilizing action.

Recently, research on ultraviolet light emitting devices has been actively conducted, but the ultraviolet light emitting devices are difficult to implement as a vertical or flip chip and also have relatively low light extraction efficiency.

SUMMARY OF THE INVENTION

An embodiment provides a semiconductor device having enhanced light extraction efficiency.

An embodiment provides a semiconductor device having good electric current spreading efficiency.

An embodiment provides a flip-chip-type ultraviolet light emitting device.

An embodiment provides a semiconductor device having an improved operating voltage.

An embodiment provides a semiconductor device having enhanced optical output power.

Problems to be solved in the embodiments are not limited thereto, and include the following technical solutions and objectives of effects understandable from the embodiments.

According to an embodiment of the present invention, a semiconductor device includes a semiconductor structure including a first conductive semiconductor layer, a second conductive semiconductor layer, and an active layer disposed between the first conductive semiconductor layer and the second conductive semiconductor layer; a first insulation layer disposed on the semiconductor structure; a first electrode disposed on the first conductive semiconductor layer; a second electrode disposed on the second conductive semiconductor layer; a first cover electrode disposed on the first electrode; a second cover electrode disposed on the second electrode; and a second insulation layer extending from an upper surface of the first cover electrode to an upper surface of the second cover electrode. The semiconductor structure includes a first surface extending from an upper surface of the first conductive semiconductor layer where the first electrode is disposed to a side surface of the active layer and an upper surface of the second conductive semiconductor where the second electrode is disposed. The first insulation layer is disposed on the first surface to be spaced apart from the first electrode. The first insulation layer is disposed on the first surface to overlap with the first cover electrode in a first direction perpendicular to the upper surface of the first conductive semiconductor layer.

The first insulation layer and the first electrode may have a separation distance greater than 0 μm and less than 4 μm.

The first insulation layer may be disposed on the first surface to be spaced apart from the second electrode, and the first insulation layer may be disposed on the first surface to overlap with the first second electrode in the first direction.

The first electrode may include a first groove disposed on an upper surface thereof and a protrusion portion surrounding the first groove, and the first cover electrode may be disposed on the first groove and the protrusion portion.

According to an embodiment, it is possible to enhance light extraction efficiency.

It is also possible to enhance optical output power due to good electric current spreading efficiency.

It is also possible to lower an operating voltage.

Various advantageous merits and effects of the present invention are not limited to the above-descriptions and will be easily understood while embodiments of the present invention are described in detail.

BRIEF DESCRIPTION OF THE DRAWINGS

FIG. 14E is a modification of FIG. 14D.

DETAILED DESCRIPTION OF THE EMBODIMENTS

The following embodiments may be modified or combined with each other, and the scope of the present invention is not limited to the embodiments.

Details described in a specific embodiment may be understood as descriptions associated with other embodiments unless otherwise stated or contradicted even if there is no description thereof in the other embodiments.

For example, when features of element A are described in a specific embodiment and features of element B are described in another embodiment, an embodiment in which element A and element B are combined with each other should be understood as falling within the scope of the present invention unless otherwise stated or contradicted even if not explicitly stated.

In the descriptions of embodiments, when an element is referred to as being above or under another element, the two elements may be in direct contact with each other, or one or more other elements may be disposed between the two elements. In addition, the term "above or under" used herein may represent a downward direction in addition to an upward direction with respect to one element.

Hereinafter, example embodiments will be described in detail with reference to the accompanying drawings so that they can be easily practiced by those skilled in the art.

Figure 1:
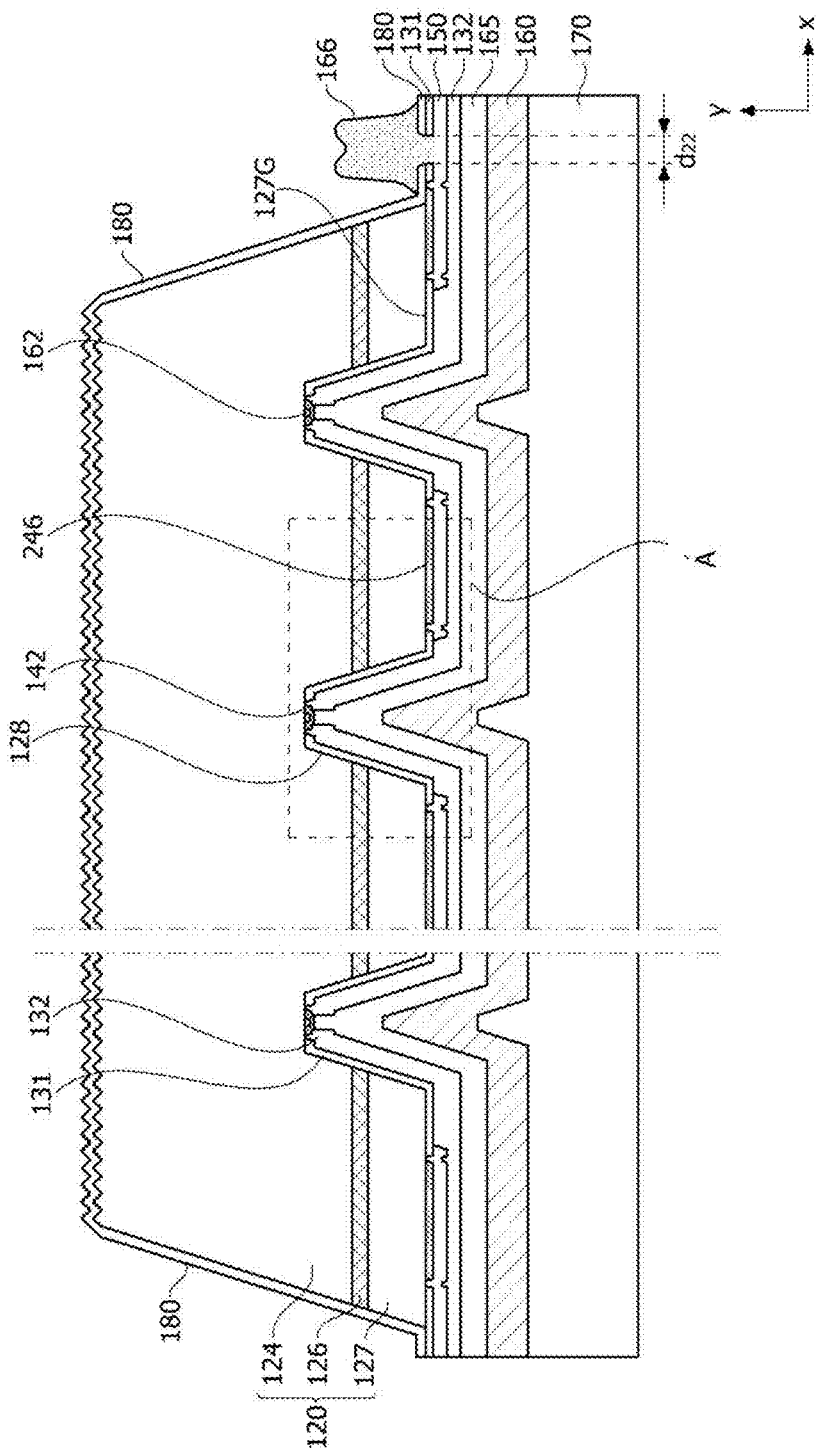
FIG. 1 is a conceptual view of a semiconductor device according to a first embodiment of the present invention.

FIG. 1 is a conceptual view of a semiconductor device according to a first embodiment of the present invention.

Referring to FIG. 1, the semiconductor device according to an embodiment includes a semiconductor structure 120 including a first conductive semiconductor layer 124, a second conductive semiconductor layer 127, and an active layer 126 disposed between the first conductive semiconductor layer 124 and the second conductive semiconductor layer 127.

The semiconductor structure 120 according to an embodiment of the present invention may output ultraviolet wavelength light. For example, the semiconductor structure 120 may output near-ultraviolet wavelength light (UV-A), far-ultraviolet wavelength light (UV-B), or deep-ultraviolet wavelength light (UV-C). The wavelength range may be determined by the aluminum composition of the semiconductor structure 120.

For example, the near-ultraviolet wavelength light (UV-A) may have a wavelength ranging from 320 nm to 420 nm, the far-ultraviolet wavelength light (UV-B) may have a wavelength ranging from 280 nm to 320 nm, and the deep-ultraviolet wavelength light (UV-C) may have a wavelength ranging from 100 nm to 280 nm.

The first conductive semiconductor layer 124 may be made of a group III-V or group II-VI compound semiconductor and may be doped with a first dopant. The first conductive semiconductor layer 124 may be made of a material selected from among semiconductor materials having an empirical formula $In_{x1}Al_{y1}Ga_{1-x1-y1}N$ ($0 \leq x1 \leq 1$, $0 \leq y1 \leq 1$, and $0 \leq x1+y1 \leq 1$), for example, GaN, AlGaN, InGaN, InAlGaN, and so on. Also, the first dopant may be an n-type dopant such as Si, Ge, Sn, Se, and Te. When the first dopant is an n-type dopant, the first conductive semiconductor layer 124 doped with the first dopant may be an n-type semiconductor layer.

The active layer 126 is disposed between the first conductive semiconductor layer 124 and the second conductive semiconductor layer 127. The active layer 126 is a layer in which electrons (or holes) injected through the first conductive semiconductor layer 124 are combined with holes (or electrons) injected through the second conductive semiconductor layer 127. The active layer 126 may transition to a lower energy level due to recombination between an electron and a hole and generate light having an ultraviolet wavelength.

The active layer 126 may have, but is not limited to, any one of a single-well structure, a multi-well structure, a single-quantum-well structure, a multi-quantum-well (MQW) structure, a quantum dot structure, and a quantum wire structure.

The second conductive semiconductor layer 127 may be formed on the active layer 126 and may be made of a group III-V or group II-VI compound semiconductor. Also, the second conductive semiconductor layer 127 may be doped with a second dopant. The second conductive semiconductor layer 127 may be made of a semiconductor material having an empirical formula $In_{x5}Al_{y2}Ga_{1-x5-y2}N$ ($0 \leq x5 \leq 1$, $0 \leq y2 \leq 1$, and $0 \leq x5+y2 \leq 1$) or a material selected from among AlInN, AlGaAs, GaP, GaAs, GaAsP, and AlGaInP. When the second dopant is a p-type dopant such as Mg, Zn, Ca, Sr, and Ba, the second conductive semiconductor layer 127 doped with the second dopant may be a p-type semiconductor layer.

A plurality of recesses 128 may be disposed from a first surface 127G of the second conductive semiconductor layer 127 even to a portion of the first conductive semiconductor layer 124 through the active layer 126. A first insulation layer 131 may be disposed inside each of the recesses 128 to electrically insulate a first conductive layer 165 from the second conductive semiconductor layer 127 and the active layer 126.

A first electrode 142 may be disposed on top of each of the recesses 128 and electrically connected with the first conductive semiconductor layer 124. A second electrode 246 may be disposed on the first surface 127G of the second conductive semiconductor layer 127.

The first surface 127G of the second conductive semiconductor layer 127 where the second electrode 246 is disposed may be made of AlGaN. However, the present invention is not limited thereto, a GaN layer having a small band gap may be disposed between the first surface 127G and the second electrode 246 in order to increase electric current injection efficiency.

Each of the first electrode 142 and the second electrode 246 may be an ohmic electrode. Each of the first electrode 142 and the second electrode 246 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto.

A second electrode pad 166 may be disposed in an edge of the semiconductor device. The second electrode pad 166 may have a recessed central portion and thus have a top surface including a concave portion and a convex portion. A wire (not shown) may be bonded to the concave portion of the top surface. Accordingly, since the bonding area increases, the second electrode pad 166 may be strongly bonded to the wire.

The second electrode pad 166 may serve to reflect light. Thus, as the second electrode pad 166 gets closer to the semiconductor structure 120, it is possible to enhance light extraction efficiency.

The convex portion of the second electrode pad 166 may be higher than the active layer 126. Accordingly, the second electrode pad 166 may enhance light extraction efficiency and control an orientation angle by upwardly reflecting light emitted from the active layer 126 in a direction horizontal to the device.

The passivation layer 180 may be formed on top of and on the side surface of the semiconductor structure 120. The passivation layer 180 may be in contact with the first insulation layer 131 in a region adjacent to the second electrode 246 or in a lower portion of the second electrode 246.

An opening of the first insulation layer 131 where the second electrode pad 166 is in contact with a second conductive layer 150 may have a width d22 ranging, for example, from 40 μm to 90 μm. When the width d22 is less than 40 μm, the operating voltage may rise. When the width d22 is greater than 90 μm, it may be difficult to secure a processing margin for preventing exposure of the second conductive layer 150.

When the second conductive layer 150 is exposed outside the second electrode pad 166, there may be a reduction in reliability of the device. Accordingly, the width d22 may range from 60% to 95% of the entire width of the second electrode pad 166.

The first insulation layer 131 may electrically insulate the first electrode 142 from the active layer 126 and the second conductive semiconductor layer 127. Also, the first insulation layer 131 may electrically insulate the second conductive layer 150 from the first conductive layer 165.

The first insulation layer 131 may be made of at least one material selected from a group consisting of $SiO_2$, $Si_xO_y$, $Si_3N_4$, $Si_xN_y$, $SiO_xN_y$, $Al_2O_3$, $TiO_2$, and AlN, but is not limited thereto. The first insulation layer 131 may be formed as a single or multiple layers. For example, the first insulation layer 131 may be a distributed Bragg reflector (DBR) having a multi-layered structure including an Si oxide or a Ti compound. However, the present invention is not limited thereto, and the first insulation layer 131 may include various reflective structures.

When the first insulation layer 131 performs a reflection function, the first insulation layer 131 may upwardly reflect light emitted horizontally from the active layer 126, thereby enhancing light extraction efficiency. As the number of recesses 128 increases, an ultraviolet semiconductor device may have more effective light extraction efficiency than a semiconductor device that emits blue light.

The second conductive layer 150 may cover the second electrode 246. Accordingly, the second electrode pad 166, the second conductive layer 150, and the second electrode 246 may form one electrical channel.

The second conductive layer 150 may cover the second electrode 246 and may be in contact with the side surface and the bottom surface of the first insulation layer 131. The second conductive layer 150 may be made of a material having high adhesion strength to the first insulation layer 131 and may also be made of at least one material selected from a group consisting of Cr, Al, Ti, Ni, and Au, or an alloy thereof. The second conductive layer 150 may be made as a single or multiple layers.

A second insulation layer 132 may electrically insulate the second conductive layer 150 from the first conductive layer 165. The first conductive layer 165 may be electrically connected to the first electrode 142 through the second insulation layer 132.

The first conductive layer 165 and a junction layer 160 may be disposed according to the bottom surface of the semiconductor structure 120 and the shape of the recesses 128. The first conductive layer 165 may be made of a material with high reflectance. For example, the first conductive layer 165 may contain aluminum. When the first conductive layer 165 contains aluminum, the first conductive layer 165 may serve to upwardly reflect light emitted from the active layer 126, thereby enhancing light extraction efficiency.

The junction layer 160 may contain a conductive material. For example, the junction layer 160 may contain a material selected from a group consisting of gold, tin, indium, aluminum, silicon, silver, nickel, and copper, or an alloy thereof.

A substrate 170 may be made of a conductive material. For example, the substrate 170 may contain a metal or a semiconductor material. The substrate 170 may be made of a metal having good electrical conductivity and/or thermal conductivity. In this case, heat generated during operation of the semiconductor device may be quickly released to the outside.

The substrate 170 may contain a material selected from a group consisting of silicon, molybdenum, tungsten, copper, and aluminum, or an alloy thereof.

A square wave pattern may be formed on top of the semiconductor structure 120. The square wave pattern may enhance the extraction efficiency for light emitted from the semiconductor structure 120. The square wave pattern may have a different average height depending on ultraviolet wavelengths. For UV-C, the average height ranges from 300 nm to 800 nm. When the height ranges from 500 nm to 600 nm, it is possible to enhance light extraction efficiency.

Figure 2:
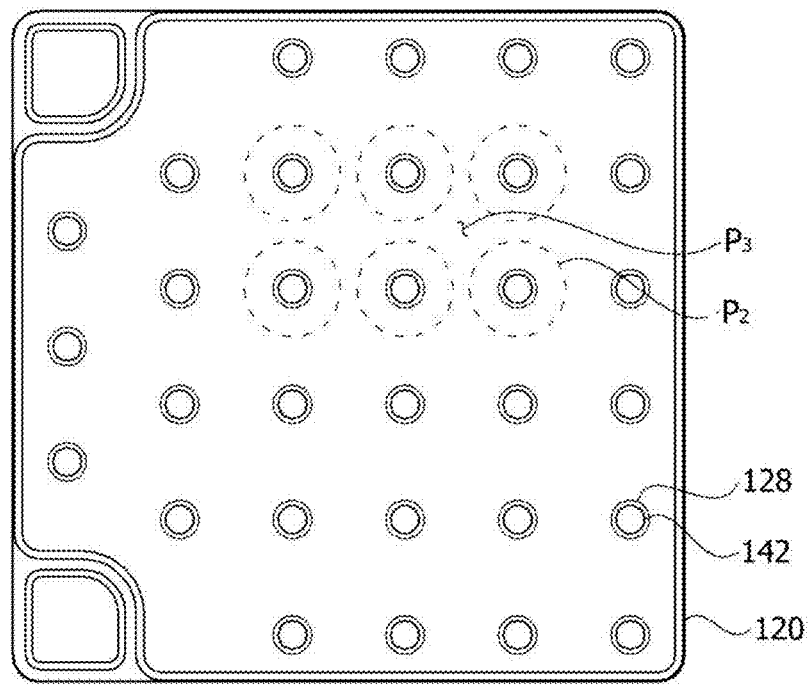
FIGS. 2 and 3 are views illustrating a configuration in which optical output power is enhanced depending on a change in number of recesses.
Figure 3:
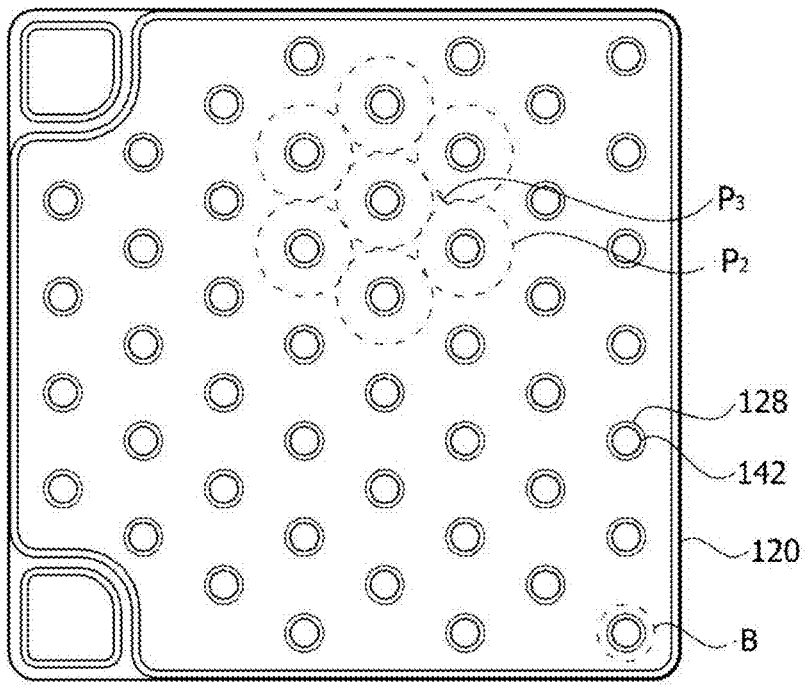

FIGS. 2 and 3 are views illustrating a configuration in which optical output power is enhanced depending on a change in number of recesses.

When the aluminum composition of the semiconductor structure 120 increases, there may be a deterioration in electric current spreading characteristics in the semiconductor structure 120. Also, the active layer has a large amount of light emitted to the side than a GaN-based blue light emitting device (TM mode). The TM mode may usually be performed by an ultraviolet semiconductor device.

The ultraviolet semiconductor device has reduced electric current spreading characteristics compared to a blue GaN semiconductor device. Accordingly, the ultraviolet semiconductor device needs to have a relatively large number of first electrodes 142 disposed therein compared to the blue GaN semiconductor device.

When the aluminum composition increases, the electric current spreading characteristics may deteriorate. Referring to FIG. 2, electric current is spread at only points adjacent to the first electrodes 142, and an electric current density may rapidly decrease at points far from the first electrodes 142. Accordingly, an effective light emitting region P2 may be narrowed.

The effective light emitting region P2 may be defined as a region from the center of the first electrode 142 having the highest electric current density to a boundary having an electric current density of 40% or less. For example, the effective light emitting region P2 may be adjusted to be less than 40 µm from the center of each of the recesses 128 depending on the level of injected electric current and the aluminum composition.

A low electric current density region P3 may have a low electric current density and thus may hardly contribute to light emission. Therefore, according to an embodiment, it is possible to enhance the optical output power by placing a larger number of first electrodes 142 in the low electric current density region P3, which has a low electric current density, or by using a reflective structure.

Generally, since a GaN-based semiconductor layer that emits blue light has relatively good electric current spreading characteristics, it is preferable that the areas of the recesses 128 and the first electrodes 142 be minimized. This is because the area of the active layer 126 decreases as the areas of the recesses 128 and the first electrodes 142 increase. However, according to an embodiment, the electric current spreading characteristics are relatively low because the aluminum composition is high. Accordingly, it may be preferable to reduce the low electric current density region P3 by increasing the number of first electrodes 142 although this reduces the area of the active layer 126.

Referring to FIG. 3, when the number of recesses 128 is 48, the recesses 128 may be arranged in a zigzag form instead of being straightly arranged in a horizontal or vertical direction. In this case, the area of the low electric current density region P3 may be further decreased, and thus most of the active layer 126 may participate in light emission.

When the number of recesses 128 ranges from 70 to 110, electric current may be efficiently spread, and thus it is additionally possible to lower the operating voltage and enhance the optical output power. For a semiconductor device that emits UV-C light, when the number of recesses 128 is less than 70, electrical and optical characteristics may be deteriorated. When the number of recesses 128 is greater than 110, it is possible to enhance electrical characteristics, but there may be a deterioration in optical characteristics due to the reduction in volume of the active layer. In this case, each of the recesses 128 may have a diameter ranging from 20 μm to 70 μm.

Referring to FIGS. 1 and 2, a first area of where the plurality of first electrodes 142 are in contact with the first conductive semiconductor layer 124 may range from 7.4% to 20% or from 10% to 20% of the maximum horizontal sectional area of the semiconductor structure 120. The first area may indicate the sum of areas of where the first electrodes 142 are in contact with the first conductive semiconductor layer 124.

When the first area of the plurality of first electrodes 142 is less than 7.4%, electric current spreading characteristics cannot be sufficient, and thus the optical output power decreases. When the first area is greater than 20%, the areas of the active layer 126 and the second electrode 246 excessively decrease, and thus the operating voltage increases and the optical output power decreases.

Also, the total area of the plurality of recesses 128 may range from 10% to 30% or from 13% to 30% of the maximum horizontal sectional area of the semiconductor structure 120. When the total area of the recesses 128 does not fall within this range, it may be difficult to keep the total area of the first electrode 142 within the range of 7.4% to 20%. Also, there are an increase in operating voltage and a decrease in optical output power.

The area of the second conductive semiconductor layer 127 may be equal to the maximum horizontal area of the semiconductor structure 120 minus the total area of the recesses 128. For example, the area of the second conductive semiconductor layer 127 may range from 70% to 90% of the maximum horizontal area of the semiconductor structure 120.

A second area of where the second electrode 246 and the second conductive semiconductor layer 127 are in contact with each other may range from 50% to 70% of the maximum horizontal sectional area of the semiconductor structure 120. The second area may be the total area of where the second electrode 246 is in contact with the second conductive semiconductor layer 127.

When the second area is less than 50%, the area of the second electrode 246 is so small that there may be an increase in operating voltage and a decrease in hole injection efficiency. When the second area exceeds 70%, the first area cannot be effectively widened, and thus there may be a decrease in electron injection efficiency. An area of the second electrode 246 and the second conductive semiconductor layer 127 being not in contact with each other may range from 1% to 20%.

The first area is inversely proportional to the second area. That is, when the number of recesses 128 is increased to increase the number of first electrodes 142, the area of the second electrode 246 decreases. Accordingly, in order to increase electrical and optical characteristics, the spreading characteristics for electrons and holes should be balanced. Accordingly, it is important to determine an appropriate ratio between the first area and the second area.

The ratio of the first area of where the plurality of first electrodes 142 are in contact with the first conductive semiconductor layer 124 to the second area of where the second electrode 246 is in contact with the second conductive semiconductor layer 127 (first area:second area) may range from 1:3 to 1:7.

When the area ratio is greater than 1:7, the first area is so relatively small that the electric current spreading characteristics may deteriorate. Also, when the area ratio is less than 1:3, the second area is so relatively small that the electric current spreading characteristics may deteriorate.

The first electrode 142 may contain a metal or metal oxide with low resistance. The first electrode 142 may absorb visible light and ultraviolet light. Accordingly, it is necessary to reduce the amount of light absorbed by the first electrode 142 in terms of light extraction.

For example, when the first electrode 142 is narrowed and a reflective layer is disposed, it is possible to enhance the light extraction efficiency. In this case, it is important to secure a maximum reflective region while securing the contact area of the first electrode 142 needed to spread electric current.

Figure 4:
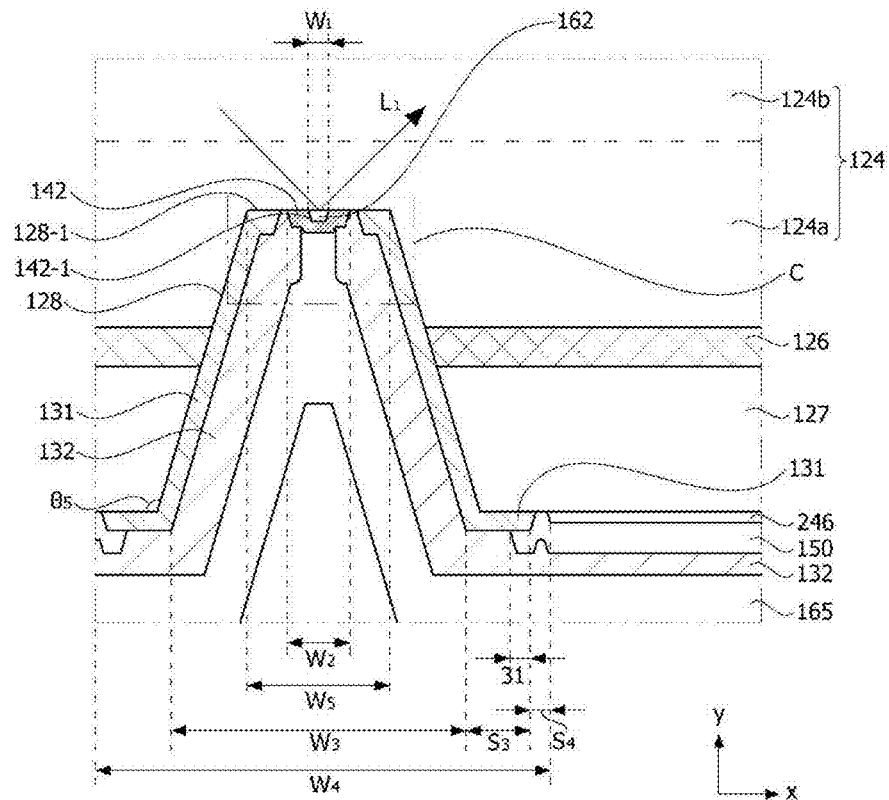
FIG. 4 is an enlarged view of a part A of FIG. 1.
Figure 5:
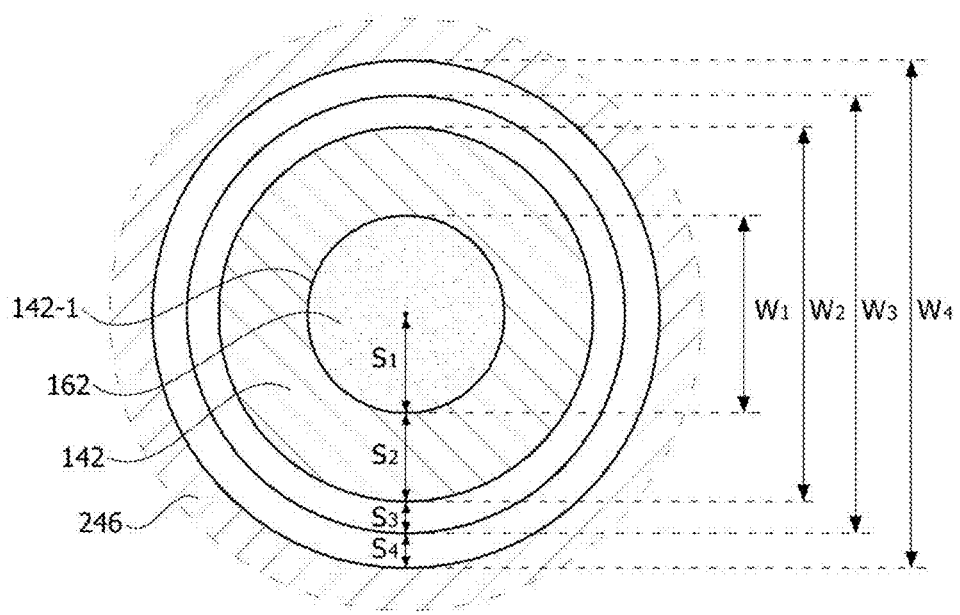
FIG. 5 is an enlarged view of a part B of FIG. 3.
Figure 6:
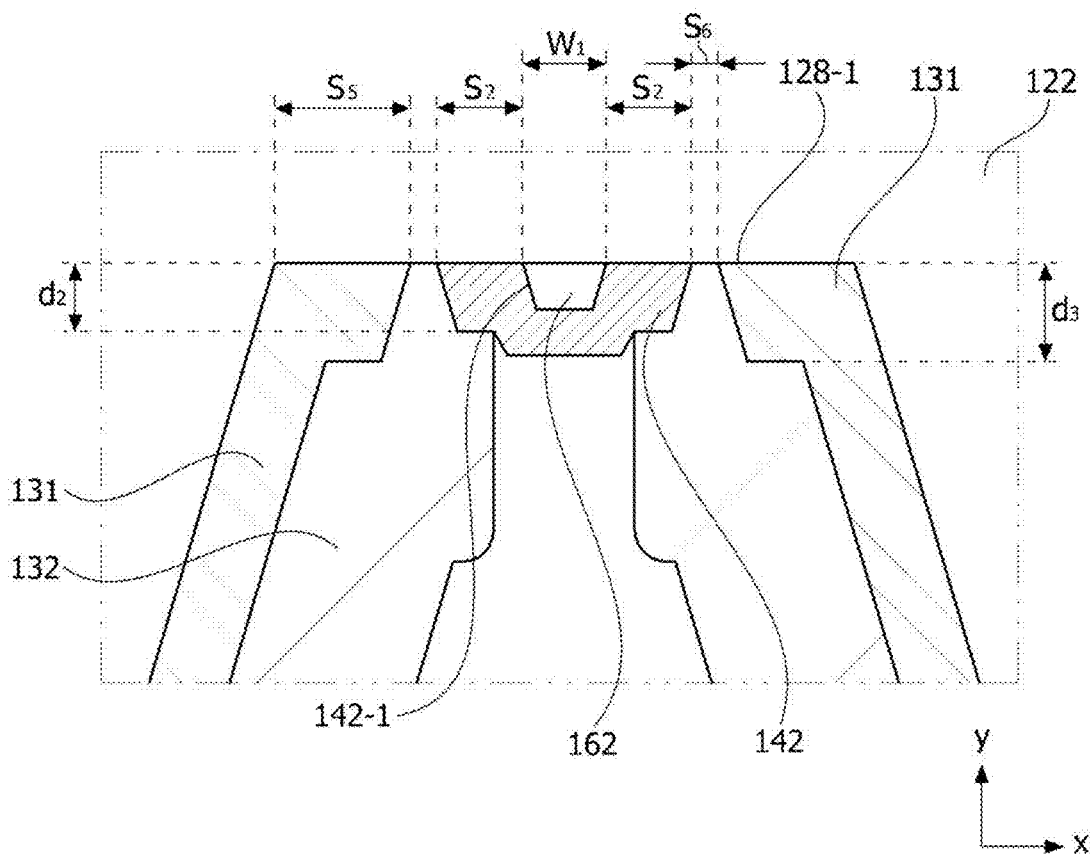
FIG. 6 is an enlarged view of a part C of FIG. 4.
Figure 7:
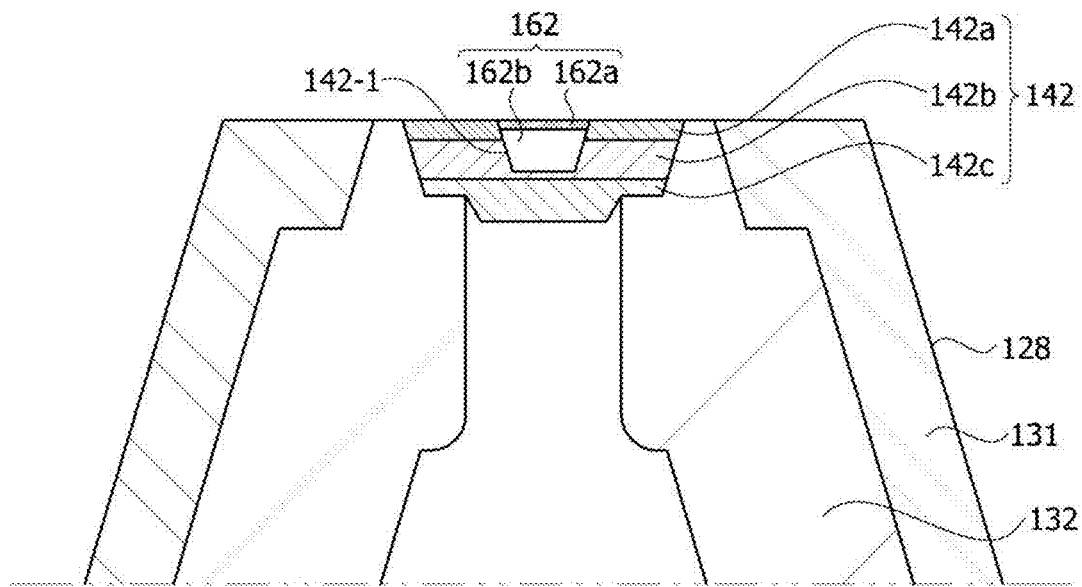
FIG. 7 is a diagram showing a layer structure of a first electrode and a reflective layer.

FIG. 4 is an enlarged view of a part A of FIG. 1, FIG. 5 is an enlarged view of a part B of FIG. 3, FIG. 6 is an enlarged view of a part C of FIG. 4, and FIG. 7 is a diagram showing a layer structure of a first electrode and a reflective layer.

Referring to FIG. 4, the first conductive semiconductor layer 124 may have a low concentration layer 124a having a relative low aluminum concentration and a high concentration layer 124b having a relative high aluminum concentration. The aluminum concentration of the high concentration layer 124b may range from 60% to 70%, and the aluminum concentration of the low concentration layer 124a may range from 40% to 50%. The low concentration layer 124a may be disposed adjacent to the active layer 126.

The first electrode 142 may be disposed inside the low concentration layer 124a. That is, the recess 128 may be formed even in the region of the low concentration layer 124a. This is because the high concentration layer 124b has a high aluminum concentration and relative low electric current spreading characteristics. Accordingly, the first electrode 142 may be in contact with and thus ohmic with the low concentration layer 124a inside the recess 128, and light emitted to the high concentration layer 124b is not absorbed by the high concentration layer 124b, and thus it is possible to enhance the light emitting efficiency.

The recess 128 may have a diameter W3 ranging from 20 μm to 70 μm. The diameter W3 of the recess 128 may be the diameter of a region of the recess 128 formed under the second conductive semiconductor layer 127 and having the greatest area.

The diameter W1 of the recess 128 is less than 20 μm, it is difficult to secure a processing margin for forming the first electrode 142 disposed inside the recess 128. Also, the diameter W1 of the recess 128 is greater than 70 μm, the area of the active layer 126 may decrease and thus the light emission efficiency may deteriorate.

The recess 128 may have a diameter W5 of a top surface 128-1 ranging from 25 μm to 65 μm. For example, the diameter W3 of the recess 128 may be 56 μm, and the diameter W5 of the top surface 128-1 may be 54 μm. The recess 128 may have an incline angle θ5 ranging from 70 degrees to 90 degrees. When this range is satisfied, this is advantageous in forming the first electrode 142 on the top surface 128-1, and it is possible to form a large number of recesses 128.

When the incline angle θ5 is less than 90 degrees or greater than 120 degrees, the area of the active layer 126 may decrease and thus the light emission efficiency may deteriorate. It is possible to adjust the area of the first electrode 142 and the area of the second electrode 246 by using the incline angle θ5 of the recess 128.

In order to reduce absorption of ultraviolet light, the second electrode 246 may have a smaller thickness than the first insulation layer 131. The thickness of the second electrode 246 may range from 1 nm to 15 nm.

The second electrode 246 and the first insulation layer 131 may have a separation distance S4 ranging from 1 μm to 4 μm. When the separation distance S4 is less than 1 μm, it is difficult to secure a processing margin and thus there may be a reduction in reliability. When the separation distance S4 is greater than 4 μm, the area of the second electrode 246 is small so that the operative voltage may increase.

The second conductive layer 150 may cover the second electrode 246. Accordingly, the second electrode pad 166, the second conductive layer 150, and the second electrode 246 may form one electrical channel.

When the second conductive layer 150 is in contact with the side surface and the bottom surface of the first insulation layer 131, it is possible to enhance thermal and electrical reliability of the second electrode 246. Also, the second conductive layer 150 may have a reflection function for upwardly reflecting light emitted to a gap between the first insulation layer 131 and the second electrode 246. A region where a Schottky junction is formed by the second conductive semiconductor layer 126 coming into contact with the second conductive layer 150 may be disposed. By forming the Schottky junction, it is possible to facilitate spreading of electric current.

The second conductive layer 150 may extend to a lower portion of the first insulation layer 131. In this case, it is possible to suppress detachment of an end portion of the first insulation layer 131. Accordingly, it is possible to prevent penetration of external moisture or contaminants.

The second insulation layer 132 may electrically insulate the second conductive layer 150 from the first conductive layer 165. The first conductive layer 165 may be electrically connected to the first electrode 142 through the second insulation layer 132.

According to an embodiment, the second insulation layer 132 is disposed between the first electrode 142 and the second electrode 246 and over the first insulation layer 131, and thus it is possible to prevent penetration of external moisture and/or other contaminants even when a defect occurs in the first insulation layer 131.

For example, when the first insulation layer 131 and the second insulation layer 132 are formed as a single layer, a defect such as a crack may easily propagate in a thickness direction. Accordingly, external moisture or contaminants may penetrate into the semiconductor structure through the exposed defect.

However, according to an embodiment, the second insulation layer 132 is separately disposed on the first insulation layer 131, and thus it is difficult for a defect formed in the first insulation layer 131 to propagate to the second insulation layer 132. That is, an interface between the first insulation layer 131 and the second insulation layer 132 may serve to block the propagation of the defect.

The first insulation layer 131 may have a smaller thickness than the second insulation layer 132. For example, the thickness of the first insulation layer 131 may range from 300 nm to 700 nm. When the thickness is less than 300 nm, electrical reliability may deteriorate. When the thickness is greater than 700 nm and the second conductive layer 150 is disposed on the top surface and side surface of the first insulation layer 131, the second conductive layer 150 may have poor step coverage characteristics, thus causing a detachment or crack. When a detachment or crack is caused, there may be a deterioration in the electric reliability or a reduction of the light extraction efficiency.

The thickness of the second insulation layer 132 may range from 400 nm to 1000 nm. When the thickness is less than 400 nm, electrical reliability may deteriorate when the device operates. When the thickness is greater than 1000 nm, reliability may be reduced due to a pressure or a thermal stress applied to the device when the device is processed, and also the cost of the device may increase due to a long processing time. The thicknesses of the first insulation layer 131 and the second insulation layer 132 are not limited thereto.

Referring to FIGS. 4 to 6, the first electrode 142 electrically connected to the first conductive semiconductor layer 124 may be disposed on the top surface 128-1 of the recess 128. A reflective layer 162 may be disposed between the first electrode 142 and the first conductive semiconductor layer 124 in a thickness direction of the semiconductor structure. With such a configuration, it is possible to prevent light absorption in the semiconductor structure by reflecting light L1 incident onto the first electrode 142.

A first groove 142-1 may be formed on a first surface of the first electrode 142. The reflective layer 162 may be formed in the first groove 142-1. The first groove 142-1 may be formed while the first electrode 142 is formed after the reflective layer 162 is formed.

The reflective layer 162 may be disposed on the top surface 128-1 of the recess 128 to be in direct contact with the first conductive semiconductor layer 124. However, the present invention is not limited thereto. As will be described below, the reflective layer 162 may be disposed on the bottom of the first electrode 142 or disposed inside the first electrode 142.

The reflective layer 162 may be a diameter W1 ranging form 4 μm to 20 μm. When the thickness W1 of the reflective layer 162 is less than 4 μm, light absorption of the first electrode 142 increases. When the thickness W1 of the reflective layer 162 is greater than 20 4 μm, it is difficult to secure the area of the first electrode 142 for injecting electric current.

The first electrode 142 may have a diameter W2 ranging from 24 μm to 50 μm. When this range is satisfied, this is advantageous in spreading electric current, and it is possible to place a large number of first electrodes 142.

When the diameter W2 of the first electrode 142 is less than 24 μm, electric current injected into the first conductive semiconductor layer 124 may not be sufficient. Also, when the diameter W2 of the first electrode 142 is greater than 50 μm, the number of first electrodes 142 is so insufficient that the electric current spreading characteristics may be deteriorated.

The width S2 of the first electrode 142 may be a difference between a radius S1+S2 of the first electrode 142 and a radius S1 of the reflective layer 162. The width S2 of the first electrode 142 may range from 5 μm to 20 μm.

The width S2 of the first electrode 142 is proportional to the aluminum composition of the first conductive semiconductor layer 124. For example, when the aluminum composition of the first conductive semiconductor layer 124 is 60%, the width S2 of the first electrode 142 may be 30 nm. On the other hand, when the aluminum composition of the first conductive semiconductor layer 124 is 40%, the width S2 of the first electrode 142 may be 10 nm. This is because the electric current spreading efficiency deteriorates as the aluminum composition increases.

The ratio of the area of the reflective layer 162 to the area of the first electrode 142 may range from 1:2 to 1:4. That is, the area of the reflective layer 162 may range from 25% to 50% of the area of the first electrode 142. When the area ratio is less than 1:2, the area of the first electrode 142 is so small that the electric current spreading efficiency may be reduced. Also, when the area ratio is greater than 1:4, the area of the reflective layer 162 is so small that the amount of light absorbed by the first electrode 142 may increase.

When the ratio of the first area of where the first electrode 142 is in contact with the first conductive semiconductor layer 124 to the second area of where the second electrode 246 is in contact with the second conductive semiconductor layer 127 (first area:second area) is maintained in a range from 1:3 to 1:7, it is possible to enhance the electric current spreading characteristics and the light extraction efficiency.

Referring to FIG. 6, the thickness d2 of the first electrode 142 may be smaller than the thickness d3 of the first insulation layer 131. The thickness d3 of the first insulation layer 131 may be greater than or equal to 110% to 130% of the thickness d2 of the first electrode 142. When the thickness d2 of the first electrode 142 is smaller than the thickness d3 of the first insulation layer 131, it is possible to solve a problem such as a detachment or crack caused by a reduction of step coverage characteristics caused when the first conductive layer 165 is disposed. Also, the first electrode 142 and the first insulation layer 131 have a first distance S6 therebetween, and thus it is possible to enhance gap-fill characteristics of the second insulation layer 132.

The first distance S6 between the first electrode 142 and the first insulation layer 131 may be greater than 0 μm and less than 4 μm. When the first distance S6 between the first electrode 142 and the first insulation layer 131 is greater than 4 μm, the width of the first insulation layer 131 disposed on the top surface 128-1 of the recess 128 decreases so much that it may be difficult to secure a processing margin, and thus there may be a deterioration in reliability. Also, the width S2 of the first electrode 142 decreases so much that the operating voltage characteristics may deteriorate.

The top surface 128-1 of the recess 128 may include a first region S5 in which the first insulation layer 131 is in contact with the first conductive semiconductor layer 124, a second region (a first interval) S6 in which the second insulation layer 132 is in contact with the first conductive semiconductor layer 124, a third region S2 in which the first electrode 142 is in contact with the first conductive semiconductor layer 124, and a fourth region W1 in which the reflective layer 162 is in contact with the first conductive semiconductor layer 124.

The third region S2 may be narrowed as the first region S5 is widened, and the third region S2 may be widened as the first region S5 is widened.

The first region S5 may have a width ranging from 11 μm to 28 μm in a first direction (an X direction). When the first direction width is less than 11 μm, it is possible to secure a processing margin, and thus it is possible for device reliability to deteriorate. When the first direction width is greater than 28 μm, the width S2 of the first electrode 142 decreases so much that electrical characteristics may deteriorate. The first direction may be a direction perpendicular to the thickness direction of the semiconductor structure.

The width of the second region S6 may be determined by adjusting the widths of the third region S6 and the fourth region W1. In order to uniformly spread electric current over the device and optimize injection of electric current, the width of the recess 128 may be freely designed to be within the aforementioned range.

Also, the area of the top surface 128-1 of the recess 128 may be determined by adjusting the widths of the first region S5, the second region S6, and the third region S2. When the area of the recess 128 increases, the area in the second electrode 246 may be disposed decreases. Thus, the ratio of the first electrode 142 to the second electrode 246 may be determined, and the width of the recess 128 may be designed in the range in order to optimize an electric current density by matching densities of electrons and holes.

Referring to FIG. 7, the reflective layer 162 includes a first layer 162a and a second layer 162b. The first layer 162a may perform an adhesion function and a electric current spreading prevention function. The first layer 162a may contain at least one of chromium (Cr), titanium (Ti), and nickel (Ni). The first layer 162a may have a thickness ranging from 0.7 m to 7 nm. When the thickness is less than 0.7 m, an adhesive effect and a spreading prevention effect may be reduced. When the thickness is greater than 7 nm, ultraviolet light absorption may increase.

The second layer 162b may contain aluminum. The second layer 162b may have a thickness ranging from 30 nm to 120 nm. When the thickness of the second layer 162b is less than 30 nm, reflectance is reduced in an ultraviolet wavelength band. Even when the thickness is greater than 120 nm, reflective efficiency hardly increases.

The first electrode 142 may be composed of a plurality of layers. For example, the first electrode 142 may include a 1-1 (first-prime) electrode 142a, a 1-2 (first-double-prime) electrode 142b, and a 1-3 electrode 142c. The 1-1 electrode 142a may contain at least one of chromium (Cr), titanium (Ti), and nickel (Ni). The 1-1 electrode 142a may have a similar structure to the first layer 162a, but may have a larger thickness than the first layer 162a in terms of ohmic performance. Accordingly, the first electrode 142 absorbs ultraviolet light.

The 1-2 electrode 142b may serve to lower resistance or reflect light. The 1-2 electrode 142b may contain Ni, Al, or the like. The 1-3 electrode 142c is a layer for bonding with a neighboring layer and may contain Au or the like. The first electrode 142 may have a structure of Ti/Al or Cr/Ti/Al, but is not particularly limited.

Figure 8A:
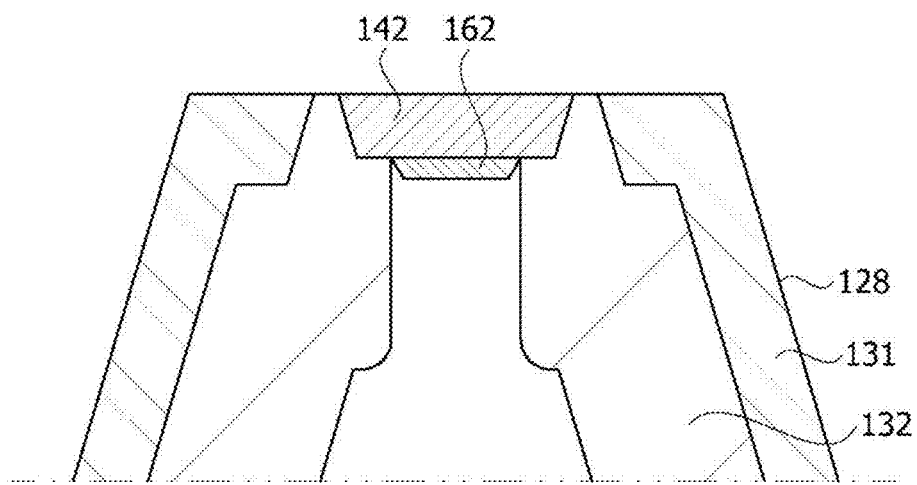
FIG. 8A is a first modification of FIG. 6.
Figure 8B:
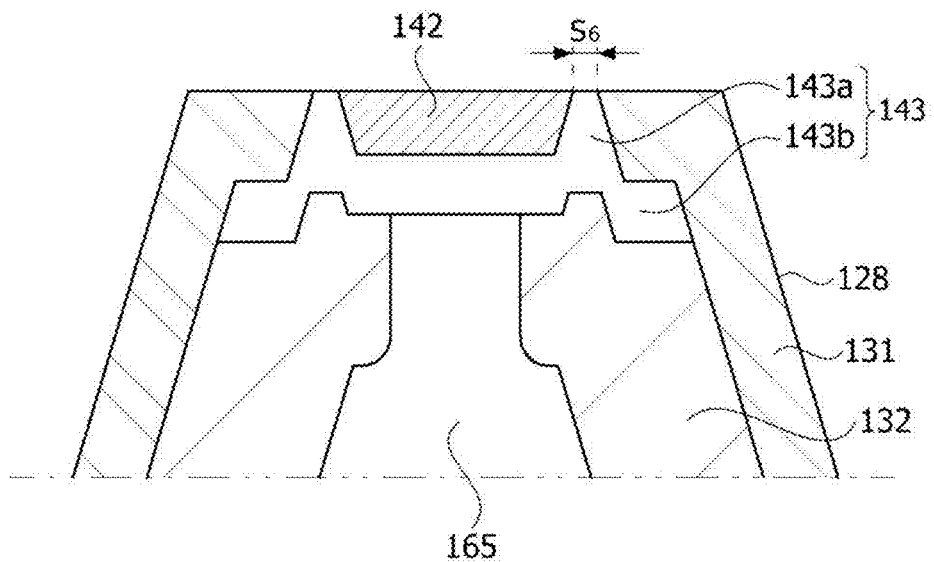
FIG. 8B is a second modification of FIG. 6.
Figure 9:
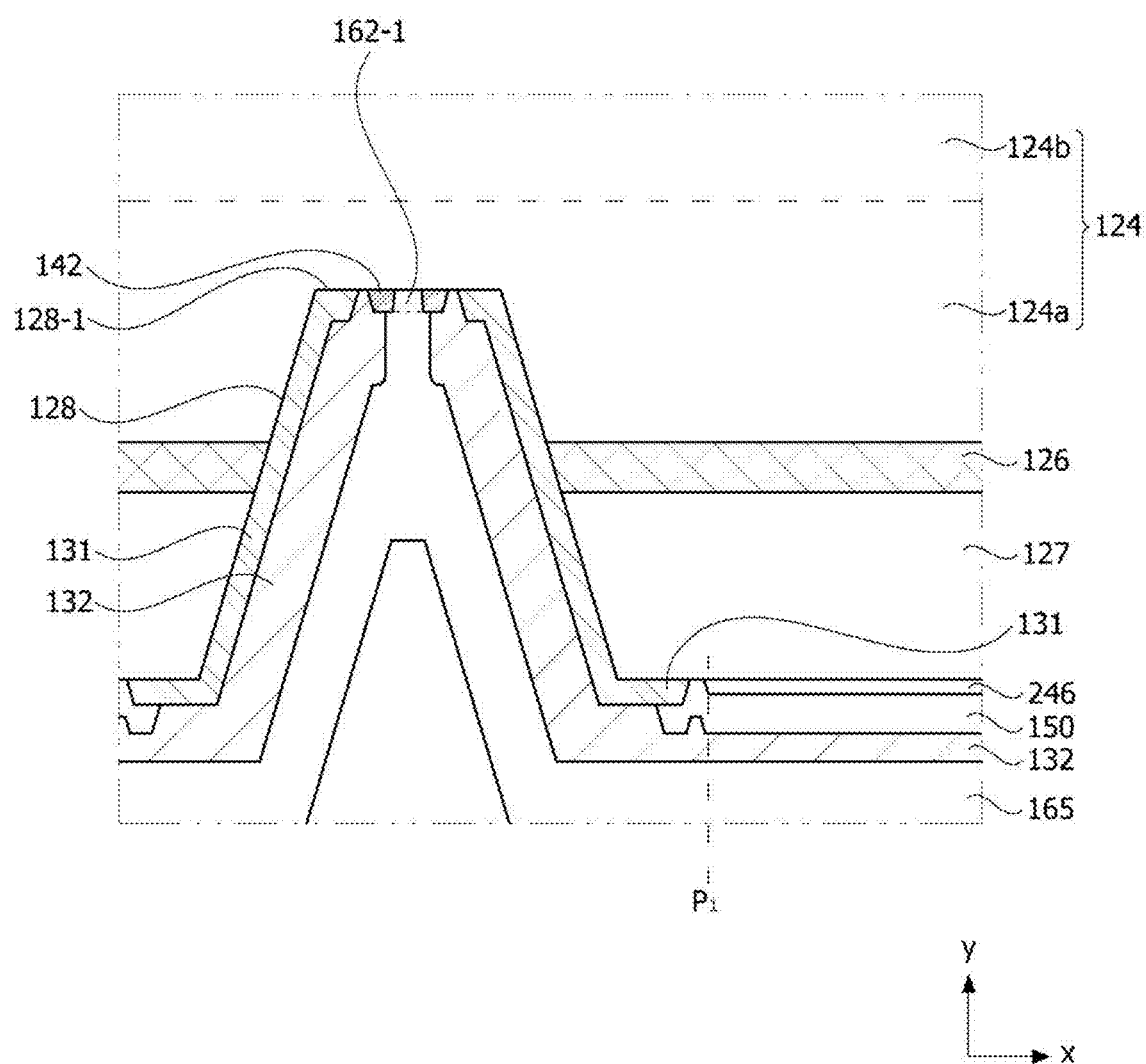
FIG. 9 is a third modification of FIG. 6.
Figure 10:
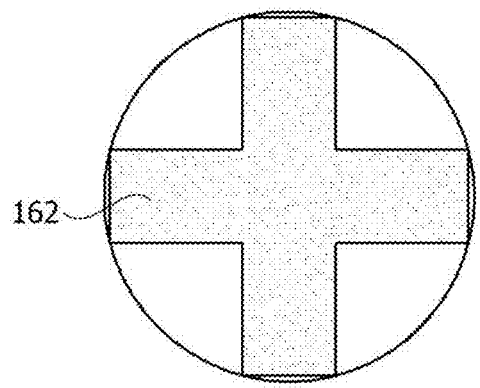
FIG. 10 is a diagram showing various shapes of a reflective layer.
Figure 10:
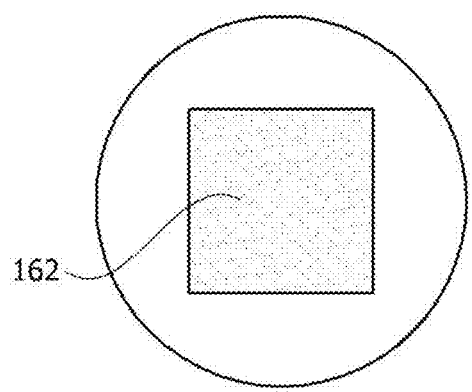
Figure 10:
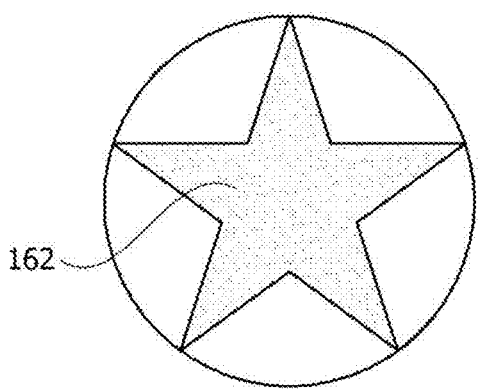

FIG. 8A is a first modification of FIG. 5, FIG. 8B is a second modification of FIG. 5, FIG. 9 is a third modification of FIG. 5, and FIG. 10 is a diagram showing various shapes of a reflective layer.

Referring to FIG. 8A, the reflective layer 162 may be disposed under the first electrode 142. In this case, the area of where the first electrode 142 is in contact with the first conductive semiconductor layer 124 increases, and thus this may be advantageous in spreading electric current. Also, the reflective layer 162 may be disposed inside the first electrode 142.

Referring to FIG. 8B, a cover electrode 143 may be disposed to cover a lower portion of the first electrode 142 inside the recess 128. The cover electrode 143 may be made of a material that is the same as or different from that of the first conductive layer 165.

The first insulation layer 131 may extend to the top surface of the recess 128 and may be disposed a first distance S6 from the first electrode 142. The cover electrode 143 may include an uneven portion 143a disposed in the first distance S6. Accordingly, it is possible to facilitate spreading of electric current by forming a Schottky junction between the cover electrode 143 and the first conductive semiconductor layer 124. Also, the cover electrode 143 may include an extension part 143b that extends to the lower portion of the first insulation layer.

Referring to FIG. 9, the first conductive layer 165 may be connected to a reflective layer 162-1. The first conductive layer 165 may be brought in contact with the reflective layer 162-1 via the first electrode 142. The first electrode 142 may have a ring shape in which a hole is formed at the center. Accordingly, the first conductive layer 165 may fill the hole of the first electrode 142 to form the reflective layer 162-1.

However, the present invention is not limited thereto. For example, the first electrode 142 may cover the reflective layer 162-1, and the first conductive layer 165 may be connected to the reflective layer 162-1 via the first electrode 142. In this case, the first conductive layer 165 and the reflective layer 162-1 may be made of the same or different materials.

The first conductive layer 165 may contain various materials capable of ultraviolet light, such as aluminum. The first conductive layer 165 may extend to the bottom surface of the second conductive semiconductor layer to reflect ultraviolet light. For example, the first conductive layer 165 may be disposed to cover a region P1 in which the second electrode 246 is disposed.

Referring to FIG. 10, the shape of the reflective layer 162 may be variously modified. That is, the shape is not particularly limited as long as a structure is capable of being disposed in a portion of the first electrode 142 to reflect light. However, as described above, the area of the reflective layer 162 may be 25% to 50% of the area of the first electrode 142.

Figure 11:
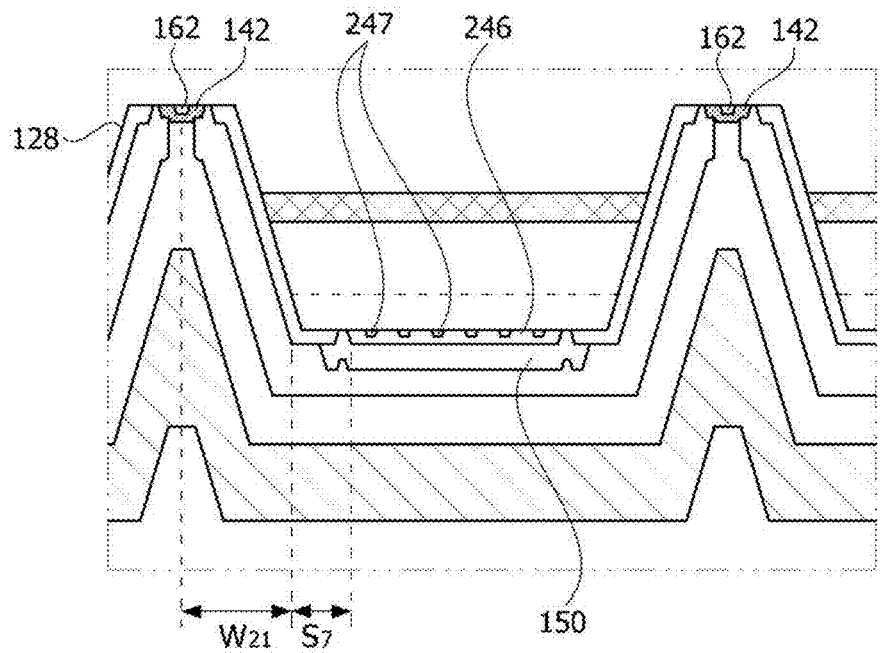
FIG. 11 is a conceptual view of a semiconductor device according to a second embodiment of the present invention.

FIG. 11 is a conceptual view of a semiconductor device according to another embodiment of the present invention.

Referring to FIG. 11, a reflective pattern 247 may be disposed between the second electrode 246 and the second conductive semiconductor layer 127. The second electrode 246 may be relatively wider than the first electrode 142 and thus may have much light absorption. Furthermore, when the second conductive semiconductor layer 127 is made of P—AlGaN, most light may be incident onto the second electrode 246 through the second conductive semiconductor layer 127. Accordingly, it is preferable that light absorbed by the second electrode 246 be minimized.

The above-described configuration of the reflective layer 162 of the first electrode 142 may be applied to the reflective pattern 247 as it is. For example, the reflective pattern 247 may have a structure through which the second conductive layer 150 partially passes. However, the present invention is not limited thereto, and the reflective pattern 247 may have a separate reflective member formed therein.

The reflective pattern 247 may have the reflective layer 162 formed on both of the top surface 128-1 of the recess 128 and the lower surface of the second conductive semiconductor layer 127 by using a mask after the recess 128 is formed in the semiconductor structure. Accordingly, the reflective layer 162 disposed on the first electrode 142 and the reflective pattern 247 disposed on the second electrode 246 may have the same composition and the same thickness. Subsequently, the first electrode 142 and the second electrode 246 may be disposed thereon.

The second electrode 246 may be disposed a certain distance W21+S7 from the center of the recess 128. The distance between the second electrode 246 and the recess 128 may be adjusted according to the area of the first electrode 142 and the light extraction efficiency.

Figure 12:
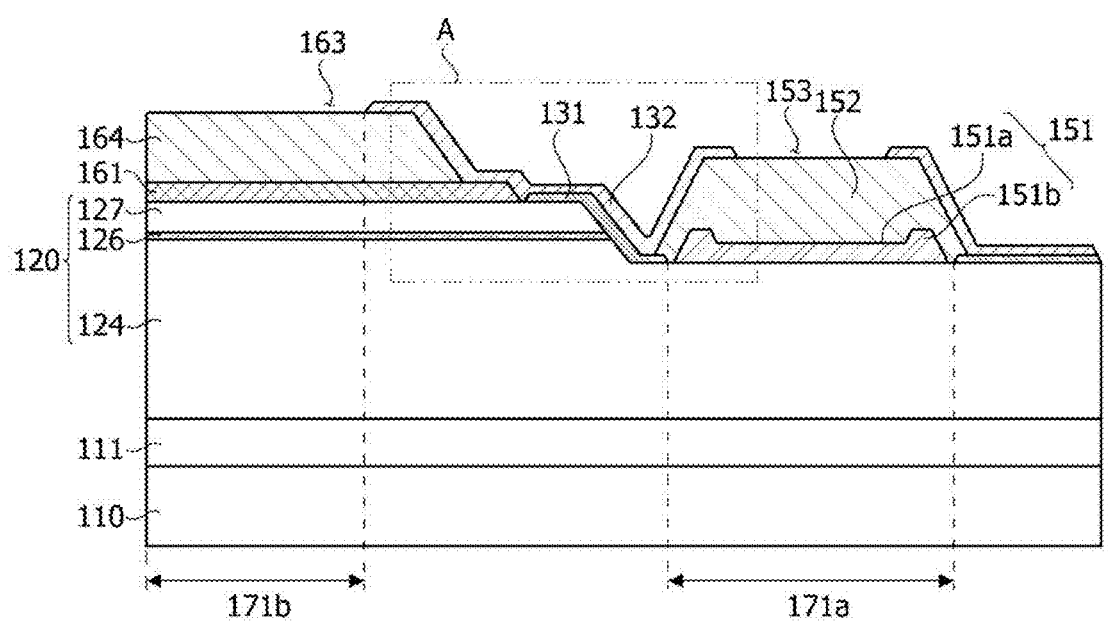
FIG. 12 is a sectional view of a semiconductor device according to a third embodiment of the present invention.
Figure 13A:
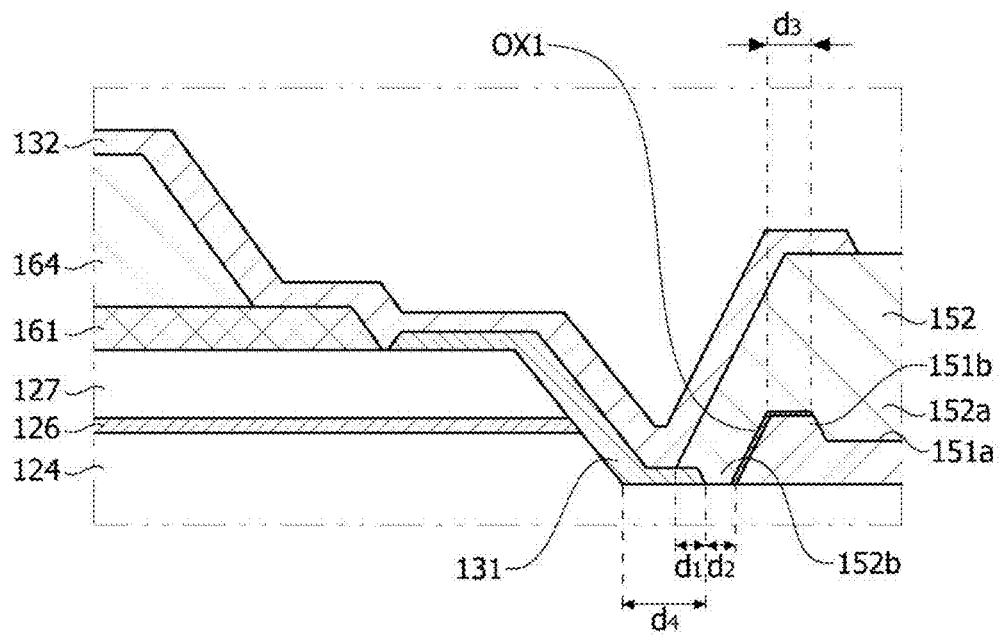
FIG. 13A is an enlarged view of a part A of FIG. 12.
Figure 13B:
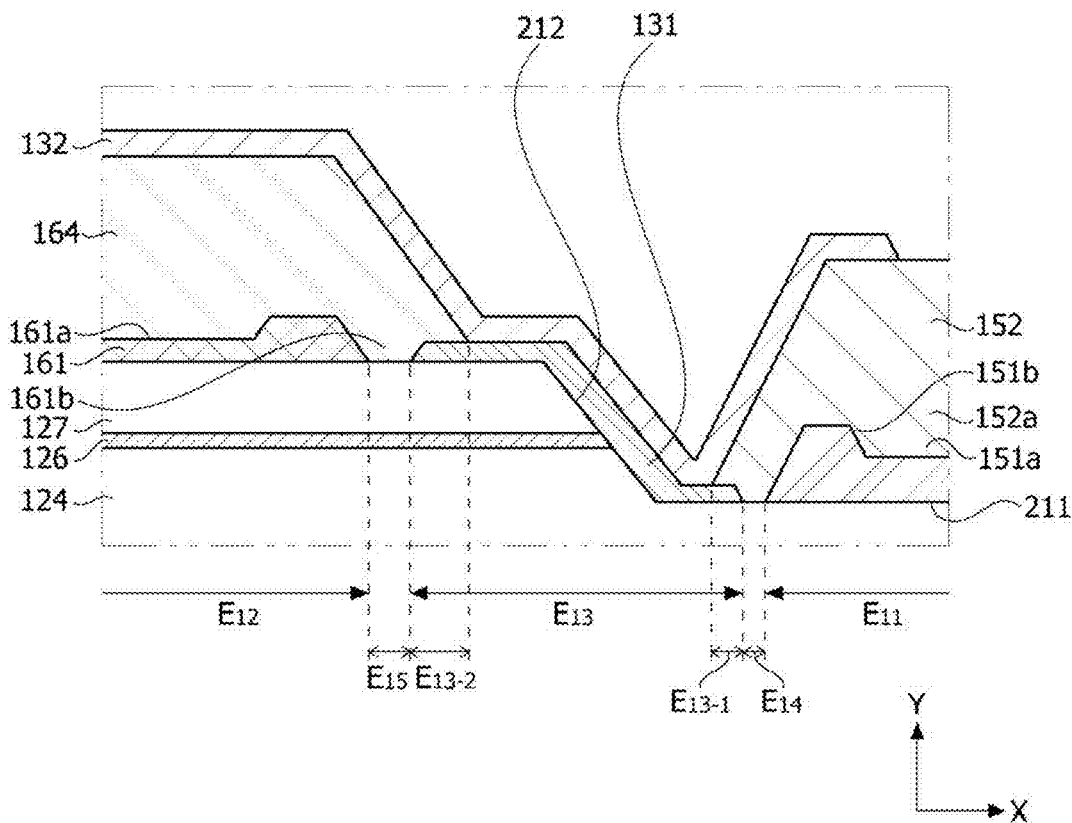
FIG. 13B is a modification of FIG. 13A.

FIG. 12 is a sectional view of a semiconductor device according to a third embodiment of the present invention, FIG. 13A is an enlarged view of a part A of FIG. 12, and FIG. 13B is a modification of FIG. 13A.

Referring to FIGS. 12 and 13A, the semiconductor device according to the third embodiment of the present invention includes a semiconductor structure 120; a first insulation layer 131 disposed on the semiconductor structure 120; a first electrode 151 disposed on a first conductive semiconductor layer 124 through a first hole 171a of the first insulation layer 131; a second electrode 161 disposed on a second conductive semiconductor layer 127 through a second hole 171b of the first insulation layer 131; a first cover electrode 152 disposed on the first electrode 151; a second cover electrode 164 disposed on the second electrode 161; and a second insulation layer 132 disposed on the first cover electrode 152 and the second cover electrode 164.

The semiconductor structure 120 according to an embodiment of the present invention may output ultraviolet wavelength light. For example, the semiconductor structure 120 may output near-ultraviolet wavelength light (UV-A), far-ultraviolet wavelength light (UV-B), or deep-ultraviolet wavelength light (UV-C).

When the semiconductor structure 120 emits ultraviolet wavelength light, each semiconductor layer of the semiconductor structure 120 may contain a material having an empirical formula $In_{x1}Al_{y1}Ga_{1-x1-y1}N$ ($0 \leq x1 \leq 1$, $0 < y1 \leq 1$, $0 \leq x1+y1 \leq 1$) such as Al. Here, an aluminum composition may be represented as the ratio of the atomic weight of Al to the total atomic weight including the atomic weight of In, the atomic weight of Ga, and the atomic weight of Al. For example, when the aluminum composition is 40%, the material may be Al40Ga60N, which has a gallium composition of 60%.

Also, in the description of the embodiments, a composition being low or high may be understood by a difference in composition % (and/or % point) of each semiconductor layer. For example, when the first semiconductor layer has an aluminum composition of 30% and the second semiconductor layer has an aluminum composition of 60%, the aluminum composition of the second semiconductor layer may be represented as being higher than that of the first semiconductor layer by 30%.

A substrate 110 may be formed of a material selected from among sapphire (Al2O3), SiC, GaAs, GaN, ZnO, Si, GaP, InP, and Ge, but is not limited thereto. The substrate 110 may be a light transmitting plate capable of transmitting ultraviolet wavelength light.

A buffer layer 111 may mitigate a lattice mismatch between the substrate 110 and semiconductor layers. The buffer layer 111 may have a form in which a group III element and a group V element are combined with each other or may contain any one of GaN, InN, AlN, InGaN, AlGaN, InAlGaN, and AlInN. In this embodiment, the buffer layer 111 may be AlN, but is not limited thereto. The buffer layer 111 may include a dopant, but is not limited thereto.

The configurations described with reference to FIG. 1 may be included as the configurations of the first conductive semiconductor layer 124, the active layer 126, and the second conductive semiconductor layer 127.

The first insulation layer 131 may be disposed between the first electrode 151 and the second electrode 161. In detail, the first insulation layer 131 may include a first hole 171a in which the first electrode 151 is disposed and a second hole 171b in which the second electrode 161 is disposed.

The first electrode 151 is disposed on the first conductive semiconductor layer 124, and the second electrode 161 may be disposed on the second conductive semiconductor layer 127.

Each of the first electrode 151 and the second electrode 161 may be an ohmic electrode. Each of the first electrode 151 and the second electrode 161 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto. For example, the first electrode 151 may have a plurality of metal layers (e.g., Cr, Al, and Ni), and the second electrode 161 may be made of ITO.

The first electrode 151 may be electrically connected with the first conductive semiconductor layer 124 via the first hole 171a. The first electrode 151 may include a first groove 151a formed on one surface. For an ultraviolet light emitting device unlike typical visible light emitting devices, it is necessary to perform heat treatment on an electrode at high temperature for ohmic operation. For example, heat treatment may be performed on the first electrode 151 and/or the second electrode at a temperature ranging from about 600° C. to about 900° C. In this process, an oxide film Ox1 may be formed on the surface of the first electrode 151. The oxide film Ox1 may act as a resistance layer, and thus the operating voltage may increase.

The oxide film Ox1 may be formed by oxidizing a material constituting the first electrode 151. Accordingly, when components such as the concentration and/or the mass percentage of the material constituting the first electrode 151 are not constant or non-uniform heat is applied to the surface of the first electrode 151 by other elements while heat treatment is performed on the first electrode 151, the thickness of the oxide film Ox1 may be non-uniformly formed.

Accordingly, the first electrode 151 according to an embodiment may have the first groove 151a formed on one surface to remove the oxide film Ox1. In this process, a protrusion portion 151b surrounding the first groove 151a may be formed.

While heat treatment is performed on the first electrode 151, at least a portion of the side surface of the first conductive semiconductor layer 124, the side surface of the active layer 126, and the side surface of the second conductive semiconductor layer 127, which is exposed between the first electrode 151 and the second electrode 161, may be oxidized or corroded.

However, according to an embodiment, the first insulation layer 131 may extend from a portion of the top surface of the second conductive semiconductor layer 127 and may be disposed even in the side surface of the active layer 126 and a portion of the first conductive semiconductor layer 124. Also, the first insulation layer 131 may be disposed between the first electrode 151 and the second electrode 161 and on the side surface of the first conductive semiconductor layer 124, the side surface of the active layer 126, and the side surface of the second conductive semiconductor layer 127.

Accordingly, by using the first insulation layer 131, it is possible to prevent at least a portion of the side surfaces of the first conductive semiconductor layer 124, the active layer 126, and the second conductive semiconductor layer 127 from being corroded while heat treatment is performed on the first electrode 151.

When the first electrode 151 is entirely etched, even the first insulation layer 131 disposed adjacent to the first electrode 151 may be etched. Therefore, according to an embodiment, the protrusion portion 151b may be formed by etching only a portion of the first electrode 151 to leave a border region. The protrusion portion 151b may have an upper width d3 ranging from 1 um to 10 um. When the width d3 is greater than or equal to 1 um, it is possible to prevent the first insulation layer 131 from being etched. When the width d3 is less than or equal to 10 um, the area of the first groove increases, and a region in which the oxide film has been removed increases. Thus, it is possible to reduce a surface area acting as resistance.

For example, when the first groove 151a is formed in a portion of the first electrode 151, a mask composed of a photoresist may be disposed by placing the photoresist and performing an exposure process. The mask may have an incline angle of a side surface positioned between an upper surface and a lower surface with respect to the bottom surface of the substrate. Accordingly, since even a portion of the protrusion portion 151b of the first electrode 151 may be etched by adjusting the incline angle of the mask, the thickness of the oxide film Ox1 formed on the protrusion portion 151b may be non-uniform. Depending on the case, the protrusion portion 151b of the first electrode 151 and the oxide film left on the side surface may be partially removed.

The first cover electrode 152 may be disposed on the first electrode 151. In this case, the first cover electrode 152 may include a first uneven portion 152a disposed on the first groove 151a. According to such a configuration, it is possible to improve an electrical connection between the first cover electrode 152 and the first electrode 151 and thus also possible to lower the operating voltage. When no first groove 151a is present in the first electrode 151, the oxide film is not removed, and thus resistance between the first cover electrode 152 and the first electrode 151 may increase.

The first cover electrode 152 may cover the side surface of the first electrode 151. Accordingly, the area of where the first cover electrode 152 and the first electrode 151 are in contact with each other is widened, and thus it is possible to further lower the operating voltage. Also, since the first cover electrode 152 covers the side surface of the first electrode 151, it is possible to protect the first electrode 151 from external moisture or contaminants. Accordingly, it is possible to improve reliability of the semiconductor device.

The first cover electrode 152 may include a second uneven portion 152b disposed in a separation region d2 between the first insulation layer 131 and the first electrode 151. The second uneven portion 152b may be in direct contact with the first conductive semiconductor layer 124. Also, when the first cover electrode 152 is in direct contact with the first conductive semiconductor layer 124, resistance between the first cover electrode 152 and the first conductive semiconductor layer 124 is greater than the resistance between the first electrode 151 and the first conductive semiconductor layer 124. Accordingly, advantageously, it is possible to uniformly spread electric current injected into the first conductive semiconductor layer 124. The separation region d2 may have a width ranging from about 1 um to about 10 um.

The first cover electrode 152 may have a first region d1 extending an upper portion of the first insulation layer 131. Accordingly, the entire area of the first cover electrode 152 increases, and thus it is possible to lower the operating voltage.

When the first cover electrode 152 does not extend to the upper portion of the first insulation layer 131, an edge of the first insulation layer 131 may be detached and thus separated from the first conductive semiconductor layer 124. Accordingly, external moisture and/or other contaminants may enter the gap. As a result, at least a portion of the side surface of the first conductive semiconductor layer 124, the side surface of the active layer 126, and the side surface of the second conductive semiconductor layer 127 may be corroded or oxidized.

In this case, the ratio of the entire area of the second region d2 to the entire area of the first region d1 (d4:d1) may range from 1:0.15 to 1:1. The entire area of the first region d1 may be smaller than the entire area of the second region d2. Here, the second region d2 may be a region where the first insulation layer 131 is disposed between the first and second electrodes 151 and 161 and over the first conductive semiconductor layer 124.

When the entire area ratio d4:d1 is greater than or equal to 1:0.15, the area of the first region d1 may increase to cover the upper portion of the first insulation layer 131, thereby preventing a detachment. Also, by the first insulation layer 131 being disposed between the first electrode 151 and the second electrode 161, it is possible to prevent penetration of external moisture or contaminants.

Also, when the entire area ratio d1:d4 is less than or equal to 1:1, it is possible to secure the area of the first insulation layer 131 to sufficiently cover a region between the first electrode 151 and the second electrode 161. Accordingly, it is possible to prevent the semiconductor structure from being corroded when heat treatment is perform on the first electrode 151 and/or the second electrode 161.

The second cover electrode 164 may be disposed on the second electrode 161. The first cover electrode 152 may cover even the side surface of the second electrode 161, but is not limited thereto.

The first cover electrode 152 and the second cover electrode 164 may contain at least one of Ni/Al/Au, Ni/IrOx/Au, Ag, Ni, Cr, Ti, Al, Rh, Pd, Ir, Sn, In, Ru, Mg, Zn, Pt, Au, and Hf, but are not particularly limited. However, the first cover electrode 152 and the second cover electrode 164 may each have an exposed outermost layer containing Au.

The second insulation layer 132 may be disposed on the first cover electrode 152, the second cover electrode 164, and the first insulation layer 131. The second insulation layer 132 may include a third hole 153 exposing the first cover electrode 152 and a fourth hole 163 exposing the second cover electrode 164.

According to an embodiment, the second insulation layer 132 is disposed between the first electrode 151 and the second electrode 161 and over the first insulation layer 131, and thus it is possible to prevent penetration of external moisture and/or other contaminants even when a defect occurs in the first insulation layer 131.

For example, when the first insulation layer and the second insulation is configured as a single layer, a defect such as a crack may easily propagate in a thickness direction. Accordingly, external moisture or contaminants may penetrate into the semiconductor structure through the exposed defect.

However, according to an embodiment, the second insulation layer 132 is separately disposed on the first insulation layer 131, and thus it is difficult for a defect formed in the first insulation layer 131 to propagate to the second insulation layer 132. That is, an interface between the first insulation layer 131 and the second insulation layer 132 may serve to block the propagation of the defect. Accordingly, it is possible to prevent at least a portion of the side surface of the first conductive semiconductor layer 124, the side surface of the active layer 126, and the side surface of the second conductive semiconductor layer 127 from being corroded or oxidized by external moisture and/or other contaminants. Accordingly, it is possible to improve reliability of the semiconductor device. In this case, when the first insulation layer 131 and the second insulation layer 132 are made of different materials, it is possible to effectively prevent penetration of moisture or contaminants. This is because when the first insulation layer 131 and the second insulation layer 132 are deposited as different thin films, internal defects are not connected to each other in a direction of the deposition (defect decoupling).

The first insulation layer 131 and the second insulation layer 132 may be formed of at least one material selected from a group consisting of SiO2, SixOy, Si3N4, SixNy, SiOxNy, Al2O3, TiO2, and AlN. A boundary between the first insulation layer 131 and the second insulation layer 132 may partially disappear in a process of forming the second insulation layer 132.

Additionally, a first bump electrode 181 (see FIG. 20) may be disposed on the first cover electrode 152, and a second bump electrode 182 (see FIG. 20) may be disposed on the second cover electrode 164. However, the present invention is not limited thereto. The first bump electrode and the second bump electrode may be formed when a chip is mounted on a circuit board.

Referring to FIG. 13B, the semiconductor structure 120 may include a stepped portion 211 extending from the upper surface of the first conductive semiconductor layer 124 where the first electrode 151 is disposed even to the upper surface of the second conductive semiconductor layer 127 where the second electrode 161 is disposed. The stepped portion 211 may be a first surface of the semiconductor structure 120 including an inclined surface 212 formed by mesa etching, but is not limited thereto.

In this case, the first insulation layer 131 may be disposed on the first surface 211 apart from the first electrode 151, and the first insulation layer 131 may overlap with the first cover electrode 152 on the first surface in the first direction perpendicular to the top surface of the first conductive semiconductor layer.

In detail, the stepped portion 211 may include a first part E11 where the first electrode 151 is disposed, a second part E12 when the second electrode 161 is disposed, a third part E13 where the first insulation layer 131 is disposed between the first part E11 and the second part E12, and a fourth part E14 where the first cover electrode 152 is disposed between the first part E11 and the third part E13.

The third part E13 may include a 3-1 part E13-1 overlapping with the first cover electrode 152 in the first direction (the Y direction) perpendicular to the top surface of the first conductive semiconductor layer 124. In this case, the 3-1 part E13-1 may have a width greater than 0 μm and less than 4 μm in the second direction (the X direction) perpendicular to the first direction. The third part E13 may be the same region as the above-described first distance S6.

Also, according to an embodiment, the stepped portion 211 may include a fifth part E15 where the second cover electrode 164 is disposed between the second part E12 and the third part E13 and a 3-1 part E13-2 overlapping with the second cover electrode 164 in the first direction. That is, like the first cover electrode 152, the second cover electrode 164 may extend to the upper portion of the first insulation layer 131, and it is possible to improve moisture resistance.

According to an embodiment, like the first electrode 151, the second electrode 161 may have a groove 161a formed on the top surface. Accordingly, it is possible to decrease contact resistance between the second cover electrode 164 and the second electrode 161.

Figure 14A:
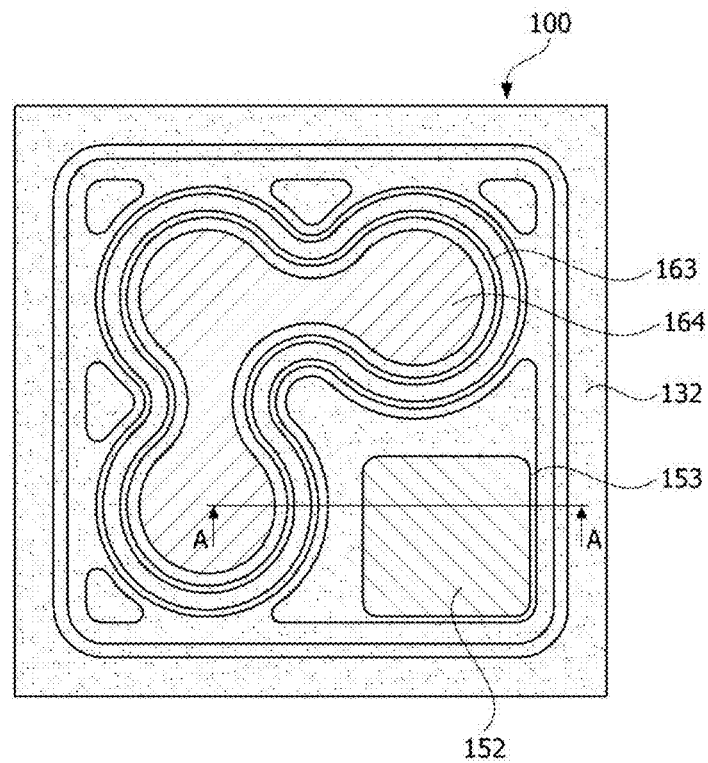
FIG. 14A is a plan view of the semiconductor device according to the third embodiment of the present invention.
Figure 14B:
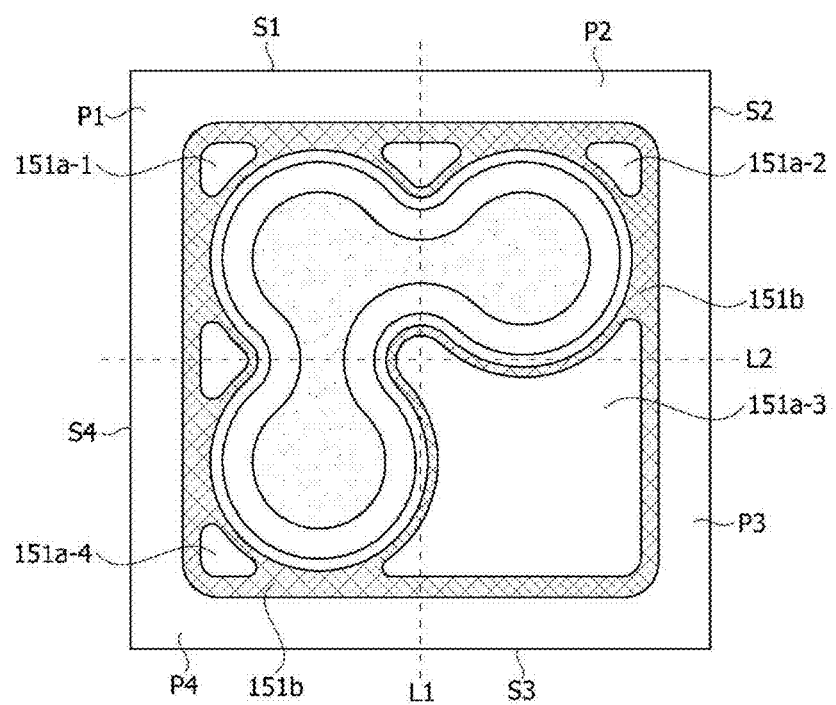
FIG. 14B is a plan view showing an etching region of a first electrode according to the third embodiment of the present invention.
Figure 14C:
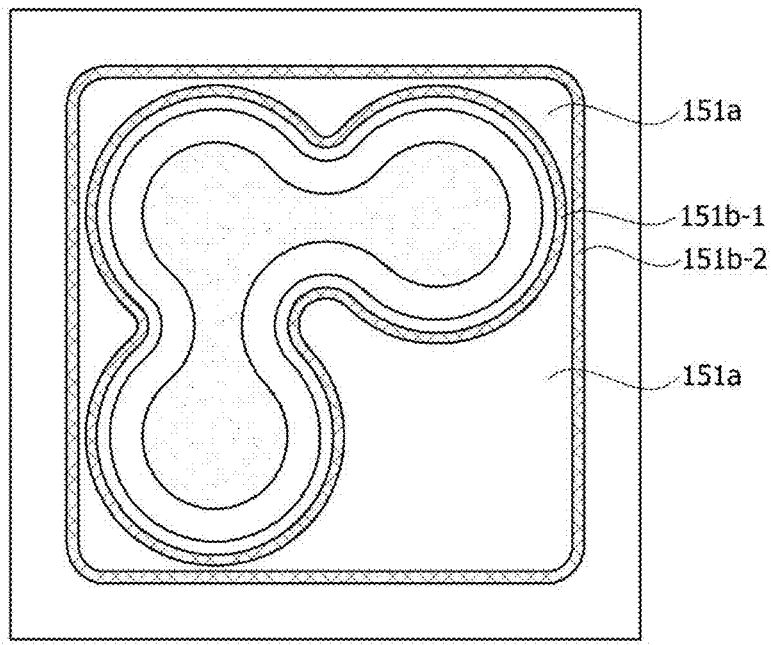
FIG. 14C is a modification of FIG. 14B.
Figure 14D:
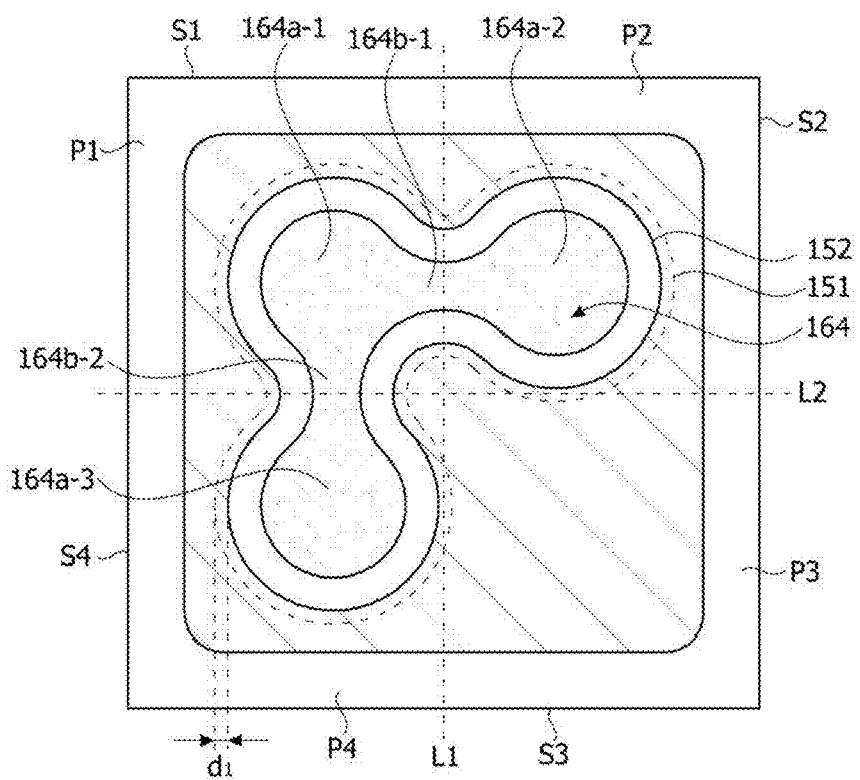
FIG. 14D is a plan view showing a first cover electrode and a second cover electrode according to the third embodiment of the present invention.

FIG. 14A is a plan view of the semiconductor device according to the third embodiment of the present invention, FIG. 14B is a plan view showing an etching region of a first electrode according to the third embodiment of the present invention, FIG. 14C is a modification of FIG. 14B, FIG. 14D is a plan view showing a first cover electrode and a second cover electrode according to the third embodiment of the present invention, and FIG. 14E is a modification of FIG. 14D.

Referring to FIG. 14A, the first cover electrode 152 may be exposed through the third hole 153 of the second insulation layer 132, and the second cover electrode 164 may be exposed through the fourth hole 163 of the second insulation layer 132. The fourth hole 163 may have a shape corresponding to the second cover electrode 164, and third hole 153 may have a quadrangular shape and may be disposed in a third partition region among a plurality of partition regions, which will be described below. FIG. 12 is a sectional view taken along A-A of FIG. 14A.

Referring to FIG. 14B, the semiconductor structure may include a plurality of partition regions P1, P2, P3, and P4 that are defined by a first virtual line L1 passing through the centers of a first side surface S1 and a third side surface S3 which are opposite to each other and a second virtual line L2 passing through the centers of a second side surface S2 and a fourth side surface S4 which are opposite to each other, when viewed from the top. The first virtual line L1 and the second virtual line L2 may be perpendicular to each other, but are not limited thereto.

In this case, the plurality of partition regions P1, P2, P3, and P4 may include the first partition region P1 including the first side surface S1 and the fourth side surface S4, the second partition region P2 including the first side surface S1 and the second side surface S2, the third partition region P3 including the second side surface S2 and the third side surface S3, and a fourth partition region P4 including the third side surface S3 and the fourth side surface S4.

The first groove 151a may include a 1-1 groove 151a-1 disposed in the first partition region P1, a 1-2 groove 151a-2 disposed in the second partition region P2, a 1-3 groove 151a-3 disposed in the third partition region P3, and a 1-4 groove 151a-4 disposed in the fourth partition region P4.

That is, the plurality of first grooves 151a may be disposed apart from each other. In order to lower the operating voltage of the semiconductor device, it is advantageous to increase the area of the second electrode. Accordingly, the space is narrowed, and thus the first grooves 151a may have the form of islands spaced apart from each other. In this case, the protrusion portion 151b may have a structure surrounding the 1-1, 1-2, 1-3, and 1-4 grooves 151a-1, 151a-2, 151a-3, and 151a-4.

In this case, a light emitting region and a second electrode are not disposed in the third partition region P3, and thus the 1-3 groove 151a-3 may have a larger area than the 1-1 groove 151a-1, the 1-2 groove 151a-2, and the 1-4 groove 151a-4.

Referring to FIG. 14C, the plurality of grooves are connected to form a single first groove 151a. A protrusion portion may include a first protrusion line disposed inside the first groove 151a (an inner line 151b-1) and a second protrusion line disposed outside the first groove 151a (an outer line 151b-2). According to such a configuration, a region in which an oxide film has been removed increases, and thus it is possible to lower the operating voltage.

Referring to FIG. 14D, the second cover electrode 164 may include a plurality of pad parts 164a-1, 164a-2, and 164a-3 and connection parts configured to connect the plurality of pad parts 164b-1 and 164b-2. The second cover electrode 164 may have the shape of a dumbbell, but is not limited thereto. The plurality of pad parts 164a-1, 164a-2, and 164a-3 may have a circular shape. However, the present invention is not limited thereto, and the plurality of pad parts 164a-1, 164a-2, and 164a-3 may have various shapes.

The plurality of pad parts 164a-1, 164a-2, and 164a-3 may include the first pad part 164a-1 disposed in the first partition region P1, the second pad part 164a-2 disposed in the second partition region P2, and the third pad part 164a-3 disposed in the fourth partition region P4.

The connection parts 164b-1 and 164b-2 may include the first connection part 164b-1 connecting the first pad part 164a-1 and the second pad part 164a-2 and the second connection part 164b-2 connecting the second pad part 164a-2 and the third pad part 164a-3. In this case, the plurality of pad parts may be defined as circular regions, and the connection parts 164b-1 and 164b-2 may be defined as the remaining regions that connect the pad parts 164a-1, 164a-2, and 164a-3 having a circular shape.

In this case, the first connection part 164b-1 may have a width decreasing toward the first virtual line L1, and the second connection part 164b-2 may have a width decreasing toward the second virtual line L2. That is, the first connection part 164b-1 may have the smallest width at the center point between the first pad part 164a-1 and the second pad part 164a-2 which are adjacent to the first connection part 164b-1.

According to such a configuration, the second cover electrode 164 has an increased outer circumferential surface, and it is possible to provide a space where a first groove is to be formed outside the connection part. Also, the light emitting region has an increased outer circumferential surface, and the probability that light will be emitted increases. Thus, it is possible to improve optical output power. Also, it is possible to form a plurality of pad parts. The ultraviolet light emitting device according to an embodiment generates more heat than visible light emitting devices. Thus, it is possible to increase heat dissipation efficiency by having a plurality of bump pads.

The ratio of the area of the first partition region P1 to the area of the second cover electrode 164 disposed in the first partition region P1 may range from 1:0.2 to 1:0.5. The area of the second cover electrode 164 disposed in the first partition region P1 may be the same as the area of the first pad part 164a-1 and the second connection part 164b-2 disposed in the first partition region P1.

When the area ratio is greater than or equal to 1:0.2, the area of the second cover electrode 164 increases, and thus it is possible to improve hole injection efficiency. Also, the area of the first pad part 164a-1 increases, and thus the size of the bump electrodes may increase. Accordingly, it is possible to increase the heat dissipation efficiency.

When the area ratio is less than or equal to 1:0.5, the area of the first cover electrode 152 in the first partition region P1 increases, and thus it is possible to improve the hole injection efficiency. Also, it is possible to provide a space where a plurality of first grooves 151a will be formed outside the second cover electrode 164. Accordingly, it is possible to lower the operating voltage.

The ratio of the area of the second partition region P2 to the area of the second cover electrode 164 disposed in the second partition region P2 may range from 1:0.2 to 1:0.5. Also, it like the ratio of the area of the third partition region P3 to the area of the second cover electrode 164 disposed in the third partition region P3.

That is, according to an embodiment, the second cover electrodes 164 disposed in the partition regions P1, P2, and P3 may have the same area.

The area ratio of the second cover electrode 152 to the first cover electrode 164 may range from 1:1.1 to 1:1.15. That is, the area of the first cover electrode 152 may be larger than the area of the second cover electrode 164. When the area ratio is greater than or equal to 1:1.1, the area of the first cover electrode 152 increases, and thus it is possible to improve electron injection efficiency. Also, it is possible to provide a space where a plurality of first grooves 151a will be formed outside the second cover electrode 164. Accordingly, it is possible to lower the operating voltage.

When the area ratio is less than or equal to 1:1.15, the area of the second cover electrode 164 increases, and thus it is possible to improve the hole injection efficiency. Also, the area of the pad parts increases, and thus it is possible to increase the size of the bump electrodes. Accordingly, it is possible to increase the heat dissipation efficiency.

Referring to FIG. 14E, a shape for increasing the outer circumferential surface of the light emitting region may be variously modified. The second cover electrode 164 may be formed in a shape corresponding to the light emitting region. The second cover electrode 164 may include a plurality of second branch electrodes 164-1 extending in the X direction and a second connection electrode 164-2 connecting the plurality of branch electrodes 164-1.

The first cover electrode 152 may include a plurality of first branch electrodes 152-1 disposed between the second branch electrodes 164-1 and a first connection electrode 152-2 connecting the plurality of first branch electrodes 152-1.

In this case, the ratio of the maximum perimeter of the light emitting region to the maximum area of the light emitting region may range from 0.02 [1/um] to 0.05 [1/um]. When the above condition is satisfied, the perimeter increases while the same area is remained, and thus it is possible to increase the optical output power.

FIGS. 15 to 20 are plan views and sectional views showing a method of manufacturing the semiconductor device according to the third embodiment of the present invention.

Figure 15A:
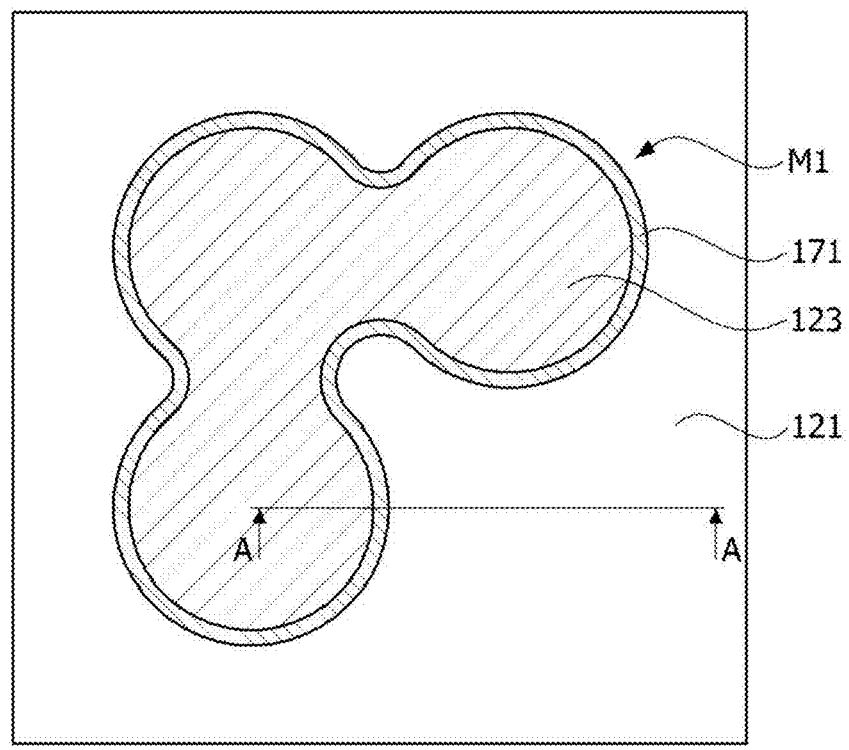
FIGS. 15A and 15B are a plan view and a sectional view in which a light emitting region is formed through mesa etching.
Figure 15B:
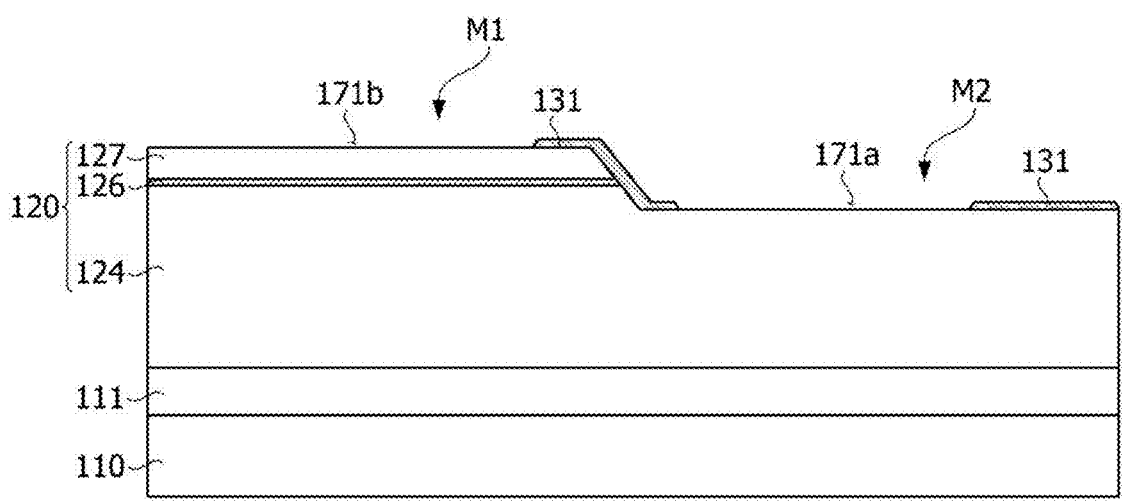

Referring to FIGS. 15A and 15B, the first conductive semiconductor layer 124, the active layer 126, and the second conductive semiconductor layer 127 may be sequentially formed on the substrate 110. Subsequently, a non-light emitting region M2 where the first conductive semiconductor layer 124 is exposed and a light emitting region M1 protruding over the non-light emitting region M2 may be formed by mesa-etching the semiconductor structure. Subsequently, the first insulation layer 131 may be formed, and the first hole 171a and the second hole 171b may be formed. Accordingly, the first insulation layer 131 may usually be disposed in a side surface of the light emitting region M1.

The mesa-etched light emitting region M1 may include a plurality of circular sections and a connection section connecting the plurality of circular sections when viewed from the top. According to such a configuration, a bumper pad may be disposed in each circular section, and thus it is possible to improve the heat dissipation efficiency. Since the semiconductor device according to an embodiment is an ultraviolet light emitting device, the semiconductor device may be a GaN-based semiconductor material, which contains more aluminum than typical visible light emitting devices. Accordingly, since much heat is generated by resistance, dissipation of the generated heat may be a big issue.

At least a portion of the side surface of the second conductive semiconductor layer 127, the side surface of the active layer 126, and the side surface of the first conductive semiconductor layer 124 may be exposed in an inclined surface M3 between the light emitting region M1 and the non-light emitting region M2. The semiconductor structure according to an embodiment contains much aluminum and thus may be susceptible to oxidization by moisture in the air or damage by other contaminants. Accordingly, after the light emitting region M1 and the non-light emitting region M2 are formed, the first insulation layer 131 may be disposed in an inclined surface M3 therebetween to prevent damage of the inclined surface M3.

Figure 16A:
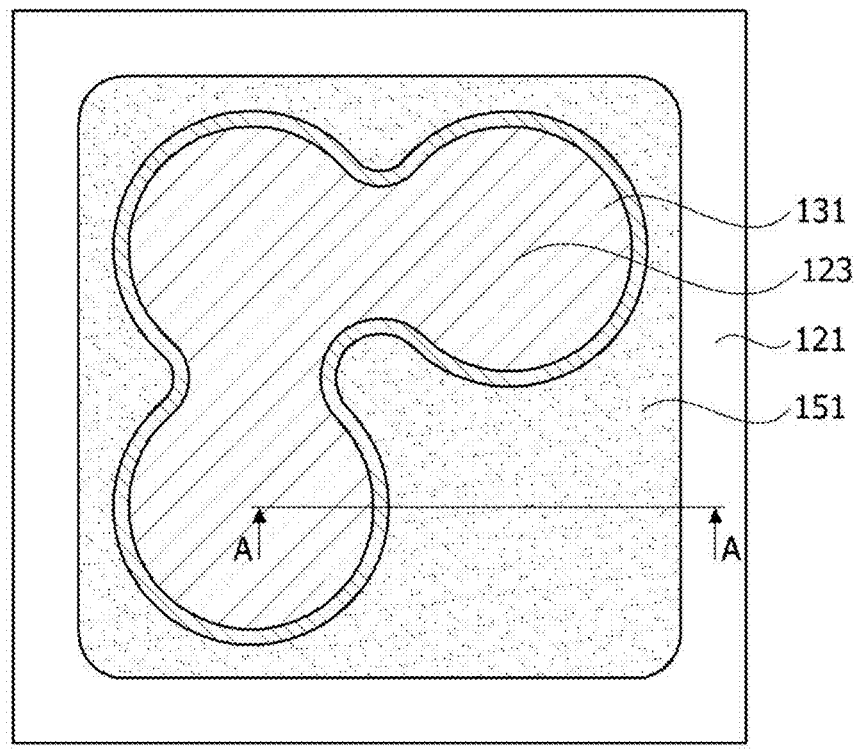
FIGS. 16A and 16B are a plan view and a sectional view in which a first electrode is formed.
Figure 16B:
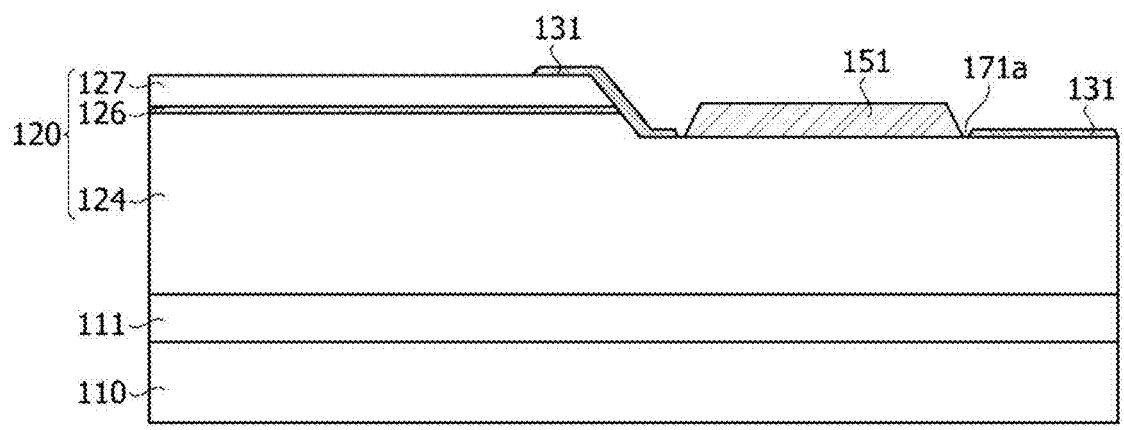

Referring to FIGS. 16A and 16B, the first electrode 151 may be formed on the first conductive semiconductor layer 124. In detail, the first electrode 151 may be disposed in the first hole 171a of the first insulation layer 131.

According to an embodiment, the first hole 171a may have a larger area than the bottom surface of the first electrode 151. For example, a separation region d2 between the first electrode 151 and the first insulation layer 131 may have a distance ranging from 1 um to 10 um.

As the area of where the first electrode 151 is in contact with the first conductive semiconductor layer 124 increases, it is possible to improve the electric current injection efficiency. When the separation distance is greater than or equal to 1 um, it is possible to have a processing margin for securing the contact area in the area of the first electrode 151. Also, as described above, the first cover electrode 152 may be disposed in the distance of the separation region d2 between the first electrode 151 and the first insulation layer 131. In order to secure spreading characteristics of electric current injected into the whole region of the semiconductor structure in consideration of the electric current injection characteristics and the electric current spreading characteristics, the distance of the separation region may be less than or equal to 10 um. Also, the first electrode 151 may be thicker than the first insulation layer 131.

Figure 17A:
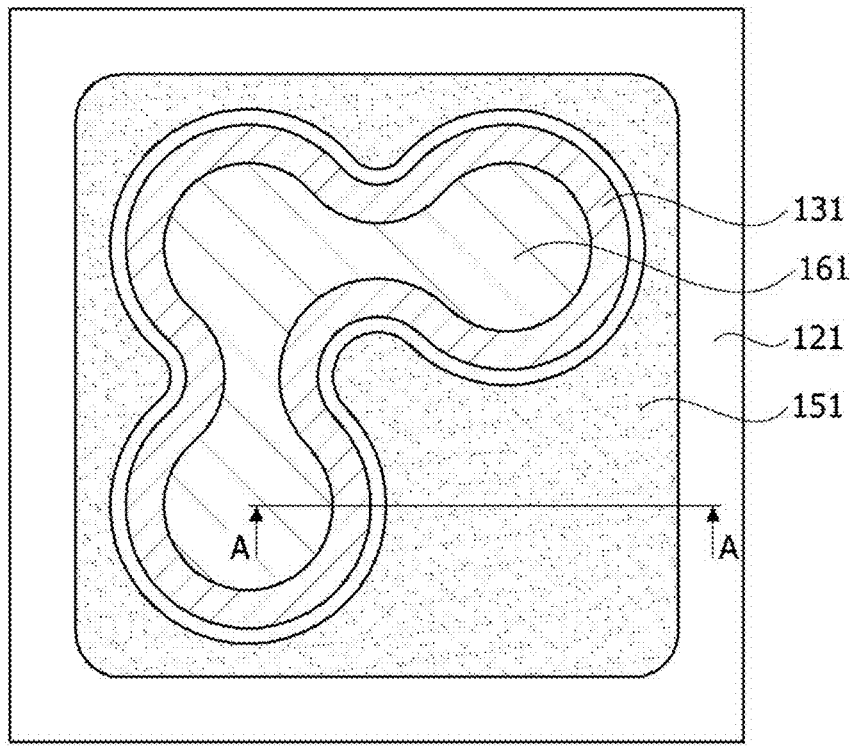
FIGS. 17A and 17B are a plan view and a sectional view in which a second electrode is formed.
Figure 17B:
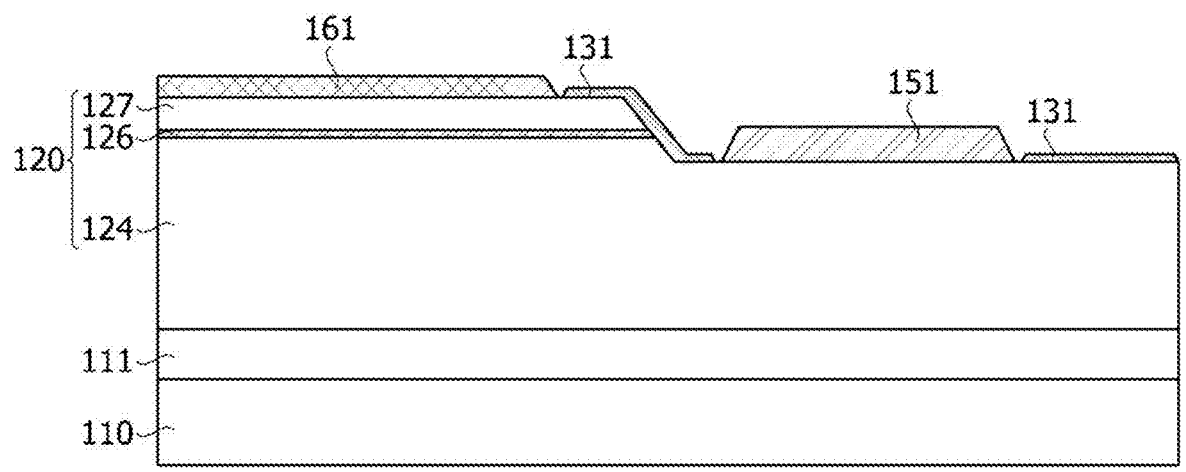

Subsequently, as shown in FIGS. 17A and 17B, the second electrode 161 may be formed in the light emitting region.

A typical method of forming an ohmic electrode may be applied to the method of forming the first electrode 151 and the second electrode 161 as it is. For example, the first electrode 151 may have a plurality of metal layers (e.g., Cr, Al, and Ni), and the second electrode 161 may contain ITO. However, the present invention is not limited thereto.

Figure 18A:
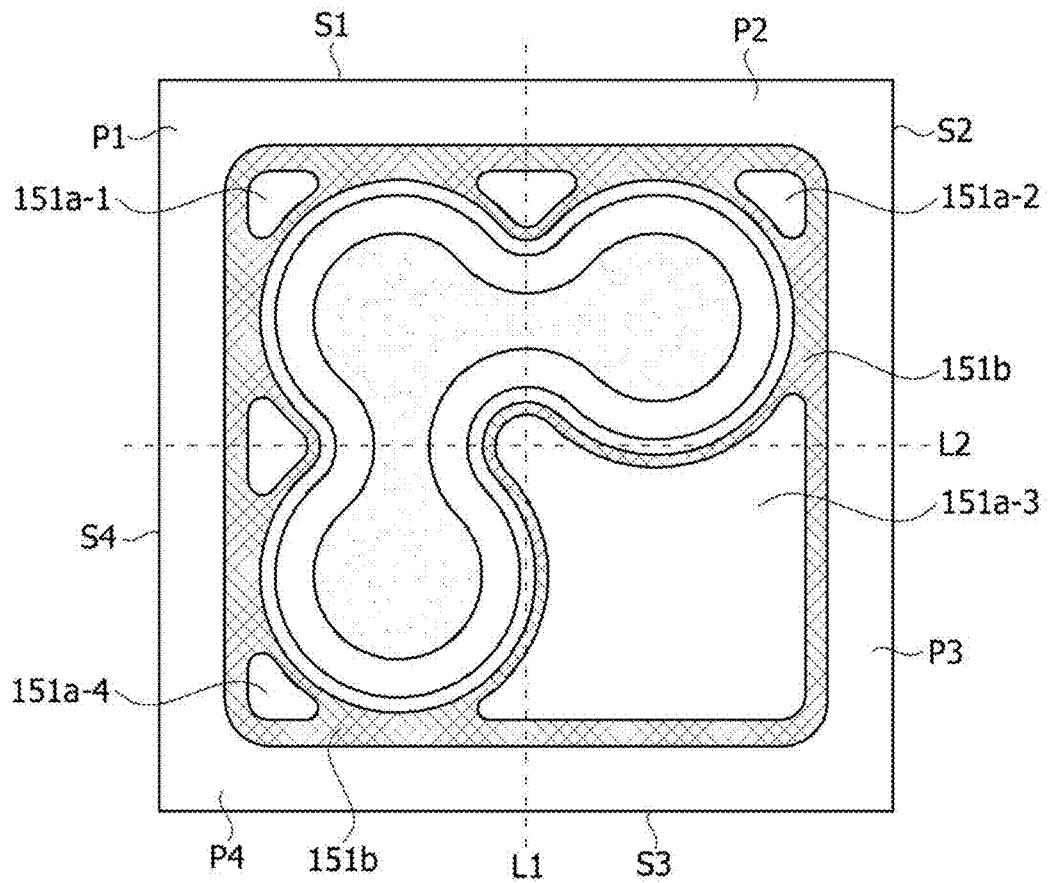
FIGS. 18A and 18B are a plan view and a sectional view in which a first groove is formed by etching a first electrode.
Figure 18B:
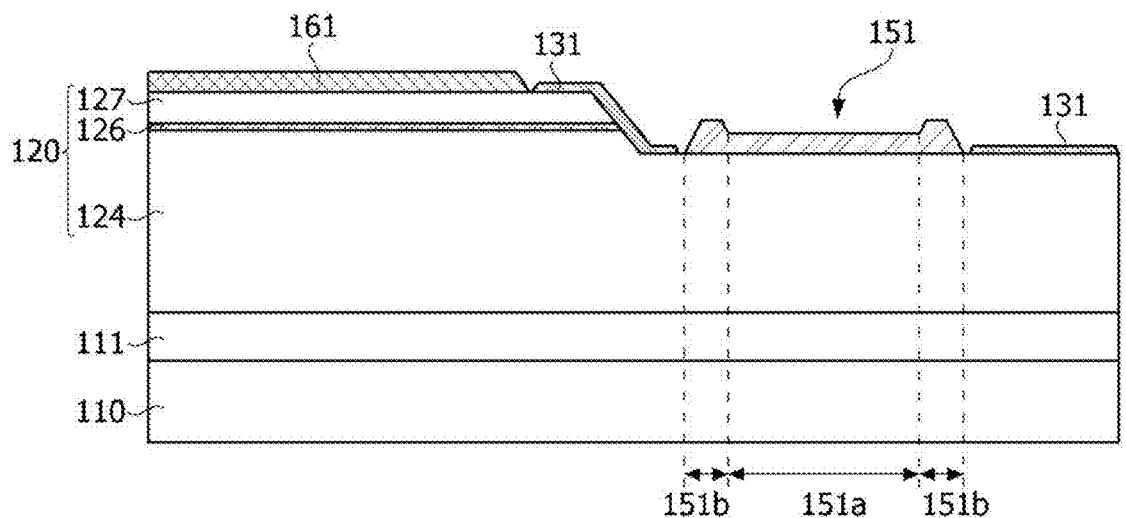

Referring to FIGS. 18A and 18B, a step of etching the first electrode 151 may be performed. According to this embodiment, since a deep ultraviolet light emitting device has a higher aluminum composition than typical visible light emitting devices, a heat treatment temperature of the electrode may increase. Accordingly, heat treatment may be performed at a temperature ranging from about 600 degrees to about 900 degrees in order to improve ohmic characteristics between the semiconductor structure and the first electrode 151 and/or the second electrode 161. In this heat treatment process, an oxide film may be formed on the surface of the first electrode 151. Accordingly, it is possible to improve an electrical connection with the cover electrode by etching the top surface of the first electrode 151 to remove the oxide film.

Also, in the heat treatment process of the first electrode 151 and/or the second electrode 161, the side surface of the first conductive semiconductor layer 124 and/or the side surface of the active layer 126 and/or the side surface of the second conductive semiconductor layer 127, which are exposed between the light emitting region and the non-light emitting region, may be oxidized or corroded. In order to prevent such a problem, the first insulation layer 131 may be disposed between the non-light emitting region and the light emitting region to prevent the side surface of the first conductive semiconductor layer 124 and/or the side surface of the active layer 126 and/or the side surface of the second conductive semiconductor layer 127 from being oxidized or corroded.

The semiconductor structure may include a plurality of partition regions P1, P2, P3, and P4 that are defined by a first virtual line L1 passing through the centers of a first side surface S1 and a third side surface S3 which are opposite to each other and a second virtual line L2 passing through the centers of a second side surface S2 and a fourth surface S4 which are opposite to each other, when viewed from the top. The first virtual line L1 and the second virtual line L2 may be perpendicular to each other, but are not limited thereto.

In this case, the plurality of partition regions P1, P2, P3, and P4 may include the first partition region P1 including the first side surface S1 and the fourth side surface S4, the second partition region P2 including the first side surface S1 and the second side surface S2, the third partition region P3 including the second side surface S2 and the third side surface S3, and a fourth partition region P4 including the third side surface S3 and the fourth side surface S4.

The first groove 151a may include a 1-1 groove 151a-1 disposed in the first partition region P1, a 1-2 groove 151a-2 disposed in the second partition region P2, a 1-3 groove 151a-3 disposed in the third partition region P3, and a 1-4 groove 151a-4 disposed in the fourth partition region P4. That is, the plurality of first grooves 151a may be disposed apart from each other. In order to lower the operating voltage, it is advantageous to increase the area of the second electrode. Accordingly, the space is narrowed, and thus the first grooves 151a may have the form of islands spaced apart from each other. In this case, the protrusion portion 151b may have a structure surrounding the 1-1, 1-2, 1-3, and 1-4 grooves 151a-1, 151a-2, 151a-3, and 151a-4.

In this case, a light emitting region is not disposed in the third partition region P3, and thus the 1-3 groove 151a-3 may have a larger area than the 1-1 groove 151a-1, the 1-2 groove 151a-2, and the 1-4 groove 151a-4.

Figure 19A:
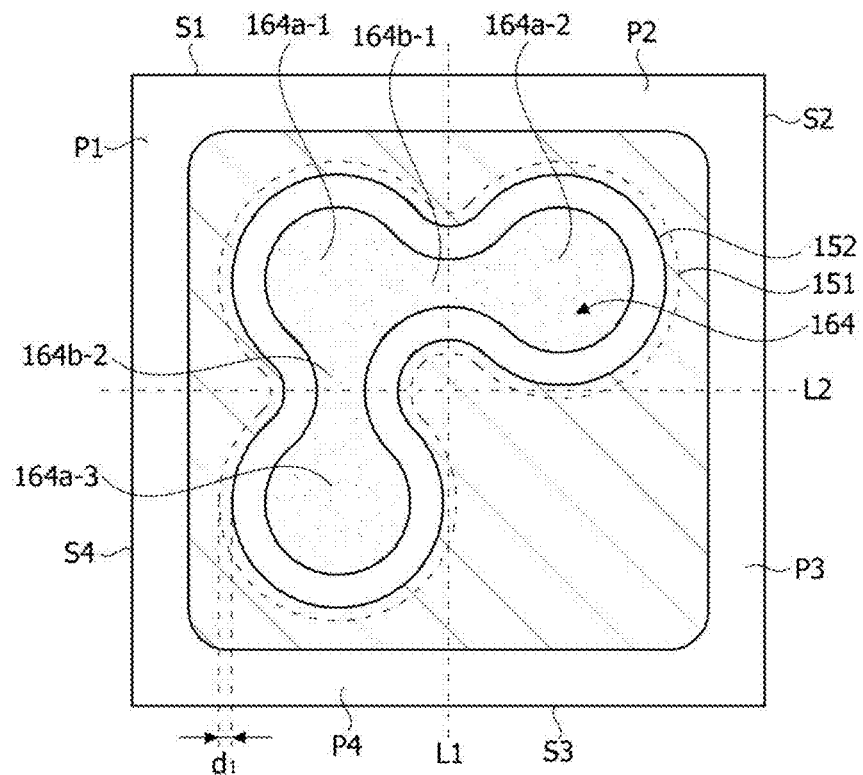
FIGS. 19A and 19B are a plan view and a sectional view in which a first cover electrode and a second cover electrode are formed.
Figure 19B:
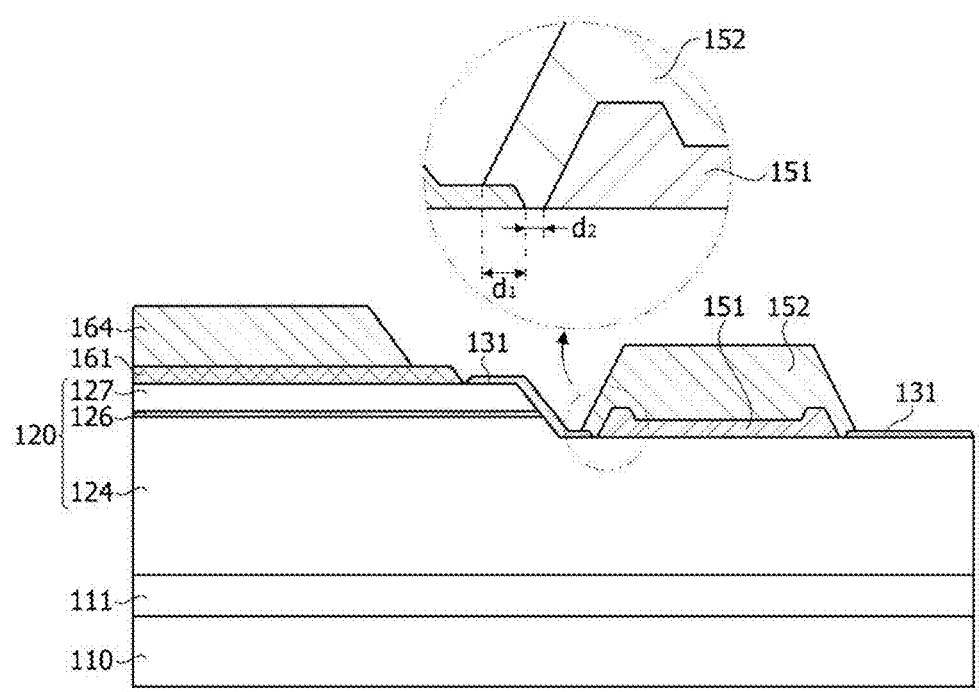

Referring to FIGS. 19A and 19B, the first cover electrode 152 may be disposed on the first electrode 151. The first cover electrode 152 may be disposed on the first electrode 151. In this case, the first cover electrode 152 may have a first groove disposed at one surface, and the first cover electrode 152 may include a first uneven portion 152a disposed in the first groove 151a. According to such a configuration, it is possible to improve an electrical connection between the first cover electrode 152 and the first electrode 151 and thus also possible to lower the operating voltage. When no first groove 151a is present in the first electrode 151, the oxide film is not removed, and thus the electrical connection between the first cover electrode 152 and the first electrode 151 may be weakened.

The first cover electrode 152 may be widely formed to cover the side surface of the first electrode 151 and a portion of the first insulation layer 131. The first cover electrode 152 may include a second uneven portion 152b disposed in a separation region d2 between the first insulation layer 131 and the first electrode 151. The second uneven portion 152b may be in direct contact with the first conductive semiconductor layer 124. Accordingly, it is possible to enhance the electric current injection efficiency.

The second cover electrode 164 may be disposed on the second electrode 161. The first cover electrode 152 may cover even the side surface of the second electrode 161.

The first cover electrode 152 and the second cover electrode 164 may contain at least one of Ni/Al/Au, Ni/IrOx/Au, Ag, Ni, Cr, Ti, Al, Rh, Pd, Ir, Sn, In, Ru, Mg, Zn, Pt, Au, and Hf, but are not limited thereto. However, the first cover electrode 152 and the second cover electrode 164 may each have an exposed outermost layer containing Au.

Figure 20A:
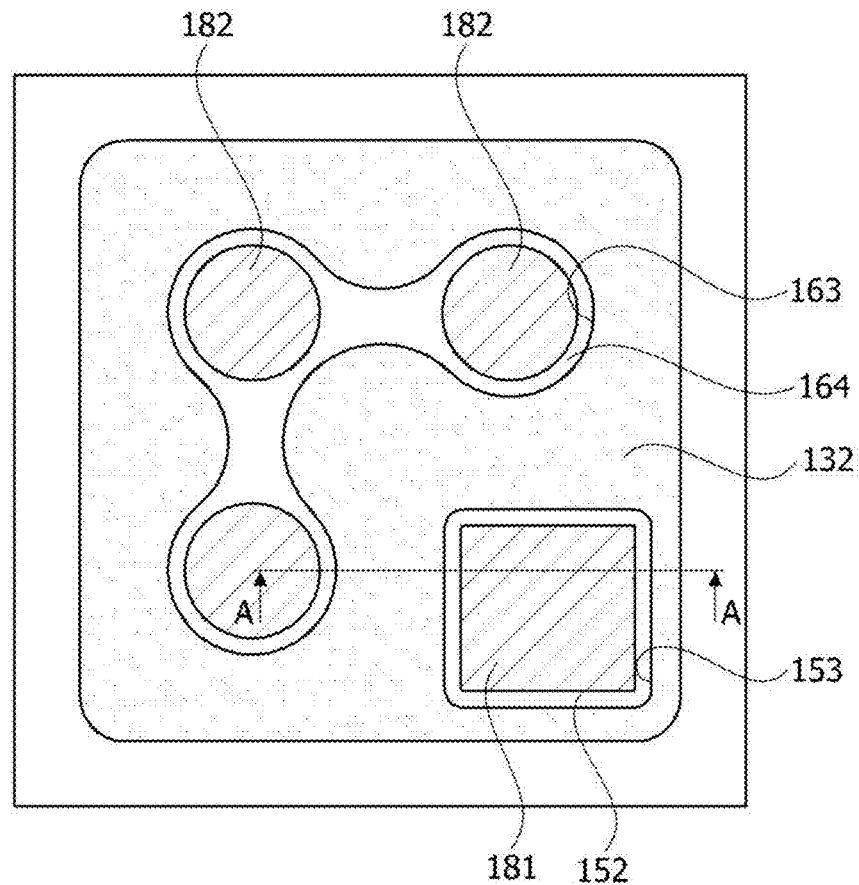
FIGS. 20A and 20B are a plan view and a sectional view in which a second insulation layer is formed.
Figure 20B:
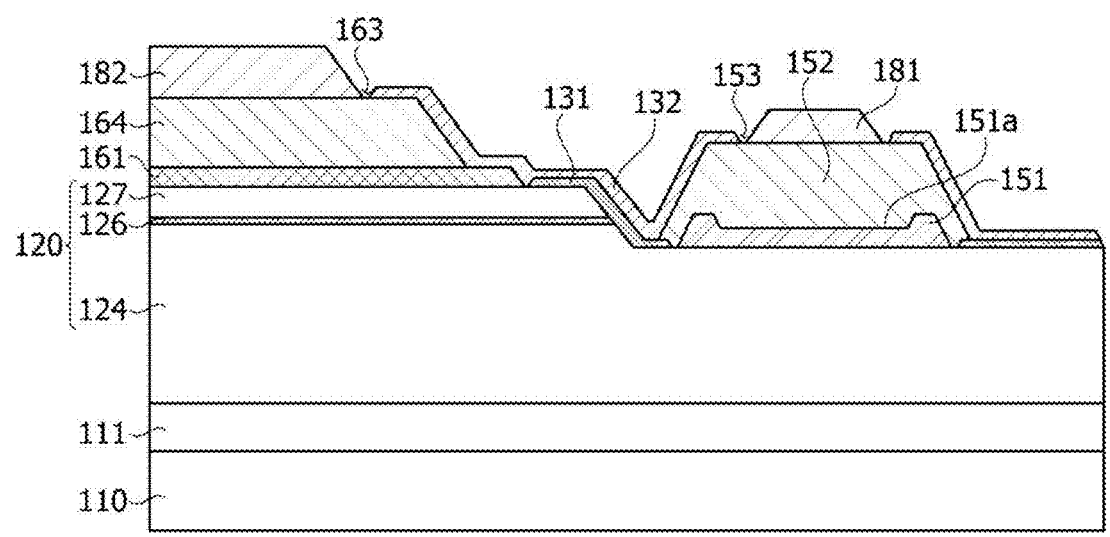
Figure 21:
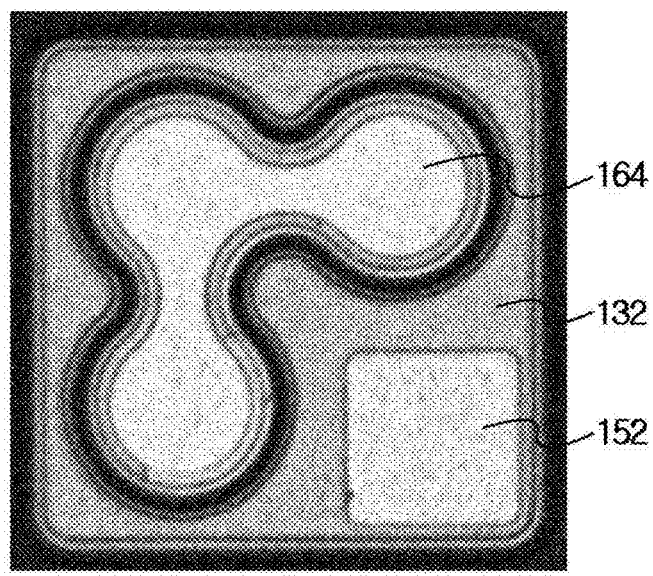
FIG. 21 is a photograph obtained by capturing a plane surface of a semiconductor device according to the third embodiment of the present invention.

Referring to FIGS. 20A, 20B, and 21, the second insulation layer 132 may be disposed on the first cover electrode 152, the second cover electrode 164, and the first insulation layer 131. The second insulation layer 132 may include a third hole 153 exposing the first cover electrode 152 and a fourth hole 163 exposing the second cover electrode 164.

In this case, the ratio of the area of the first cover electrode 152 exposed by the third hole 153 to the area of the second cover electrode 164 exposed by the fourth hole 163 may range from 1:2 to 1:5. When the area ratio is greater than or equal to 1:2, the area of the second cover electrode 164 increases, and it is possible to improve the hole injection efficiency. Also, the area of the first pad part 164a-1 increases, and thus the size of the bump electrodes may increase. Accordingly, it is possible to increase the heat dissipation efficiency. When the area ratio is less than or equal to 1:5, the area of the first cover electrode 152 increases, and thus it is possible to improve the electron injection efficiency.

Additionally, a first bump electrode 181 may be disposed on the first cover electrode 152, and a second bump electrode 182 may be disposed on the second cover electrode 164. However, the present invention is not limited thereto. The first bump electrode 181 and the second bump electrode 182 may be formed when a chip is mounted on a circuit board.

Figure 22:
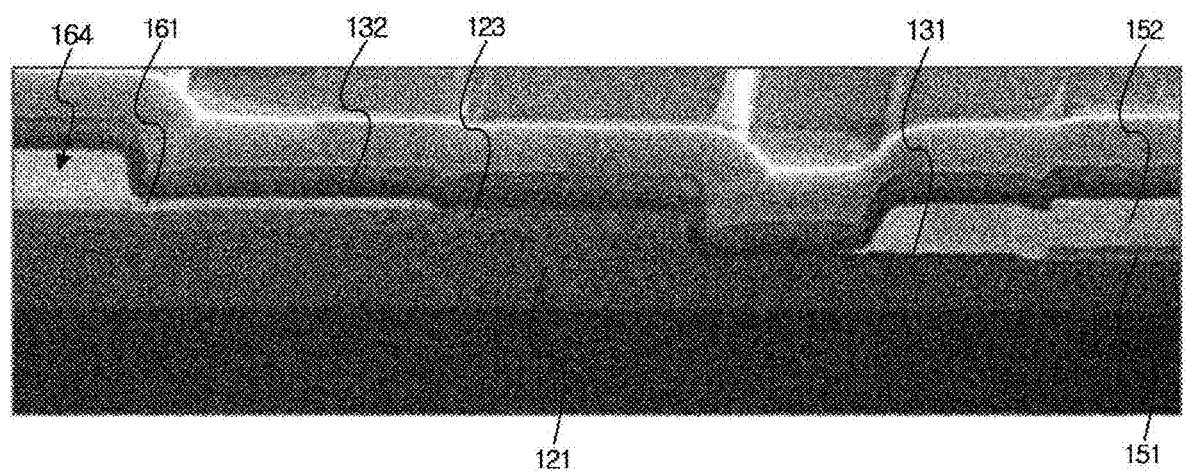
FIG. 22 is a photograph obtained by capturing a sectional surface of a semiconductor device according to the third embodiment of the present invention.

Referring to FIG. 22, the first insulation layer 131 and the second insulation layer 132 may be formed of at least one material selected from a group consisting of SiO2, SixOy, Si3N4, SixNy, SiOxNy, Al2O3, TiO2, and AlN. Also, the first insulation layer 131 and the second insulation layer 132 may be formed of the same material. Accordingly, the first insulation layer 131 and the second insulation layer 132 may be formed of the same material on at least a portion of the side surface of the first conductive semiconductor layer 124, the side surface of the active layer 126, and the side surface of the second conductive semiconductor layer 127 located between the light emitting region and the non-light emitting region. However, the present invention is not limited thereto, and the first insulation layer 131 and the second insulation layer 132 may contain different materials.

The first insulation layer 131 may horizontally extend from a lower portion of the second insulation layer 132 between the light emitting region and the non-light emitting region and be disposed apart from the first electrode 151, and the first cover electrode 152 may be disposed on a portion of the first electrode 151 and the first insulation layer 131. Thus, the first cover electrode 152 may be disposed between a portion of the first insulation layer 131 and a portion of the second insulation layer 132 to vertically overlap with the first insulation layer 131 and the second insulation layer 132.

Figure 23:
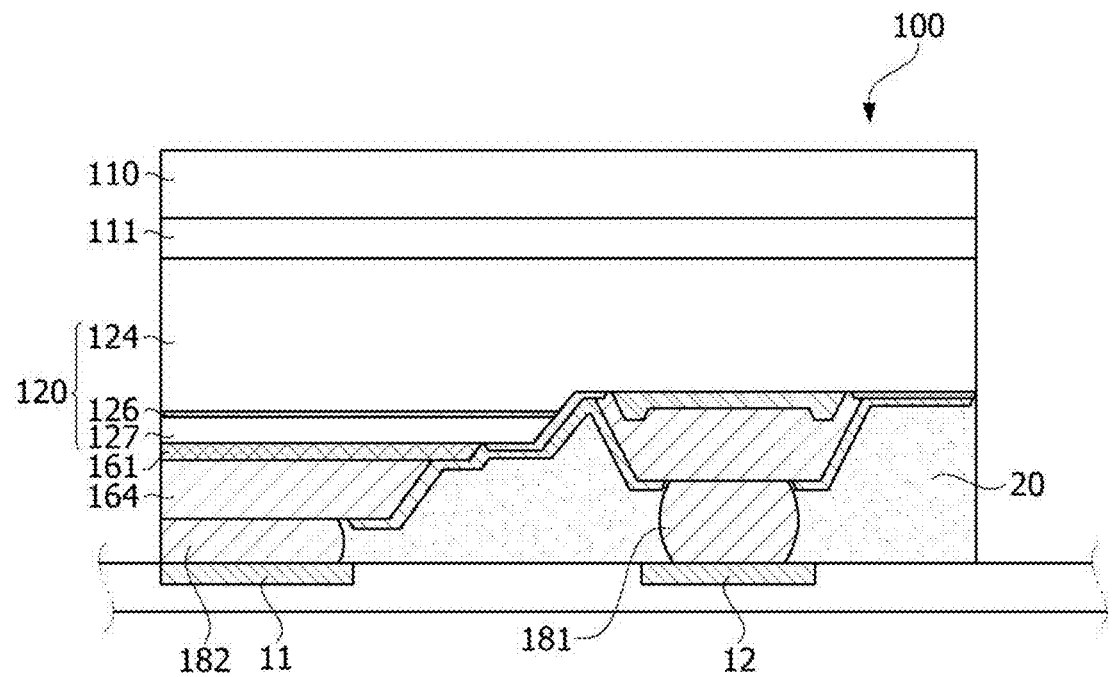
FIG. 23 is a diagram showing a semiconductor device package according to the third embodiment of the present invention.

Referring to FIG. 23, a semiconductor device 100 according to an embodiment may be mounted on a circuit board 10 as a flip chip. The semiconductor device 100 may include all of the above-described elements. For example, the first bump electrode 181 and the second bump electrode 182 may be electrically connected to and mounted on electrode pads 11 and 12 of the circuit board 10. In this case, various filling members 20 may be disposed between the semiconductor device 100 and the circuit board 10. For example, each of the filling members may include a material capable of reflective ultraviolet light (e.g., aluminum).

Figure 24:
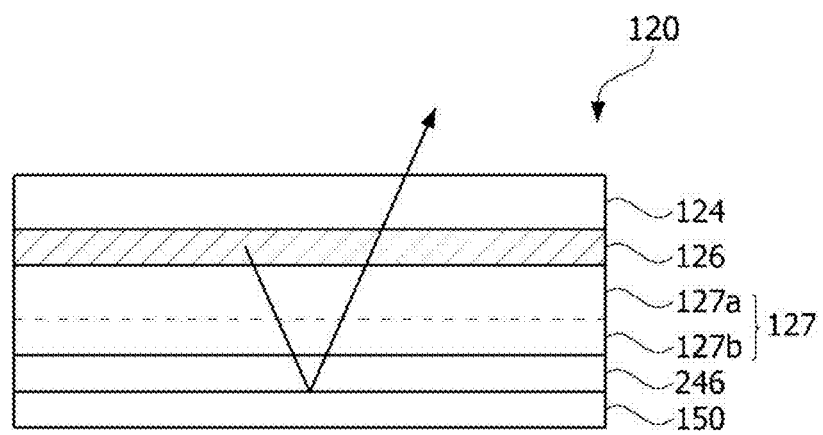
FIG. 24 is a conceptual view of a semiconductor structure according to an embodiment of the present invention.
Figure 25:
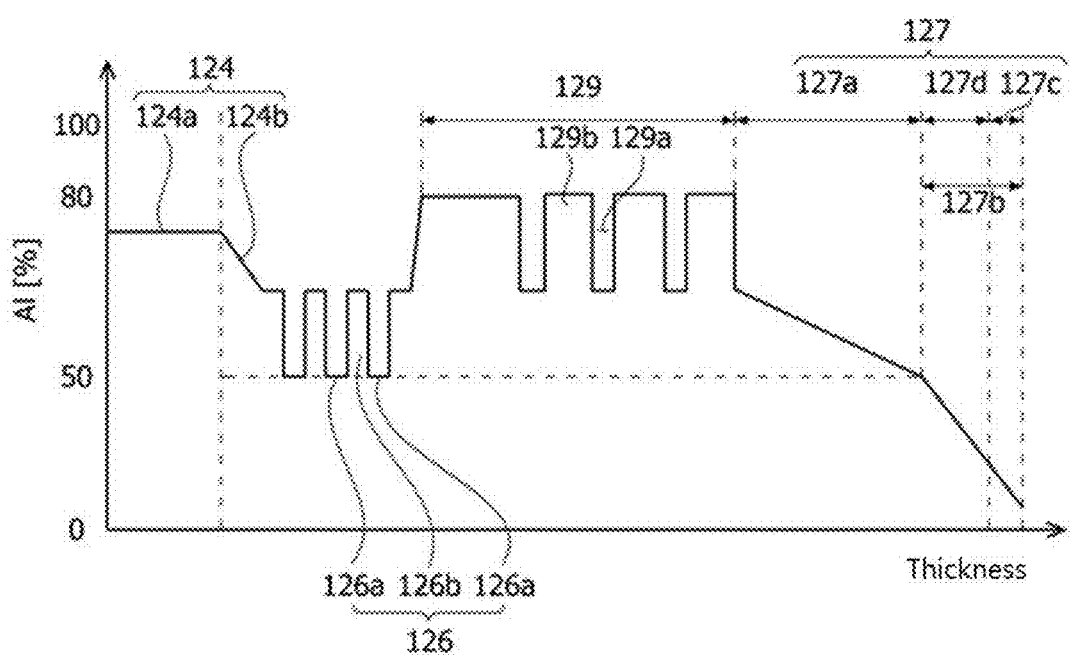
FIG. 25 is a graph obtained by measuring an aluminum composition of a semiconductor structure.

FIG. 24 is a conceptual view of a semiconductor structure according to an embodiment of the present invention, and FIG. 25 is a graph obtained by measuring an aluminum composition of FIG. 1.

The semiconductor structure 120 according to an embodiment of the present invention may output ultraviolet wavelength light. For example, the semiconductor structure 120 may output near-ultraviolet wavelength light (UV-A), far-ultraviolet wavelength light (UV-B), or deep-ultraviolet wavelength light (UV-C). The wavelength range may be determined by the aluminum composition of the semiconductor structure 120.

Referring to FIG. 24, a semiconductor device according to an embodiment includes a semiconductor structure 120 including a first conductive semiconductor layer 124, a second conductive semiconductor layer 127, and an active layer 126 disposed between the first conductive semiconductor layer 124 and the second conductive semiconductor layer 127.

The second conductive semiconductor layer 127 may include a 2-1 (second-prime) conductive semiconductor layer 127a having a high aluminum composition and a 2-2 (second-double-prime) conductive semiconductor layer 127b having a relatively low aluminum composition.

The second electrode 246 may be brought into ohmic contact with the 2-2 conductive semiconductor layer 127b. The second electrode 246 may include a transparent electrode having relatively low ultraviolet light absorption. For example, the second electrode 246 may be formed of ITO, but is not limited thereto.

The second conductive layer 150 may inject electric current into the second conductive semiconductor layer 127. Also, the second conductive layer 150 may reflect light emitted from the active layer 126.

According to an embodiment, the second electrode 246 may be in direct contact with a semiconductor layer (e.g., P—AlGaN) having a band gap larger than energy of ultraviolet wavelengths. Conventionally, the second electrode 246 is disposed on a semiconductor layer (e.g., a GaN layer) having a small band gap to facilitate an ohmic connection, and thus most ultraviolet light is absorbed by the GaN layer. However, according to an embodiment, the second electrode 246 is in direct ohmic contact with P—AlGaN, and thus most light may pass through the second conductive semiconductor layer 127.

However, there is absorption of ultraviolet light by most second electrodes. Accordingly, there is a need to improve light extraction efficiency while maintaining ohmic contact by the second electrode. It is possible to improve light extraction efficiency while maintaining ohmic characteristics by increasing light transmittance of the second electrode 246 and placing a conductive layer having reflective characteristics on the lower portion of the second electrode 246.

Referring to FIG. 25, an electron-blocking layer 129 may be disposed between the active layer 126 and the second conductive semiconductor layer 127. The electron-blocking layer 129 may block electrons supplied from the first conductive semiconductor layer 124 from flowing out to the second conductive semiconductor layer 127, thus increasing the probability that electrons and holes will be recombined with each other in the active layer 126. The electron-blocking layer 129 may have a higher energy band gap than the active layer 126 and/or the second conductive semiconductor layer 127.

The electron-blocking layer 129 may be made of a material selected from among semiconductor materials having an empirical formula $In_{x1}Al_{y1}Ga_{1-x1-y1}N$ ($0 \leq x1 \leq 1$, $0 \leq y1 \leq 1$, and $0 \leq x1+y1 \leq 1$), for example, AlGaN, InGaN, InAlGaN, and so on, but is not limited thereto. A first layer 129b having a high aluminum composition and a second layer 129a having a low aluminum composition may be alternately disposed in the electron-blocking layer 129.

The first conductive semiconductor layer 124, the active layer including the barrier layer 126b and the well layer 126a, the 2-1 conductive semiconductor layer 127a, and the 2-2 conductive semiconductor layer 127b may all contain aluminum. Accordingly, the first conductive semiconductor layer 124, the barrier layer 126b, the well layer 126a, the 2-1 conductive semiconductor layer 127a, and the 2-2 conductive semiconductor layer 127b may be made of AlGaN. However, the present invention is not limited thereto.

The 2-1 conductive semiconductor layer 127a may have a thickness greater than 10 nm and less than 200 nm. When the thickness of the 2-1 conductive semiconductor layer 127a is less than 10 nm, resistance thereof increases, and thus it is possible to reduce the electric current injection efficiency. Also, when the thickness of the 2-1 conductive semiconductor layer 127a is greater than 200 nm, it is possible to decrease crystallinity because of materials constituting the 2-1 conductive semiconductor layer 127a and thus improve electrical characteristics and optical characteristics.

The 2-1 conductive semiconductor layer 127a may have a higher aluminum composition than the well layer 126a. In order to generate ultraviolet light, the aluminum composition of the well layer 126a may range from about 30% to about 50%. When the 2-1 conductive semiconductor layer 127a has a lower aluminum composition than the well layer 126a, the 2-1 conductive semiconductor layer 127a absorbs light, and thus light extraction efficiency may be reduced.

The aluminum composition of the 2-1 conductive semiconductor layer 127a may be greater than 40% and less than 80%. When the aluminum composition of the 2-1 conductive semiconductor layer 127a is less than 40%, the 2-1 conductive semiconductor layer 127a absorbs light. When the aluminum composition of the 2-1 conductive semiconductor layer 127a is greater than 80%, electric current injection efficiency deteriorates. For example, when the aluminum composition of the well layer 126a is 30%, the aluminum composition of the 2-1 conductive semiconductor layer 127a may be 40%.

The 2-2 conductive semiconductor layer 127b may have a lower aluminum composition than the well layer 126a. When the 2-2 conductive semiconductor layer 127b has a higher aluminum composition than the well layer 126a, resistance between the second electrode and the 2-2 conductive semiconductor layer 127b increases, and thus electric current may not be sufficiently injected.

The aluminum composition of the 2-2 conductive semiconductor layer 127b may be greater than 1% and less than 50%. When the aluminum composition is greater than 50%, the 2-2 conductive semiconductor layer 127b may not be sufficiently ohmic with the second electrode. When the aluminum composition is less than 1%, the aluminum composition is almost a GaN composition, and thus the 2-2 conductive semiconductor layer 127b absorbs light.

The 2-2 conductive semiconductor layer 127b may have a thickness greater than about 1 nm and less than about 30 nm. As described above, the 2-2 conductive semiconductor layer 127b has an aluminum composition low enough to be ohmic and thus may absorb ultraviolet light. Accordingly, it may be advantageous in terms of optical output power to control the 2-2 conductive semiconductor layer 127b to be as thin as possible.

However, when the thickness of the 2-2 conductive semiconductor layer 127b is controlled to be 1 nm or less, the 2-2 conductive semiconductor layer 127b may not be disposed in some sections, and the 2-1 conductive semiconductor layer 127a may be partially exposed from the semiconductor structure 120. Accordingly, it may be difficult for the 2-2 conductive semiconductor layer 127b to be formed as a single layer and also perform its role. Also, when the thickness is greater than 30 nm, the amount of absorbed light is so large that optical output power efficiency may decrease.

The 2-2 conductive semiconductor layer 127b may include a 2-3 conductive semiconductor layer 127c and a 2-4 conductive semiconductor layer 127d. The 2-3 conductive semiconductor layer 127c may be a surface layer in contact with the second electrode, and the 2-4 conductive semiconductor layer 127d may be a layer for adjusting the aluminum composition.

The 2-4 conductive semiconductor layer 127d may be disposed between the 2-1 conductive semiconductor layer 127a having a relatively high aluminum content and the 2-3 conductive semiconductor layer 127c having a relatively low aluminum content. Accordingly, it is possible to prevent a deterioration of crystallinity due to a rapid change in aluminum content.

The aluminum composition of the 2-3 conductive semiconductor layer 127c may be greater than 1% and less than 20%. Alternatively, the aluminum composition may be greater than 1% and less than 10%.

When the aluminum composition is less than 1%, the 2-3 conductive semiconductor layer 127c may have a light absorption rate that is too high. When the aluminum composition is greater than 20%, contact resistance of the second electrode increases, and thus the electric current injection efficiency may be reduced.

However, the present invention is not limited thereto, and the aluminum composition of the 2-3 conductive semiconductor layer 127c may be adjusted in consideration of the electric current injection characteristics and the light absorption rate. Alternatively, the aluminum composition may be adjusted according to optical output power or electrical characteristics required by a product.

For example, when the electric current injection characteristics are more important than the light absorption rate, the aluminum composition may be adjusted to be in the range of 1% to 10%. When the optical output power characteristics are more important than the electrical characteristics in products, the aluminum composition of the 2-3 conductive semiconductor layer 127c may be adjusted to be in the range of 1% to 20%.

When the aluminum composition of the 2-3 conductive semiconductor layer 127c is greater than 1% and less than 20%, resistance between the 2-3 conductive semiconductor layer 127c and the second electrode decreases, and thus the operating voltage may be lowered. Accordingly, it is possible to enhance the electrical characteristics. The thickness of the 2-3 conductive semiconductor layer 127c may be greater than 1 nm and less than 10 nm. Accordingly, it is possible to alleviate the light absorption problem.

The 2-2 conductive semiconductor layer 127b may have a smaller thickness than the 2-1 conductive semiconductor layer 127a. The ratio of the thickness of the 2-1 conductive semiconductor layer 127a and the thickness of the 2-2 conductive semiconductor layer 127b may range from 1.5:1 to 20:1. When the thickness ratio is less than 1.5:1, the 2-1 conductive semiconductor layer 127a is so thin that the electric current injection efficiency may decrease. Also, when the thickness ratio is greater than 20:1, the 2-2 conductive semiconductor layer 127b is so thin that there may be a reduction in ohmic reliability.

The 2-1 conductive semiconductor layer 127a may have an aluminum composition decreasing away from the active layer 126. Also, the 2-2 conductive semiconductor layer 127b may have an aluminum composition decreasing away from the active layer 126. Accordingly, the aluminum composition of the 2-3 conductive semiconductor layer 127c may be in the range of 1% to 10%.

However, the present invention is not limited thereto, and the aluminum compositions of the 2-1 conductive semiconductor layer 127a and the 2-2 conductive semiconductor layer 127b may, instead of having a continuous decrease, include some sections in which there is no decrease.

In this case, the 2-2 conductive semiconductor layer 127b may have a greater reduction in aluminum composition than the 2-1 conductive semiconductor layer 127a. That is, the 2-2 conductive semiconductor layer 127b may have a greater variation in aluminum composition in a thickness direction than the 2-1 conductive semiconductor layer 127a. Here, the thickness direction may refer to a direction from the first conductive semiconductor layer 124 to the second conductive semiconductor layer 127 or a direction from the second conductive semiconductor layer 127 to the first conductive semiconductor layer 124.

The 2-1 conductive semiconductor layer 127a should have a greater thickness than the 2-2 conductive semiconductor layer 127b and have a higher aluminum composition than the well layer 126a. Accordingly, the 2-1 conductive semiconductor layer 127a may have a relatively gradual reduction in aluminum composition.

However, the 2-2 conductive semiconductor layer 127b has a small thickness and has a large variation in aluminum composition. Accordingly, the 2-2 conductive semiconductor layer 127b may have a relatively high reduction in aluminum composition.

Figure 26:
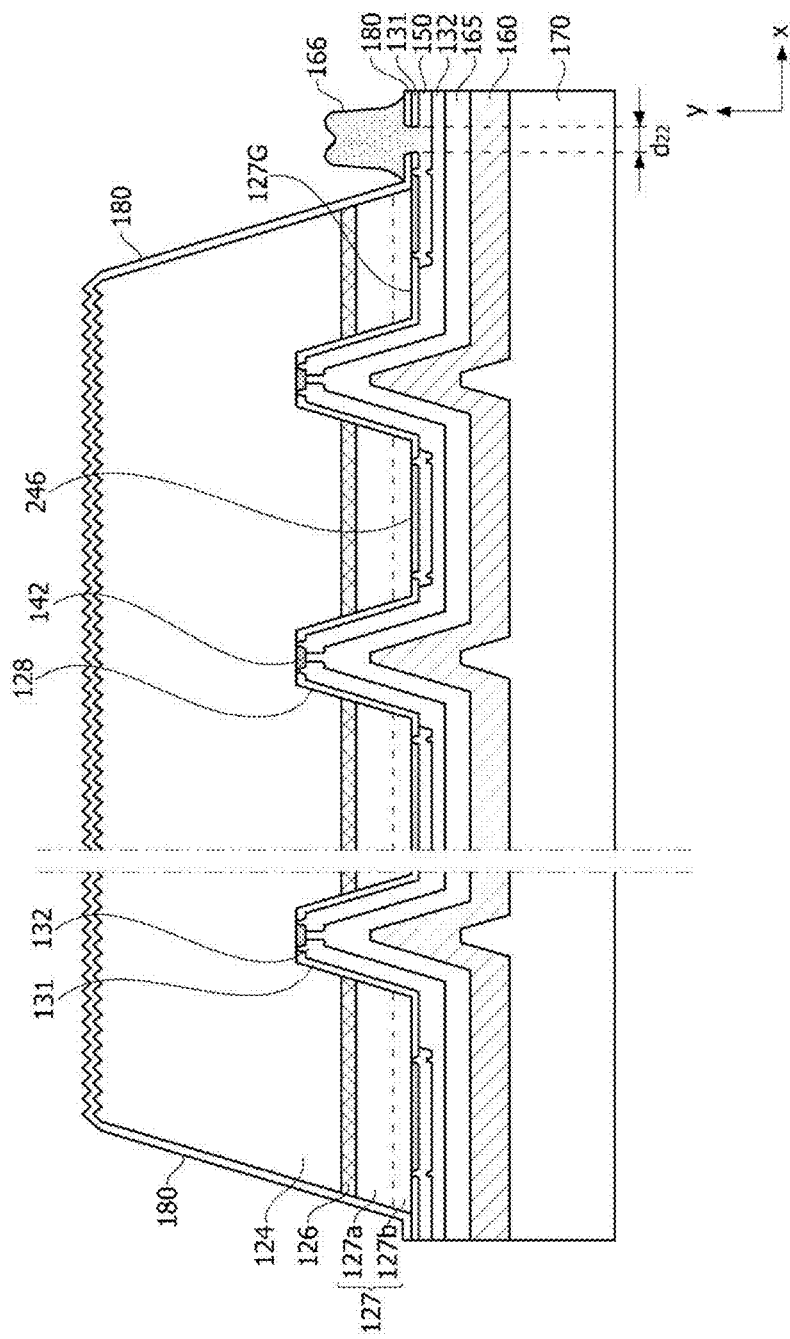
FIG. 26 is a conceptual view of a semiconductor device according to a fourth embodiment of the present invention.

FIG. 26 is a conceptual view of a semiconductor device according to a fourth embodiment of the present invention.

The above-described configuration of the semiconductor structure 120 may be applied to a semiconductor structure 120 of FIG. 26 as it is.

A plurality of recesses 128 may extend from a first surface of a second conductive semiconductor layer 127 to even a portion of a first conductive semiconductor layer 124 through an active layer 126. A first insulation layer 131 may be disposed inside each of the recesses 128 to electrically insulate a first conductive layer 165 from the second conductive semiconductor layer 127 and the active layer 126.

A first electrode 142 may be disposed on top of each of the recesses 128 and electrically connected with the first conductive semiconductor layer 124. A second electrode 246 may be formed under the second conductive semiconductor layer 127.

As described above, a first surface 127G of the second conductive semiconductor layer 127 being in contact with the second electrode 246 may have an aluminum composition ranging from 1% to 10%, and thus it is possible to facilitate injection of electric current.

Each of the first electrode 142 and the second electrode 246 may be an ohmic electrode. Each of the first electrode 142 and the second electrode 246 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto.

A second electrode pad 166 may be disposed in an edge region of the semiconductor device. The second electrode pad 166 may have a recessed central portion and thus have a top surface including a concave part and a convex part. A wire (not shown) may be bonded to the concave portion of the top surface. Accordingly, since the bonding area increases, the second electrode pad 166 and the wire may be strongly bonded to each other.

The second electrode pad 166 may serve to reflect light. Thus, as the second electrode pad 166 gets closer to the semiconductor structure 120, it is possible to better enhance light extraction efficiency.

The convex portion of the second electrode pad 166 may be higher than the active layer 126. Accordingly, the second electrode pad 166 may enhance light extraction efficiency and control an orientation angle by upwardly reflecting light emitted from the active layer 126 in a direction horizontal to the device.

The first insulation layer 131 is partially open under the second electrode pad 166 so that the second conductive layer 150 and the second electrode 246 may be electrically connected to each other.

A passivation layer 180 may be formed on top of and on the side of the semiconductor structure 120. The passivation layer 180 may be in contact with the first insulation layer 131 in a region adjacent to the second electrode 246 or in the lower portion of the second electrode 246.

An opening of the first insulation layer 131 where the second electrode pad 166 is in contact with the second conductive layer 150 may have a width d22 ranging, for example, from 40 µm to 90 µm. When the width d22 is less than 40 µm, the operating voltage may rise. When the width d22 is greater than 90 µm, it may be difficult to secure a processing margin for preventing exposure of the second conductive layer 150. When the second conductive layer 150 is exposed outside the second electrode 246, there may be a reduction in reliability of the device. Accordingly, the width d22 may preferably range from 60% to 95% of the entire width of the second electrode pad 166.

The first insulation layer 131 may electrically insulate the first electrode 142 from the active layer 126 and the second conductive semiconductor layer 127. Also, the first insulation layer 131 may electrically insulate the second conductive layer 150 from the first conductive layer 165.

The first insulation layer 131 may be made of at least one material selected from a group consisting of SiO2, SixOy, Si3N4, SixNy, SiOxNy, Al2O3, TiO2, and AlN, but is not limited thereto. The first insulation layer 131 may be formed as a single or multiple layers. For example, the first insulation layer 131 may be a distributed Bragg reflector (DBR) having a multi-layered structure including an Si oxide or a Ti compound. However, the present invention is not limited thereto, and the first insulation layer 131 may include various reflective structures.

When the first insulation layer 131 performs a reflection function, the first insulation layer 131 may upwardly reflect light emitted horizontally from the active layer 126, thereby enhancing light extraction efficiency. As the number of recesses 128 increases, an ultraviolet semiconductor device may have more effective light extraction efficiency than a semiconductor device that emits blue light.

The second conductive layer 150 may cover the lower portion of the second electrode 246. Accordingly, the second electrode pad 166, the second conductive layer 150, and the second electrode 246 may form one electrical channel.

The second conductive layer 150 may cover the second electrode 246 and may be in contact with the side surface and the bottom surface of the first insulation layer 131. The second conductive layer 150 may be made of a material having high adhesion strength to the first insulation layer 131 and may also be made of at least one material selected from a group consisting of Cr, Al, Ti, Ni, and Au, or an alloy thereof. The second conductive layer 150 may be made as a single or multiple layers.

When the second conductive layer 150 is in contact with the side surface and the top surface of the first insulation layer 131, it is possible to enhance thermal and electrical reliability of the second electrode 246. Also, the second conductive layer 150 may have a reflection function for upwardly reflecting light emitted from a gap between the first insulation layer 131 and the second electrode 246.

The second insulation layer 132 may electrically insulate the second conductive layer 150 from the first conductive layer 165. The first conductive layer 165 may be electrically connected to the first electrode 142 through the second insulation layer 132.

The first insulation layer 131 may have a thickness that is larger than the second electrode 246 and smaller than the second insulation layer 132. For example, the thickness of the first insulation layer 131 may range from 300 nm to 700 nm. When the thickness is less than 300 nm, electrical reliability may deteriorate. When the thickness is greater than 700 nm and the second conductive layer 150 is disposed on the top surface and side surface of the first insulation layer 131, the second conductive layer 150 may have poor step coverage characteristics, thereby causing a detachment or crack. When a detachment or crack is caused, there may be a deterioration in the electric reliability or a reduction of the light extraction efficiency.

The thickness of the second insulation layer 132 may range from 400 nm to 1000 nm. When the thickness is less than 400 nm, electrical reliability may deteriorate when the device operates. When the thickness is greater than 1000 nm, reliability may be reduced due to a pressure or a thermal stress applied to the device when the device is processed, and also the cost of the device may increase due to a long processing time. The thicknesses of the first insulation layer 131 and the second insulation layer 132 are not limited thereto.

The first conductive layer 165 and a junction layer 160 may be disposed depending on the shape of the bottom surface of the semiconductor structure 120 and the shape of the recesses 128. The first conductive layer 165 may be made of a material with high reflectance. For example, the first conductive layer 165 may contain aluminum. When the first conductive layer 165 contains aluminum, the first conductive layer 165 may serve to upwardly reflect light emitted from the active layer 126, thereby enhancing light extraction efficiency.

The junction layer 160 may contain a conductive material. For example, the junction layer 160 may contain a material selected from a group consisting of gold, tin, indium, aluminum, silicon, silver, nickel, and copper, or an alloy thereof.

A substrate 170 may be made of a conductive material. For example, the substrate 170 may contain a metal or a semiconductor material. The substrate 170 may be made of a metal having good electrical conductivity and/or thermal conductivity. In this case, heat generated during operation of the semiconductor device may be quickly released to the outside.

The substrate 170 may contain a material selected from a group consisting of silicon, molybdenum, tungsten, copper, and aluminum, or an alloy thereof.

A square wave pattern may be formed on top of the semiconductor structure 120. The square wave pattern may enhance the extraction efficiency for light emitted from the semiconductor structure 120. The square wave pattern may have a different average height depending on ultraviolet wavelengths. For UV-C, the average height ranges from 300 nm to 800 nm. When the height ranges from 500 nm to 600 nm, it is possible to enhance light extraction efficiency.

Figure 27:
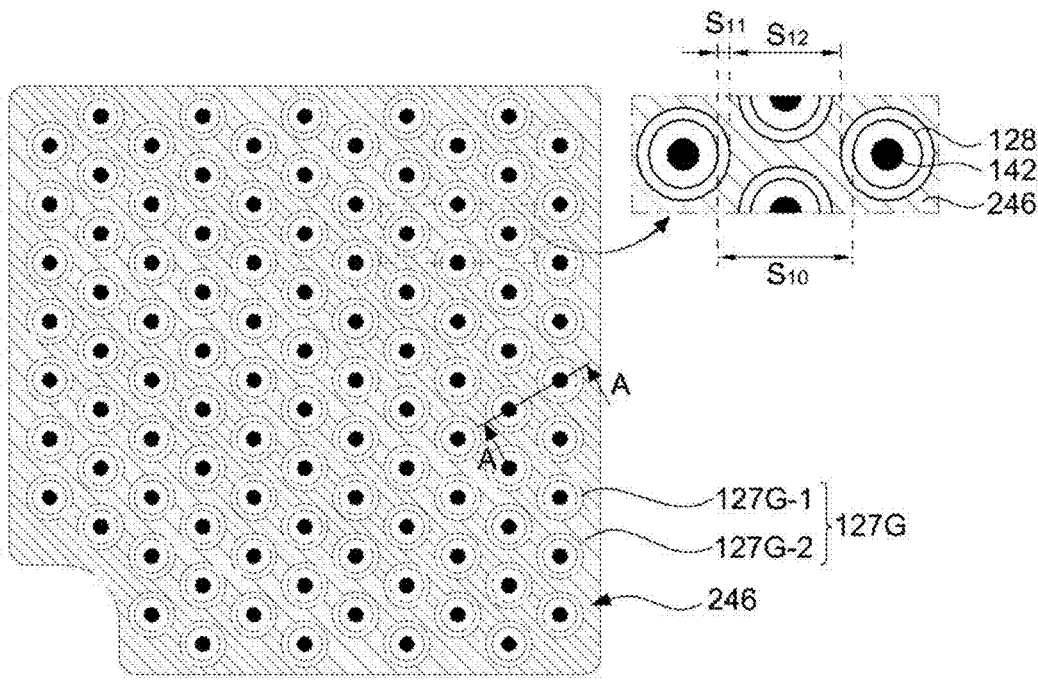
FIG. 27 is a plan view of FIG. 26.
Figure 28:
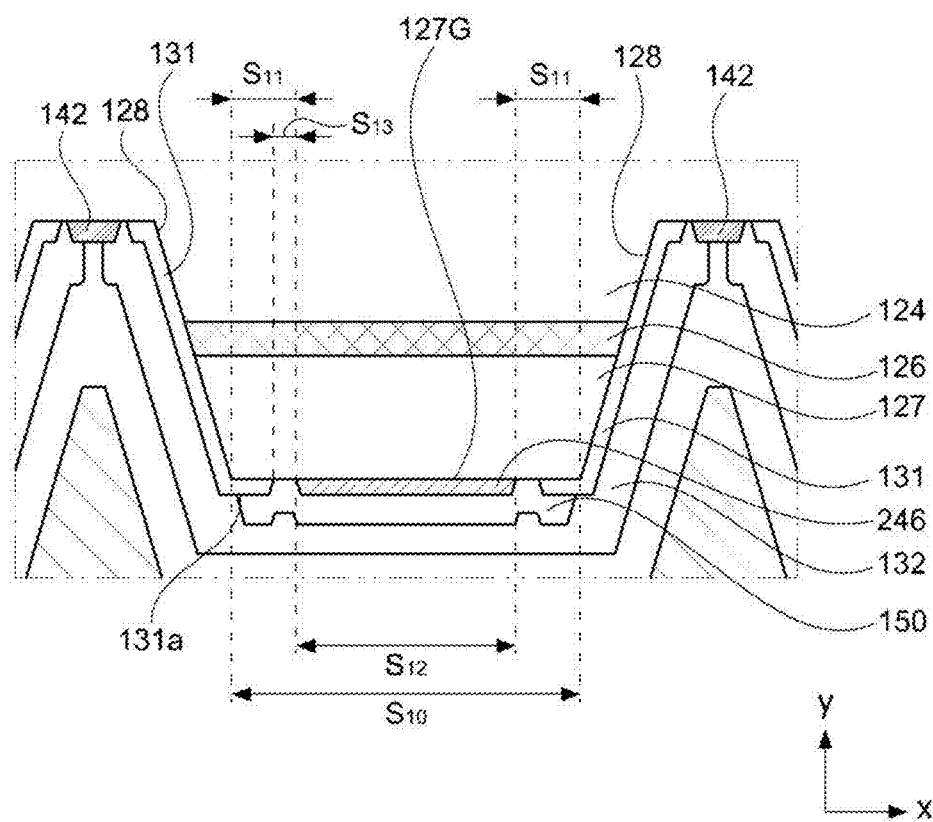
FIG. 28 is a sectional view taken along A-A of FIG. 27.

FIG. 27 is a plan view of FIG. 26, and FIG. 28 is a sectional view taken along A-A of FIG. 27.

Referring to FIGS. 27 and 28, each of the recesses 128 may have a diameter ranging from 20 μm to 70 μm. The diameter of each of the recesses 128 may be the maximum diameter formed on the first surface 127G of the second conductive semiconductor layer. When the diameter of the recess 128 is less than 20 μm, it is difficult to secure a processing margin for forming the first electrode 142 disposed therein, and thus the reliability of the semiconductor device may be reduced. When the diameter of the recess 128 is greater than 70 μm, the area of the active layer 126 decreases and thus the light emission efficiency may deteriorate.

An area of where a plurality of first electrodes 142 are in contact with the first conductive semiconductor layer 124 may range from 7.4% to 20% or from 10% to 20% of the maximum horizontal sectional area of the semiconductor structure 120.

When the area of the plurality of first electrodes 142 is less than 7.4%, electric current spreading characteristics cannot be sufficient, and thus the optical output power decreases. When the area is greater than 20%, the areas of the active layer 126 and the second electrode 246 excessively decrease, and thus the operating voltage increases and the optical output power decreases.

Also, the total area of the plurality of recesses 128 may range from 10% to 30% or from 13% to 30% of the maximum horizontal sectional area of the semiconductor structure 120. When the total area of the recesses 128 does not fall within this range, it may be difficult to keep the total area of the first electrode 142 within the range of 7.4% to 20%. Also, there are an increase in operating voltage and a decrease in optical output power.

The area of the first surface 127G of the second conductive semiconductor layer 127 may be equal to the maximum horizontal area of the semiconductor structure 120 minus the total area of the recesses 128. For example, the area of the first surface of the second conductive semiconductor layer 127 may range from 70% to 90% of the maximum horizontal area of the semiconductor structure 120.

The first surface 127G of the second conductive semiconductor layer 127 may include a plurality of first regions 127G-1 surrounding the plurality of recesses 128 and a second region 127G-2 disposed between the plurality of first regions 127G-1, when viewed from the top.

The first region 127G-1 may indicate the sum of spaces S11 between the second electrode 246 and outer circumferential surfaces of the recesses 128. The area of the first region may range from 1% to 20%.

The second region 127G-2 may be the entire region except the plurality of first regions 127G-1. The second electrode 246 may be entirely disposed on the second region 127G-2.

The second region 127G-2 may range from 50% to 89% or from 50% to 70% of the maximum horizontal sectional area of the semiconductor structure 120. The area of the second region 127G-2 may be an area of where the second electrode 246 is in contact with the second conductive semiconductor layer 127.

When the second area 127G-2 is less than 50%, the area of the second electrode 246 is so small that the operating voltage may increase and hole injection efficiency may decrease.

When the second area 127G-2 exceeds 89%, the area of the first electrode is so relatively small that electron injection efficiency may decrease. Depending on the product, when the second region 127G-2 exceeds 89%, electrical characteristics may be deteriorated. Accordingly, the second region may be freely designed to be within the aforementioned range in consideration of optical and electrical characteristics depending on requirements of an application field to which a product will be applied.

An area of where the first electrode 142 is in contact with the first conductive semiconductor layer 124 is inversely proportional to an area of where the second electrode 246 is in contact with the second conductive semiconductor layer 127. That is, when the number of recesses 128 is increased to increase the number of first electrodes 142, the area of the second electrode 246 decreases. Accordingly, in order to improve the electrical and optical characteristics, the spreading characteristics for electrons and holes should be balanced. Accordingly, it may be important to adjust the area of the first electrode and the area of the second electrode at an appropriate rate.

The ratio of the area of where the plurality of first electrodes 142 are in contact with the first conductive semiconductor layer 124 to the area of where the second electrode 246 is in contact with the second conductive semiconductor layer 127 (area of first electrode:area of second electrode) may range from 1:3 to 1:9.

When the area ratio is greater than 1:9, the area of the first electrode is so relatively small that the electric current spreading characteristics may deteriorate. Also, when the area ratio is less than 1:3, the second area is so relatively small that the electric current spreading characteristics may deteriorate.

The ratio of the entire area of the plurality of first regions 127G-1 to the area of the second region 127G-2 may range from 1:2.5 to 1:90. When the area ratio is less than 1:2.5, a sufficient ohmic area of the second electrode 246 cannot be secured, and thus there may be a reduction in electrical optical characteristics. When the area ratio is greater than 1:90, the area of the first region 127G-1 is so small that it may be difficult to secure a processing margin.

Referring to FIG. 28, the first surface 127G of the second conductive semiconductor layer 127 may include a 1-1 surface S10 disposed between two adjacent recesses 128. The 1-1 surface S10 may include a first section S11 where the second electrode 246 is not disposed and a second section S12 where an electrode is disposed. The 1-1 surface S10 may have a width ranging from 17 μm to 45 μm.

When the width of the 1-1 surface S10 is less than 17 μm, a separation distance between the recesses 128 is so small that the disposition area of the second electrode 246 may be reduced and thus electrical characteristics may deteriorate. When the width is greater than 45 μm, the separation distance between the recesses 128 is so large that the disposition area of the first electrode 142 may be reduced and thus electrical characteristics may deteriorate.

The first section S11 may be a unit section that forms the first region 127G-1. Also, the second section S12 may be a unit section that forms the second region 127G-2. The second section S12 may have a greater width in a first direction than the first section S11. The width of the first section S11 in the first direction (a distance from a recess to the second electrode) may range from 1 µm to 15 µm.

When the width of the first section S11 is less than 1 µm, it may be difficult for an extension part 131a of the first insulation layer to be disposed on the first surface 127G due to a processing margin. Accordingly, the electrical characteristics may deteriorate. When the width of the first section S11 is greater than 15 µm, a distance between the second electrode 246 and the first electrode 142 is so excessively large that the electrical characteristics may deteriorate. Accordingly, the width of the first section S11 in the first direction may be within the aforementioned range in consideration of the processing margin and the electrical characteristics.

The second electrode 246 may have the extension part 131a of the first insulation layer 131 and a separation region S13 having a width of 4 µm or less. When the width of the separation region S13 is greater than 4 µm, the disposition area of the second electrode 246 is so small that there may be an increase in operating voltage. However, the present invention is not limited thereto, and the separation region S13 may not be formed because of various reasons such as a processing method. In this case, it is possible to advantageously enlarge the region where the second electrode 246 may be disposed.

The second conductive layer 150 may fully surround the second electrode 246 and may be in contact with the side surface and the bottom surface of the first insulation layer 131. When the second conductive layer 150 is in contact with the side surface and the top surface of the first insulation layer 131, it is possible to enhance thermal and electrical reliability of the second electrode 246. Also, it is possible to have a function of upwardly reflecting incident ultraviolet light.

When the second conductive layer 150 fully cover the second electrode 246, the area of the second conductive layer 150 increases, and thus an area capable of reflecting light increases. Thus, it is possible to enhance the light extraction efficiency of the semiconductor device. That is, ultraviolet light passing through the first section S11 and the second section S12 may be reflected by the second conductive layer 150.

The second conductive layer 150 may form a Schottky junction with the second conductive semiconductor layer 127 in the separation region S13. Accordingly, it is possible to facilitate spreading of electric current.

The first surface 127G may have an average roughness kept at or below 7 nm. When the average roughness is greater than 7 nm, a boundary surface between the second electrode 246 and the second conductive layer 150 is so rough that there may be a decrease in reflectance. The average roughness may be a value obtained by calculating a difference in height of a square wave pattern formed on the first surface 127G. The average roughness may be a root-mean-square (RMS) value measured by using an atomic force microscopy (AFM).

Figure 29:
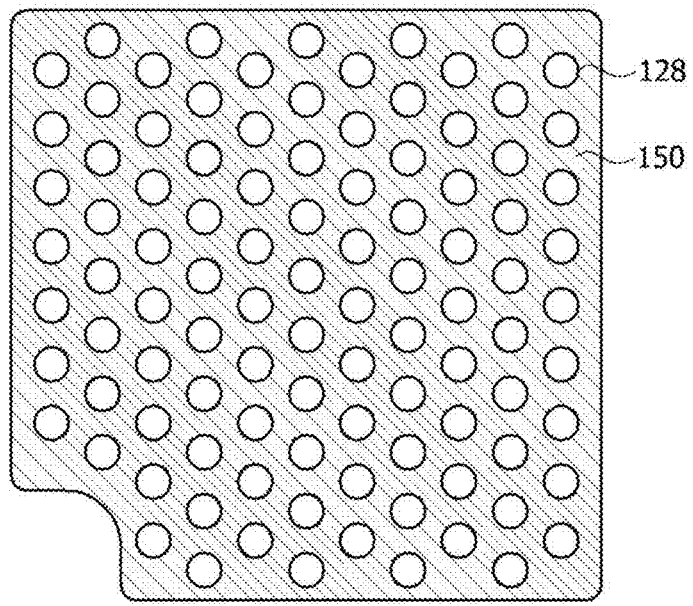
FIG. 29 is a plan view of a second conductive layer.
Figure 30:
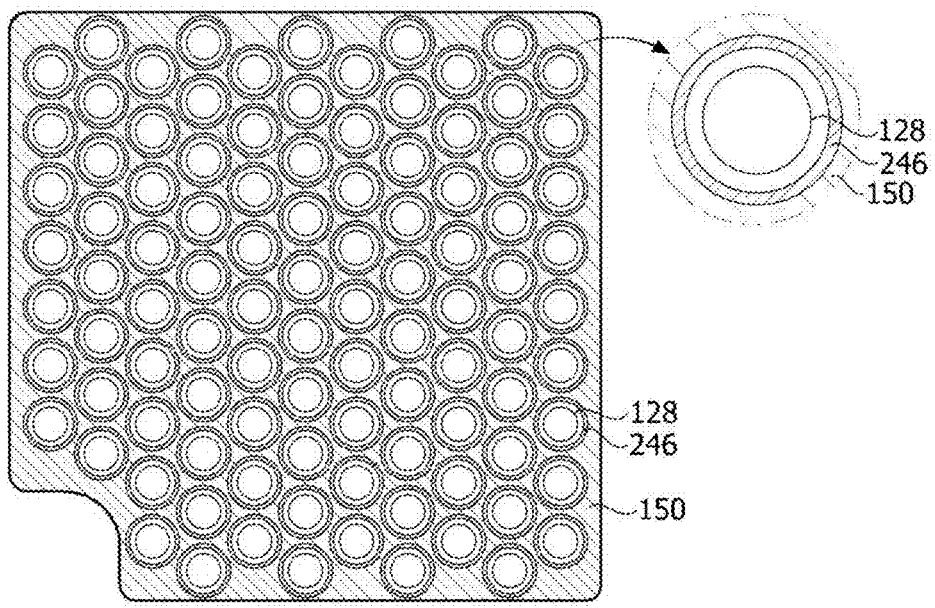
FIG. 30 is a plan view showing a second conductive layer having a minimum area.
Figure 31:
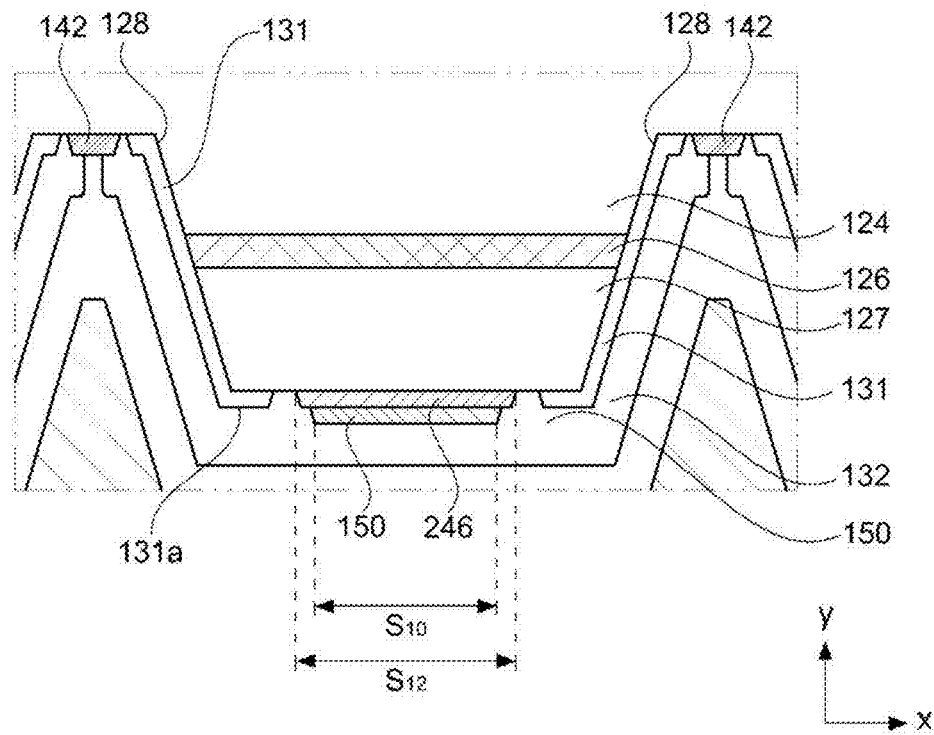
FIG. 31 is a plan view showing a second conductive layer having a minimum area.

FIG. 29 is a plan view of a second conductive layer, FIG. 30 is a plan view showing a second conductive layer having a minimum area, and FIG. 31 is a plan view showing a second conductive layer having a minimum area.

Referring to FIG. 29, the second conductive layer 150 may cover the maximum area of the semiconductor structure 120 except the region of the recesses 128. According to such a configuration, the second conductive layer 150 may fully cover the second electrode 246 and the second conductive semiconductor layer 127, and thus it is possible to increase the light extraction efficiency.

However, the present invention is not limited thereto, and the second conductive layer 150 may be disposed only under the second electrode 246 as necessary. That is, the second conductive layer 150 may have a smaller area than the second electrode 246.

An area of the second conductive layer 150 overlapping with the maximum horizontal area (the first area) of the semiconductor structure 120 may range from 44% to 180% of the area of the second electrode 246. The entire area of the second conductive layer 150 may even include a region other than the semiconductor structure (e.g., a region of the second electrode pad).

The area of the second conductive layer 150 overlapping with the maximum area of the semiconductor structure 120 may range from 40% to 90%. When the area of the second conductive layer 150 overlapping with the semiconductor structure 120 is less than 40%, efficiency of electric current injected into the second electrode 246 is reduced or an area capable of reflecting light incident onto the second conductive layer 150 through the second electrode 246 is small. Thus, the light extraction efficiency may be reduced. When the area of the second conductive layer 150 overlapping with the semiconductor structure 120 is 90%, the second conductive layer 150 may cover the entire area of the semiconductor structure 120 except the region of the recesses 128.

As described above, the area of the second electrode 246 may range from 50% to 89% of the maximum horizontal sectional area of the semiconductor structure 120.

Referring to FIGS. 30 and 31, when the second conductive layer 150 has a smaller area than the second electrode 246, the second electrode 246 may be exposed through a gap of the second conductive layer 150.

In this case, the second conductive layer 150 may cover only a portion of the second electrode 246. Also, the second conductive layer 150 may reflect only light having entered the second electrode 246. However, when the device operates at high electric current, it is possible to alleviate a reduction of reliability of the device due to migration of atoms constituting the second conductive layer 150.

That is, depending on the purpose of an application field of the semiconductor device, the second conductive layer 150 may be disposed to fully surround the second electrode 246 and may be disposed on only the second electrode 246.

Figure 32:
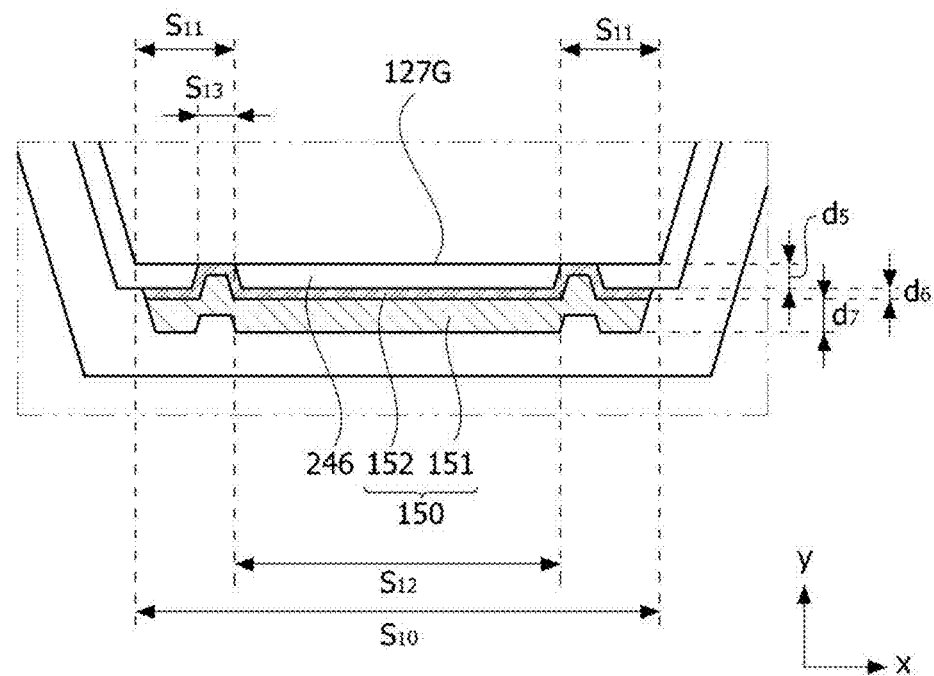
FIG. 32 is a diagram illustrating a configuration of the second conductive layer.
Figure 33:
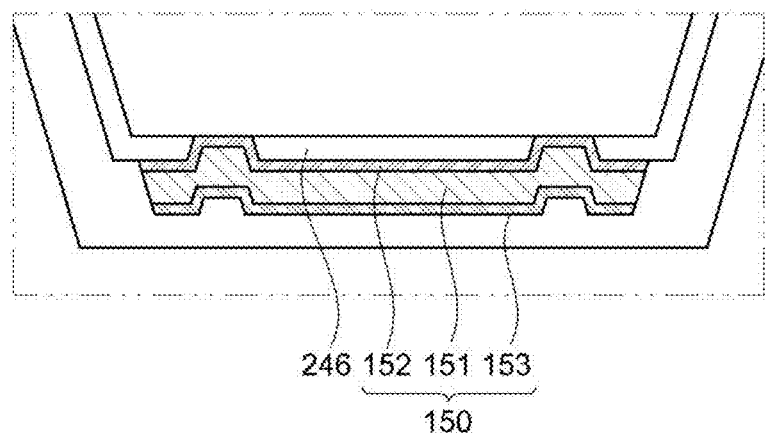
FIG. 33 is a first modification of FIG. 32.
Figure 34:
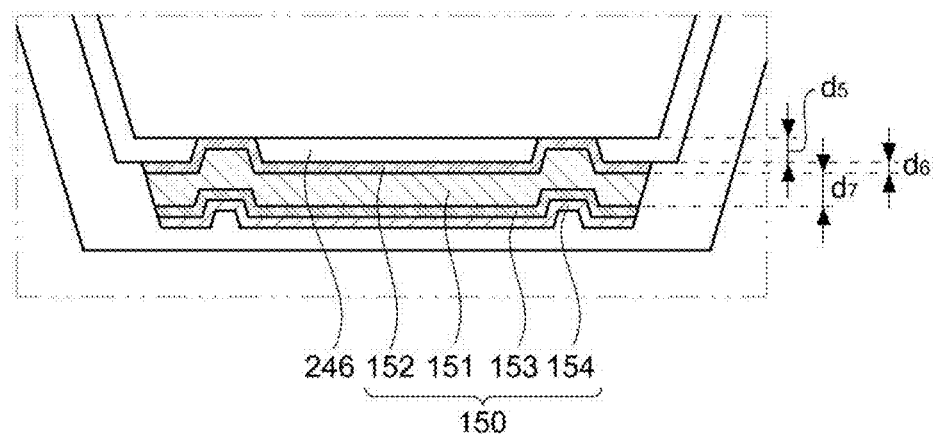
FIG. 34 is a second modification of FIG. 32.

FIG. 32 is a diagram illustrating a configuration of the second conductive layer, FIG. 33 is a first modification of FIG. 32, and FIG. 34 is a second modification of FIG. 32.

Referring to FIG. 32, the second electrode 246 may have a thickness d5 ranging from 1 nm to 15 nm or from 1 nm to 5 nm. When the thickness d5 of the second electrode 246 is less than 15 nm or 5 nm, the amount of absorbed light may be reduced. The second electrode 246 may be thinner than the first insulation layer.

When the thickness d5 of the second electrode 246 is less than 1 nm, it is difficult to appropriately place the second electrode 246, and thus the electrical characteristics may be deteriorated. When the thickness d5 exceeds 15 nm, light absorption is high, and thus the light extraction efficiency of the semiconductor device may be reduced. Also, when the thickness of the second electrode 246 exceeds 5 nm, the amount of light absorbed by the second electrode 246 increases, and thus the optical characteristics of the semiconductor device may be deteriorated. However, it is possible to enhance the electrical characteristics. Accordingly, the second electrode may be freely designed to have a thickness within the aforementioned range according to characteristics required in an application field to which a product will be applied.

The second conductive layer 150 may include a reflective layer 151 containing aluminum and a first intermediate layer 152 disposed between the second electrode 246 and the reflective layer 151. An oxide film may be formed between the second electrode 246 and the second conductive layer 150 due to high temperature and high pressure generated during the process. In this case, resistance between the second electrode 246 and the second conductive layer 150 increases, and thus it is possible to facilitate injection of electric current. Accordingly, the electric characteristics of the semiconductor device may be deteriorated. In an embodiment, the first intermediate layer 152 may be disposed between the reflective layer 151 and the second electrode 246 to enhance adhesion strength therebetween and also prevent occurrence of an oxide film.

The first intermediate layer 152 may contain at least one of chromium (Cr), titanium (Ti), and nickel (Ni). The thickness d6 of the first intermediate layer 152 may range from 0.7 m to 7 nm. When the thickness is less than 0.7 m, an adhesion effect and an electric current spreading prevention effect may be reduced. When the thickness is greater than 7 nm, the amount of absorbed ultraviolet light may increase.

The first intermediate layer 152 may further contain aluminum. In this case, it is possible to enhance adhesion strength between the first intermediate layer 152 and the reflective layer 151. Also, the first intermediate layer 152 is in contact with the first surface 127G in a separation region, and thus it is possible to improve electric current spreading characteristics.

The thickness ratio (d5:d7) of the second electrode 246 to the reflective layer 151 may range from 1:2 to 1:120. The thickness d7 of the reflective layer 151 may range from 30 nm to 120 nm. When the thickness of the reflective layer 151 is less than 30 nm, reflectance is reduced in an ultraviolet wavelength band. Even when the thickness is greater than 120 nm, reflective efficiency hardly increases.

Referring to FIG. 33, a second intermediate layer 153 may be disposed under the reflective layer 151. The second intermediate layer 153 may prevent atoms of the reflective layer 151 from migrating to an adjacent layer and thus may alleviate a reduction in reliability of the semiconductor device. The second intermediate layer 153 may contain at least one of Ni, Ti, No, Pt, and W and may have a thickness ranging from 50 nm to 200 nm.

Referring to FIG. 34, a third intermediate layer 154 may be disposed under the second intermediate layer 153. The third intermediate layer 154 is a layer for bonding to another layer and may contain Au, Ni, etc.

Figure 35:
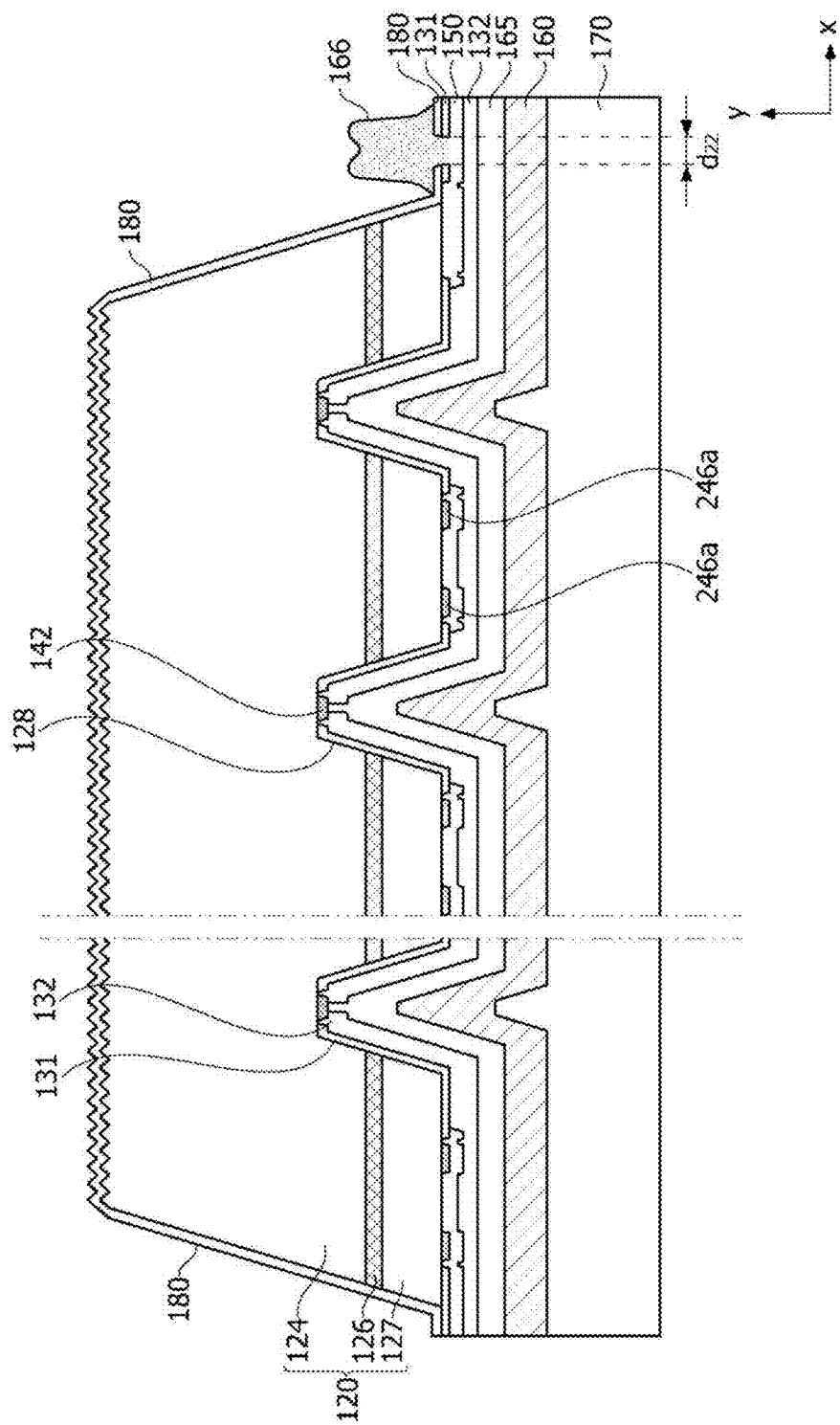
FIG. 35 is a conceptual view of a semiconductor device according to a fifth embodiment of the present invention.
Figure 36:
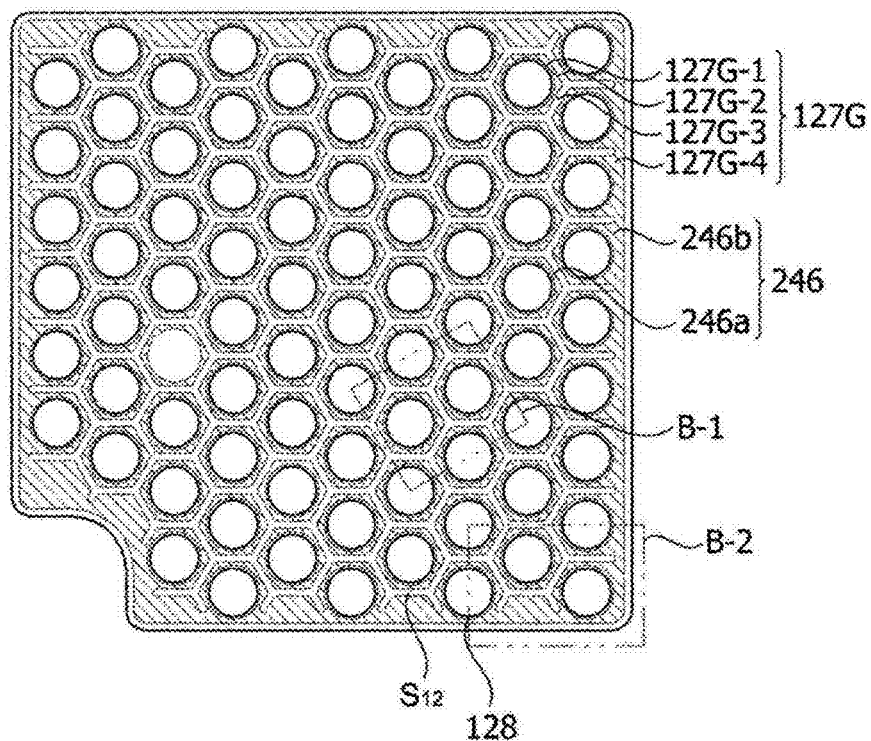
FIG. 36 is a plan view of FIG. 35.
Figure 37:
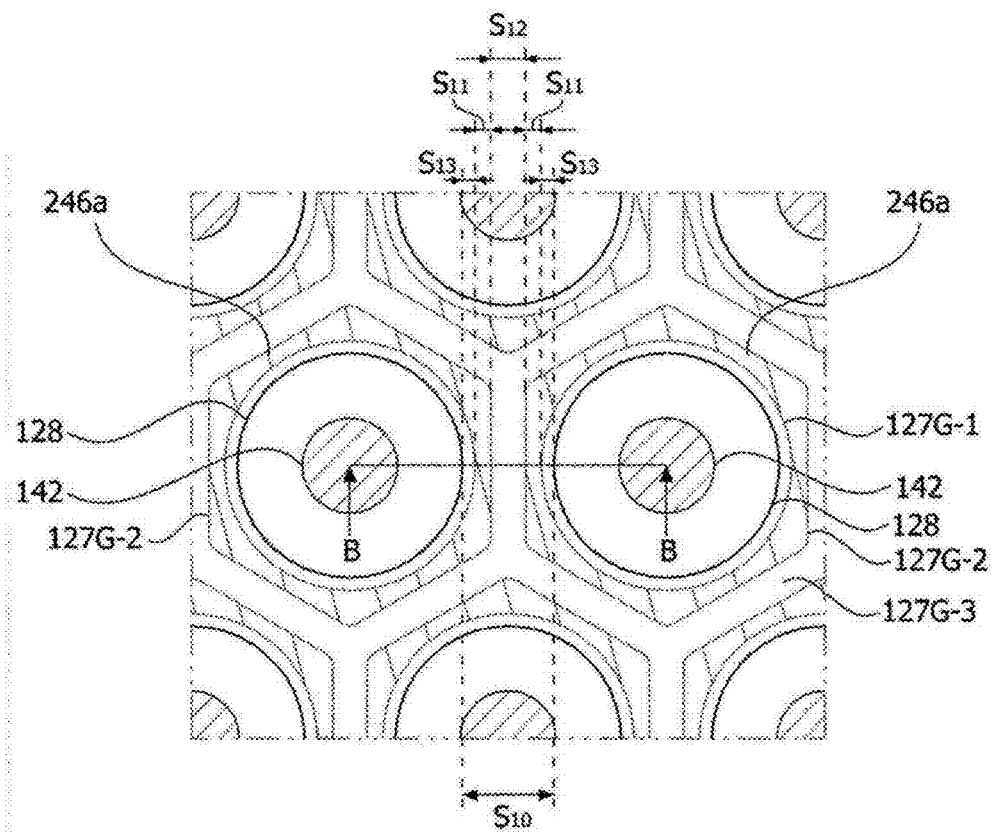
FIG. 37 is an enlarged view of a part B-1 of FIG. 36.
Figure 38:
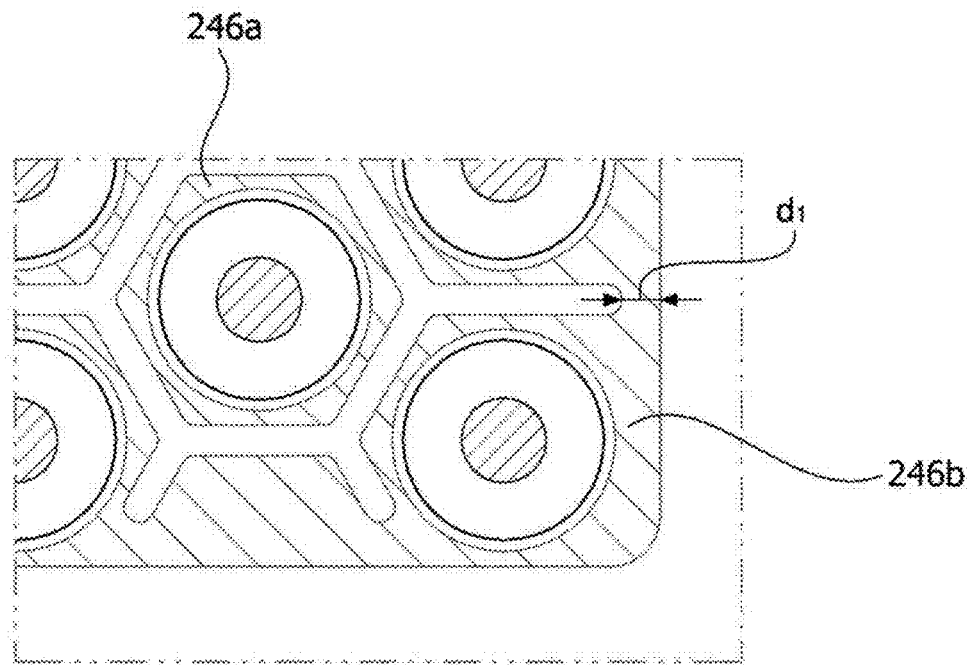
FIG. 38 is an enlarged view of a part B-2 of FIG. 36.

FIG. 35 is a conceptual view of a semiconductor device according to a fifth embodiment of the present invention, FIG. 36 is a plan view of FIG. 35, FIG. 37 is an enlarged view of a part B-1 of FIG. 36, and FIG. 38 is an enlarged view of a part B-2 of FIG. 36.

Referring to FIG. 35, the semiconductor structure 120 described with reference to FIGS. 1 to 3 and the configuration of each of the layers described with reference to FIG. 4 may be applied to the semiconductor device according to this embodiment as they are. According to an embodiment, a plurality of second electrodes 246 may be disposed on the first surface 127G of the second conductive semiconductor layer 127 disposed between two recesses 128.

Referring to FIGS. 36 to 38, the first surface 127G may include first regions 127G-1 surrounding recesses 128, second regions 127G-2 surrounding the first regions 127G-1, and third regions 127G-3 disposed between the second regions 127G-2.

Here, a first region 127G-1 may be a region between a second electrode 246 and a recess 128. For example, the first region 127G-1 may a ring-shaped area. The area of the first region 127G-1 may range from 1% to 20% of the maximum horizontal area of the semiconductor structure 120.

The second regions 127G-2 may have the entire area except the recesses 128 and the first regions 127G-1. For example, the second regions 127G-2 may each have an inner circular shape and an outer polygonal shape. For example, the second regions 127G-2 may each have an outer octagonal shape, but is not limited thereto. The second regions 127G-2 may be partitioned by the third regions 127G-3. The third regions 127G-3 may be disposed between the plurality of second regions 127G-2. The third regions 127G-3 may each be a region with an electric current density of 40% or less with respect to the first electrode 142 having an electric current density of 100%. Accordingly, the third regions 127G-3 may each have a low probability of participating in light emission. According to an embodiment, the third regions 127G-3, which has a low contribution to light emission, may be configured as a reflective region to increase the light extraction efficiency.

The first surface 127G may further include a fourth region 127G-4 disposed between a border region of the first surface 127G and the third regions 127G-3.

The second electrode 246 may include a 2-1 electrode 246a disposed in the second regions 127G-2 and a 2-2 electrode 246b disposed in the fourth region 127G-4.

The second electrode 246 may contain a metal or metal oxide with low resistance. However, the second electrode 246 reflects or transmits visible light, but absorbs ultraviolet light.

Accordingly, there is a need to reflect light emitted from the active layer 126 to the second conductive semiconductor layer 127 by decreasing the area of the second electrode 246 as long as the electrical characteristics are not significantly deteriorated. In this case, it is possible to secure the reflective region by narrowing the second region 127G-2 where the second electrode 246 is disposed and widening the third region 127G-3. Since the second conductive layer 150 is entirely disposed on the first surface 127G, light incident onto the third region 127G-3 may be reflected by the second conductive layer 150.

That is, according to an embodiment, the third regions 127G-3, which has a low contribution to light emission, may be utilized as the reflective region.

A first contact area of where the first surface 127G and the second electrode 246 are in contact with each other (the sum of the second region and the fourth region of FIG. 36) may range from 35% to 60% of the maximum area of the semiconductor structure 120. When the first contact area is less than 35%, the electric current spreading efficiency may be reduced. Also, when the first contact area exceeds 60%, the area of the third region 127G-3 is so small that the light extraction efficiency may decrease.

A second contact area of the first surface 127G and the second electrode 246 being not in contact with each other (the sum of the first region and the third region of FIG. 36)

may range from 10% to 55% of the maximum area of the semiconductor structure 120. When the second contact area is less than 10%, it is difficult to have sufficient reflective efficiency. When the second contact area is greater than 55%, the area of the second region 127G-2 is so small that there may be a decrease in electric current spreading efficiency.

The ratio of the second contact area to the first contact area may range from 1:0.7 to 1:6. When this relationship is satisfied, the electric current spreading efficiency is sufficient, and thus it is possible to enhance the optical output power. Also, a sufficient reflective region is secured, and thus it is possible to enhance the light extraction effect.

Referring to FIG. 38, the separation distance d1 between the third region 127G-3 and a border of the first surface 127G may range from 1.0 µm to 10 µm. When the separation distance d1 is less than 1.0 µm, the margin is so small that the second conductive layer 150 may not be appropriately formed, and thus there may be a reduction in reliability. Also, when the separation distance d1 is greater than 10 µm, the area of the second electrode 246 is so small that the electrical characteristics of the semiconductor device may be deteriorated.

Figure 39:
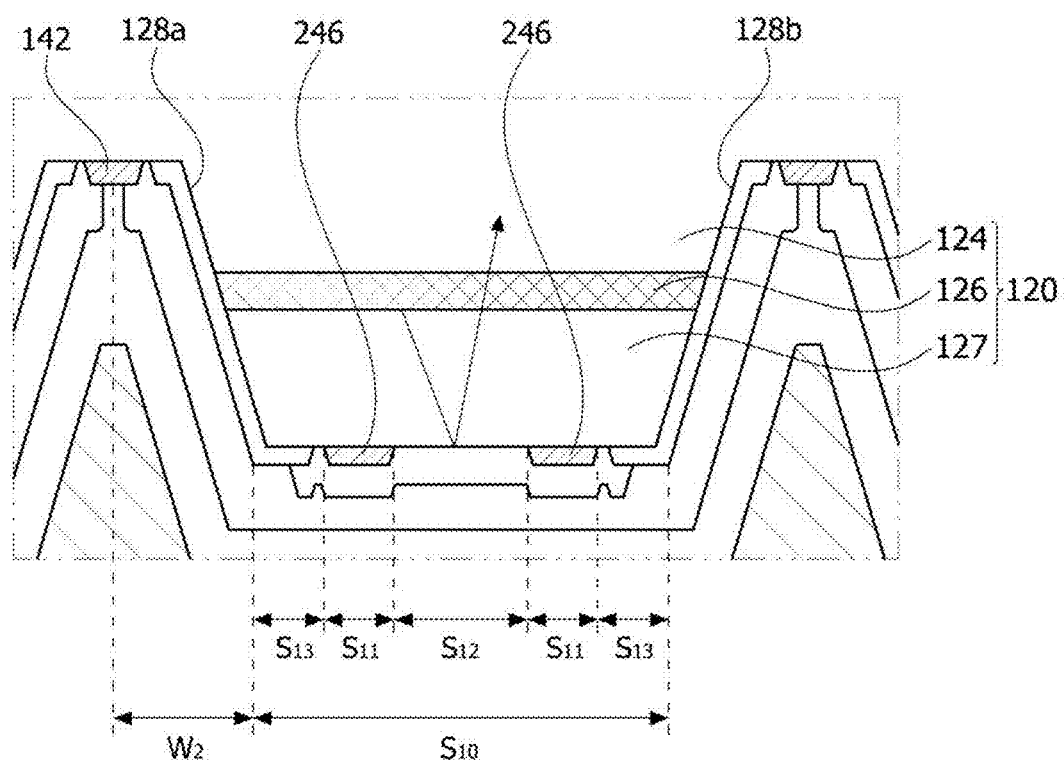
FIG. 39 is a sectional view taken along B-B of FIG. 37.

FIG. 39 is a sectional view taken along B-B of FIG. 37.

Referring to FIG. 39, the first surface 127G of the second conductive semiconductor layer 151 may include a 1-1 surface S10 disposed between two recesses 128 that are most adjacent to each other in a first direction (the X direction). Here, the first direction may be a direction perpendicular to the thickness direction of the semiconductor structure 120.

The 1-1 surface S10 may include a first section S11 where second electrodes 246 are disposed apart from each other in the first direction and a second section S12 placed between the second electrodes 246. The second conductive layer 150 may be disposed in the first section S11 and the second section S12. The entire width of the 1-1 surface S10 may range from 17 µm to 45 µm.

The entire width of the first section S11 in the first direction may range from 12 µm to 24 µm. The first section S11 may include two partition regions at both sides of the second section S12. The partition regions may have a width ranging from 6 µm to 12 µm.

When the entire width of the first section S11 is less than 12 µm, the area of the second electrode 246 is so small that there may be a decrease in electric current spreading efficiency. When the entire width is greater than 24 µm, the second section S12 is so small that the reflective efficiency may be decreased.

The width of the second section S12 in the first direction may range from 5 µm to 16 µm. When the width of the second section S12 in the first direction is less than 5 µm, it is difficult to secure a sufficient reflective region. When the width is greater than 16 µm, the second electrode 246 is narrowed.

The second section S12 may be disposed in a region with an electric current density of 40% or less with respect to the first electrode 142 having an electric current density of 100%. A first distance W2+S13+S11 between the second section S12 and the center of the recess 128 may be at least 17 µm. The radius of the bottom surface of the recess 128 may range from 10 µm to 35 µm, the width of the third section S13 may range from 1 µm to 5 µm, and the width of the first section S11 may range from 6 µm to 12 µm. Accordingly, the maximum separation distance may be greater than or equal to 52 µm.

The second section S12 may be disposed in a region with an electric current density of 40% or less from among regions disposed at least 17 µm apart from the center of the recess 128. For example, the second section S12 may be disposed in a region disposed 40 µm or more apart from the center of the recess 128.

When a plurality of recesses 128 are present in the semiconductor device, second sections S12 disposed 40 µm or more apart from the recesses 128 may overlap with each other. Accordingly, the overlap area of the second sections S12 may be adjusted according to a distance between the recesses 128.

In this case, the second section S12 may include a point corresponding to ½ of the width of the 1-1 surface S10 in the first direction. The point corresponding to ½ of the width of the 1-1 surface S10 in the first direction is a region between two adjacent recesses 128 and is likely to have a low electric current density. However, the present invention is not limited thereto. When the plurality of recesses has different diameters, the second section S12 may not necessarily include a point corresponding to ½ of the width in the first direction.

The third section S13 may be a region between the second electrode 246 and the recess 128. The width of the third section S13 in the first direction may range from 1 µm to 5 µm.

The ratio of the width of the second section S12 to the entire width of the first section S11 may range from 1:0.7 to 1:5. When the width ratio range is satisfied, the ratio of the second contact area to the first contact area may be maintained in the range of 1:0.7 to 1:6. Accordingly, it is possible to enhance the electric current spreading efficiency and the light extraction effect.

Figure 40:
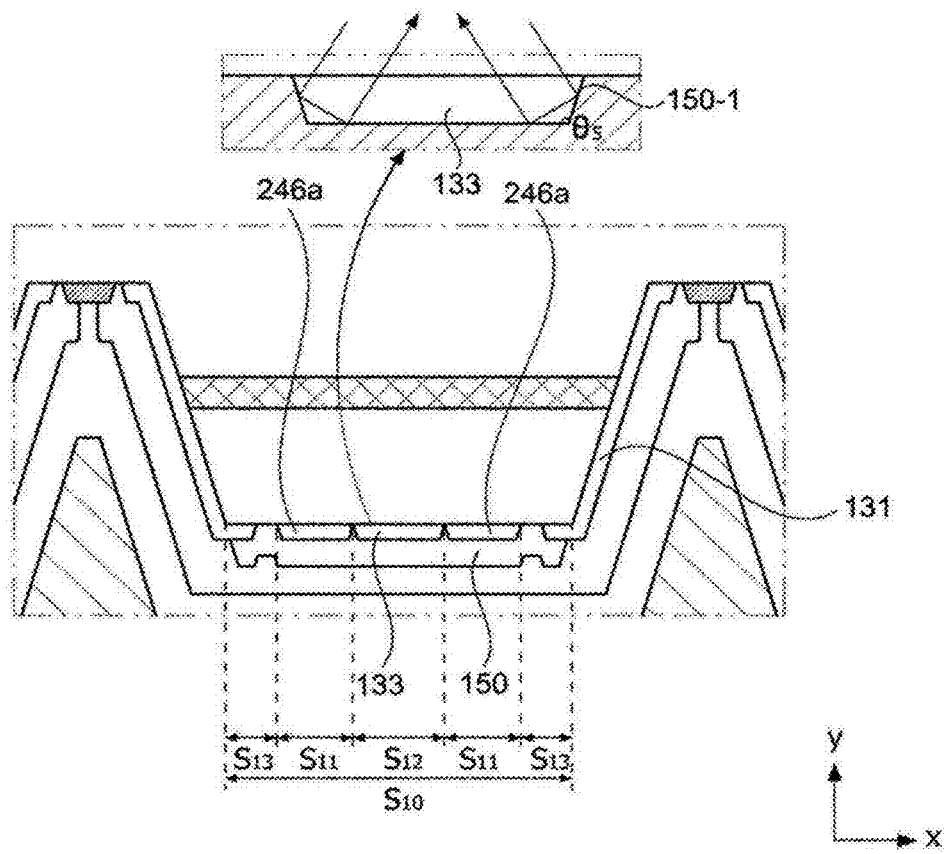
FIG. 40 is a first modification of FIG. 39.

FIG. 40 is a first modification of FIG. 39.

Referring to FIG. 40, the second conductive layer 150 may include a reflective groove 150-1 in the second section S12. Light incident onto the second section S12 may be reflected along a propagation path changed by the reflective groove 150-1. According to such a configuration, it is possible to reflect light in various directions, thus enhancing uniformity.

An inclined surface may have an angle θ5 greater than 90 degrees and less than 150 degrees. When the angle of the inclined surface is less than 90 degrees or greater than 150 degrees, it may be difficult to variously change a reflection angle of incident light. The angle of the inclined surface may be defined as an angle formed between the bottom surface and the inclined surface.

The depth of the reflective groove 150-1 may be the same as the thickness of the first insulation layer 131. The thickness of the first insulation layer 131 may be 110% to 130% of that of the thickness of the second electrode 246.

A light transmitting layer 133 may be disposed in the reflective groove 150-1. The shape of the light transmitting layer 133 may correspond to the shape of the reflective groove 150-1. Accordingly, the thickness of the light transmitting layer 133 may be the same as the thickness of the reflective groove 150-1. For example, the reflective groove 150-1 may be formed by forming the second conductive layer 150 on the light transmitting layer 133.

The material of the light transmitting layer 133 may include various materials capable of transmitting ultraviolet wavelength light. For example, the light transmitting layer 133 may contain an insulation layer material. The light transmitting layer 133 may contain at least one of $SiO_2$, $Si_xO_y$, $Si_3N_4$, $Si_xN_y$, $SiO_xN_y$, $Al_2O_3$, $TiO_2$, and AlN, but is not limited thereto.

Figure 41A:
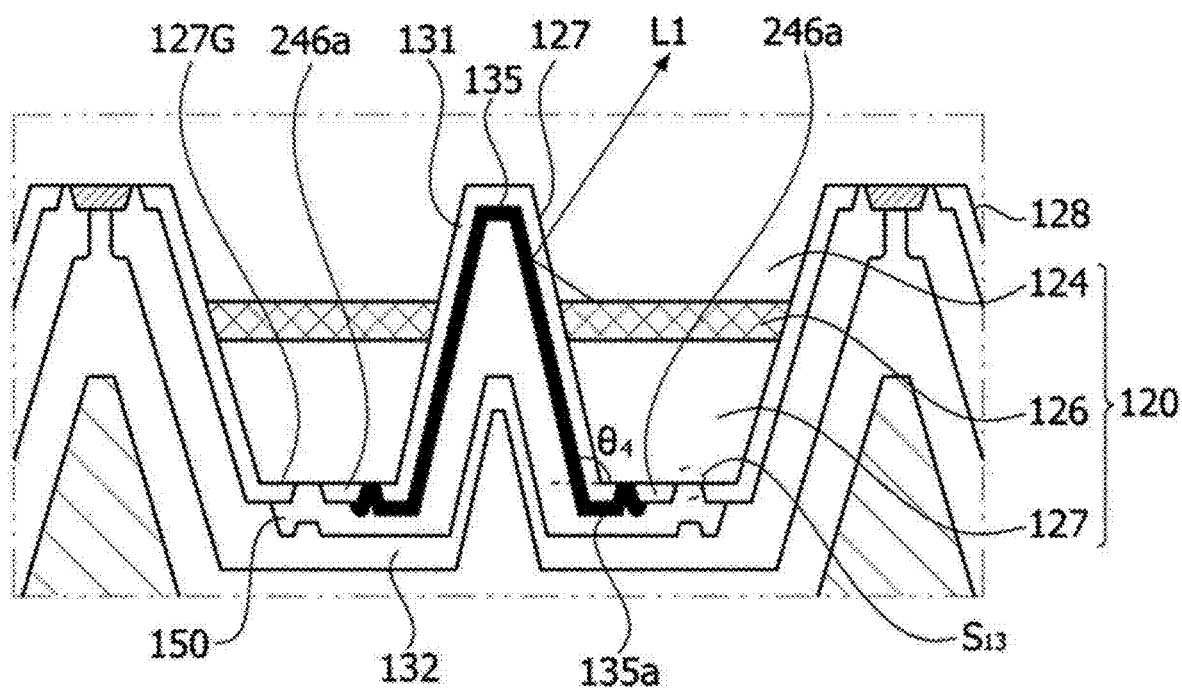
FIG. 41A is a second modification of FIG. 39.
Figure 41B:
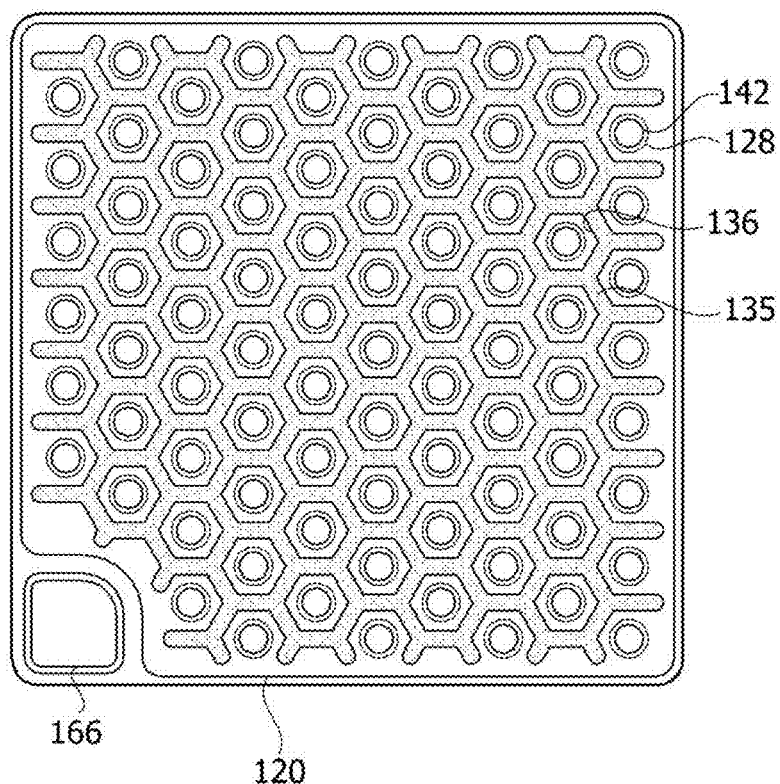
FIG. 41B is a plan view of the second modification.

FIG. 41A is a second modification of FIG. 39, and FIG. 41B is a plan view of the second modification.

Referring to FIG. 41A, a sub-recess 127 and a sub-reflective layer 135 disposed inside the sub-recess 127 may be disposed in the second section S12.

The sub-reflective layer 135 may be disposed inside the sub-recess 127. In detail, the sub-reflective layer 135 may be disposed on the first insulation layer 131 inside the sub-recess 127.

As the sub-reflective layer 135, a material with high reflectance in an ultraviolet wavelength band may be selected. The sub-reflective layer 135 may contain a conductive material. For example, the sub-reflective layer 135 may contain aluminum. When the sub-reflective layer 135 has a thickness ranging from about 30 nm to about 120 nm, the sub-reflective layer 135 may reflect 80% or more of ultraviolet wavelength light. Accordingly, it is possible to prevent light emitted from the active layer 126 from being absorbed in the semiconductor layer.

Light L1 obliquely emitted by the sub-reflective layer 135 may be reflected upwardly. Accordingly, it is possible to reduce light absorption in the semiconductor structure 120 and enhance the light extraction efficiency. Also, it is also possible to adjust an orientation angle of the semiconductor device.

The sub-reflective layer 135 may cover a portion of the second electrode 246. According to such a configuration, light flowing into a space between the first insulation layer 131 and the second electrode 246 may be reflected upwardly. However, the sub-reflective layer 135, which is made of aluminum, has relatively poor step coverage, and thus it may not be preferable to fully cover the second electrode 246.

The thickness of the second electrode 246 may be less than or equal to 80% of the thickness of the first insulation layer 131. Thus, it is possible to solve a problem such as a crack or detachment of the sub-reflective layer 135 or the second conductive layer 150 due to a reduction in step coverage which may occur when the sub-reflective layer 135 and the second conductive layer 150 are disposed.

The sub-reflective layer 135 may have the same width as the sub-recess 127. The width of the first recess 128 and the width of the sub-recess 127 may indicate the maximum width formed on the first surface 127G of the semiconductor structure 120.

The sub-reflective layer 135 may include an extension part 135a extending toward the second electrode 246 in the sub-recess 127. The extension part 135a may electrically connect second electrodes 246 separated by the sub-recess 127.

The sub-reflective layer 135 may be disposed in a separation distance between the second electrode 246 and the first insulation layer 131, and a region where a Schottky junction is formed between the sub-reflective layer 135 and the second conductive semiconductor layer 127 may be within the separation distance. By forming the Schottky junction, it is possible to facilitate spreading of electric current.

An angle θ4 formed between an inclined portion of the sub-reflective layer 135 and the first surface of the second conductive semiconductor layer 127 may range from 90 degrees to 145 degrees. When the incline angle θ4 is less than 90 degrees, it is difficult to etch the second conductive semiconductor layer 127. When the incline angle θ4 is greater than 145 degrees, the etched area of the active layer is so large that there may be a reduction in light emitting efficiency.

The second conductive layer 150 may cover the sub-reflective layer 135 and the second electrode 246. Accordingly, the second electrode pad 166, the second conductive layer 150, the sub-reflective layer 135, and the second electrode 246 may form one electrical channel. All the above-described configurations may be applied as the configuration of the second conductive layer 150.

Referring to FIG. 41, the sub-reflective layer 135 may be disposed between the plurality of recesses 128 to define a plurality of light emitting regions. The areas of the light emitting regions may be adjusted depending on the level of injected electric current and the aluminum composition.

Figure 42:
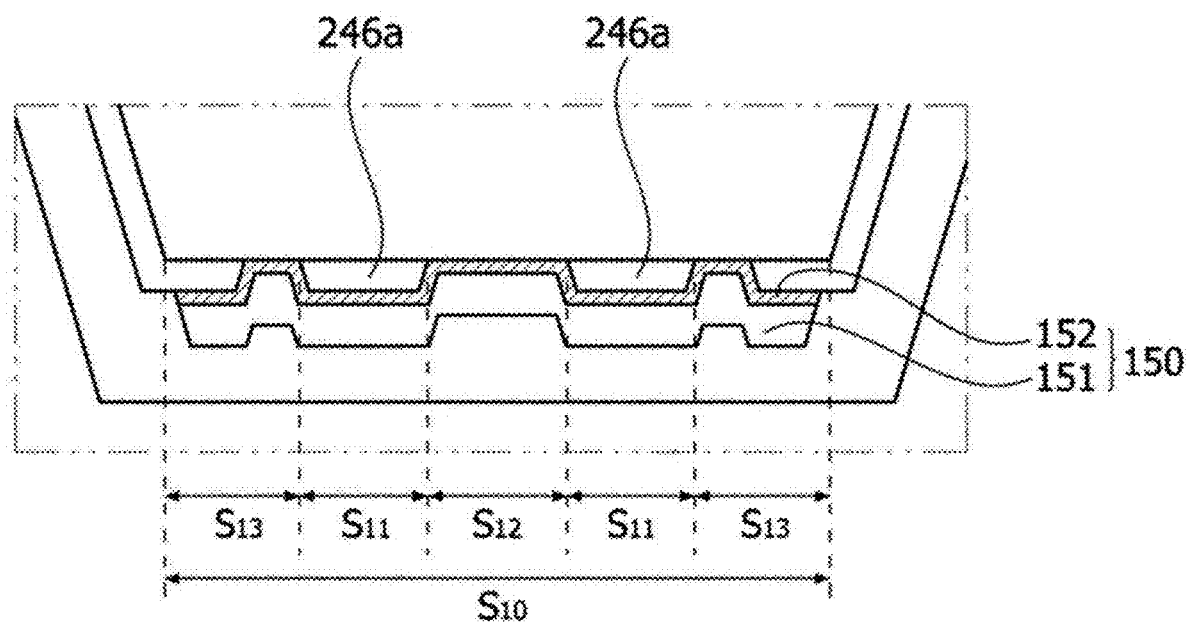
FIG. 42 is a third modification of FIG. 39.

FIG. 42 is a third modification of FIG. 39.

The second conductive layer 150 may include a reflective layer 151 containing aluminum and a first intermediate layer 152 disposed between the second electrode 246 and the reflective layer 151. When the second electrode 246 is formed of ITO, oxygen may penetrate into the reflective layer 151 to form Al2O3. In this case, the reflective efficiency of the reflective layer 151 is reduced. In an embodiment, the first intermediate layer 152 may be disposed between the reflective layer 151 and the second electrode 246, thereby enhancing adhesion strength therebetween and also preventing penetration of oxygen.

The first intermediate layer 152 may contain at least one of chromium (Cr), titanium (Ti), and nickel (Ni). The first intermediate layer 152 may have a thickness ranging from 0.7 m to 7 nm. The first intermediate layer 152 may further contain aluminum. In this case, it is possible to enhance adhesion strength between the first intermediate layer 152 and the aluminum.

The first intermediate layer 152 may be in contact with the first surface 127G of the second conductive semiconductor layer 127 in the second section S12 and the third section S13. Accordingly, it is possible to enhance the electric current spreading efficiency by means of a Schottky junction.

The thickness ratio of the second electrode 246 to the reflective layer 151 may range from 1:2 to 1:120. The thickness of the reflective layer 151 may range from 30 nm to 120 nm. When the thickness of the reflective layer 151 is less than 30 nm, there is a reduction in reflectance in an ultraviolet wavelength band. Even when the thickness is greater than 120 nm, reflective efficiency hardly increases.

Figure 43:
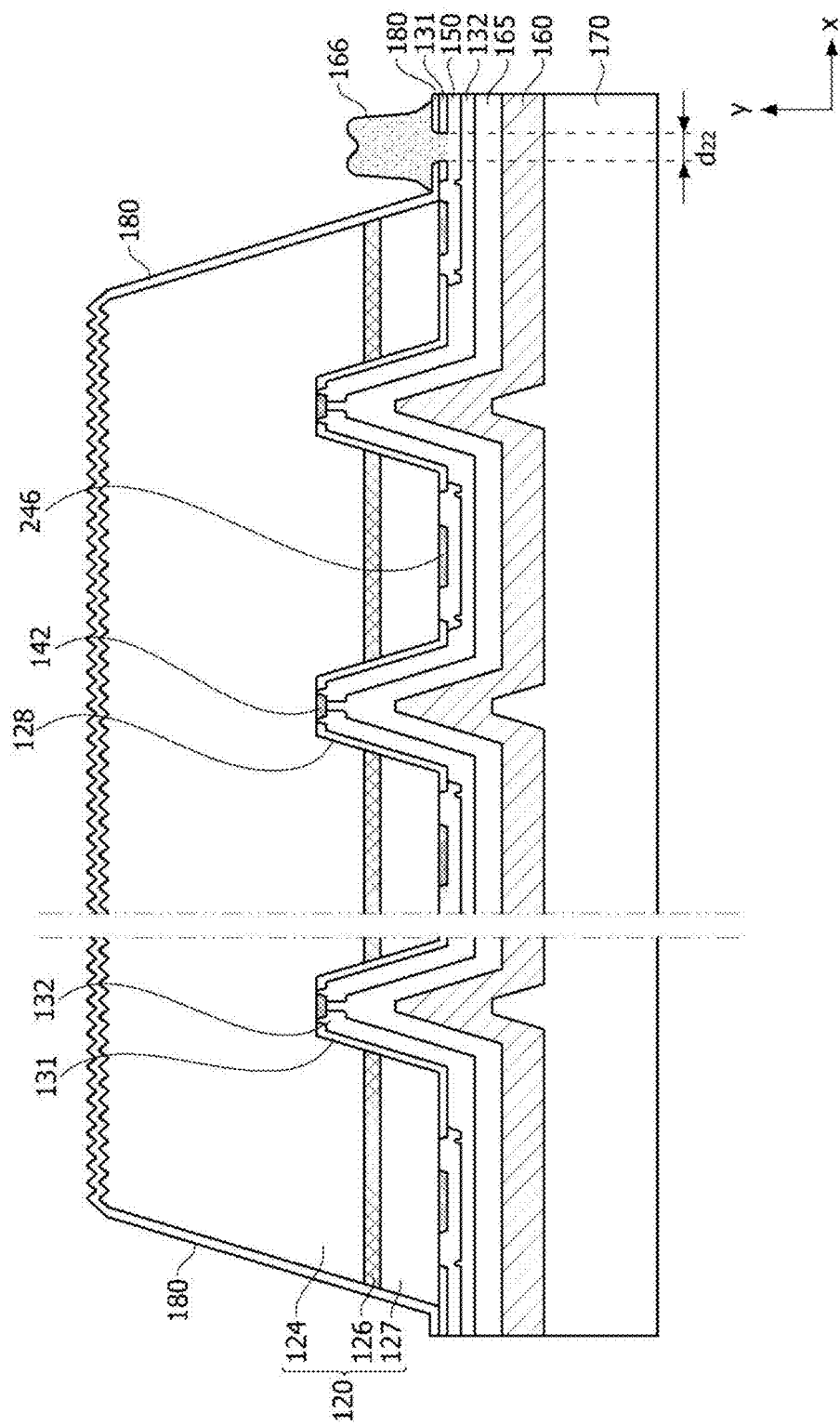
FIG. 43 is a conceptual view of a semiconductor device according to a sixth embodiment of the present invention.
Figure 44:
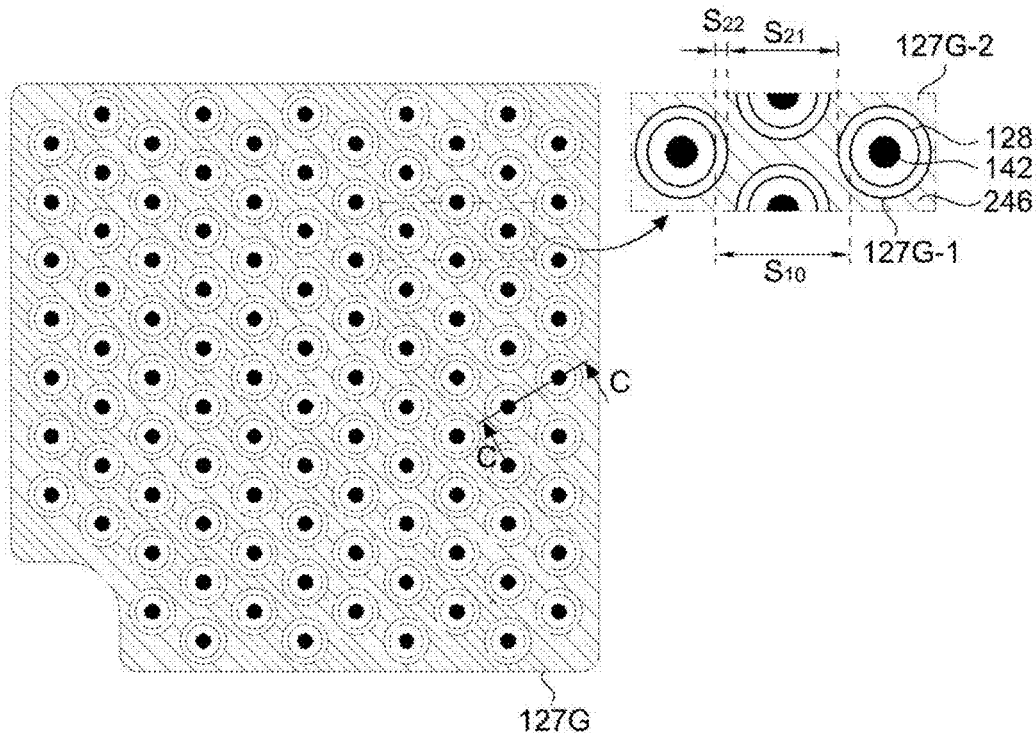
FIG. 44 is a plan view of FIG. 43.

FIG. 43 is a conceptual view of a semiconductor device according to a sixth embodiment of the present invention, and FIG. 44 is a plan view of FIG. 43.

Referring to FIG. 43, the above-described configuration of each layer may be applied to the semiconductor device according to this embodiment as it is.

Referring to FIG. 44, the first surface 127G may include first regions 127G-1 having recesses disposed therein and a second region 127G-2 disposed between the first regions 127G-1.

The diameter of the first regions 127G-1 may be 1.0 to 1.5 times that of the recesses 128. When the diameter of the first regions 127G-1 exceeds 1.5 times, the area of the second electrode 246 is so small that there may be a reduction in electric current spreading efficiency. The first regions 127G-1 may be a region between the second electrode 246 and the recesses 128.

The second region 127G-2 may be the remaining region other than the first regions 127G-1. The second electrode 246 may be disposed on the second region 127G-2 as a whole.

The second electrode 246 may contain a metal or metal oxide with low resistance. Accordingly, the second electrode 246 absorbs ultraviolet light. Accordingly, there is a need to reduce the amount of light absorbed by the second electrode 246 by decreasing the area of the second electrode 246.

The second conductive layer 150 is disposed on the first regions 127G-1 and the second region 127G-2, and thus light incident onto the first regions 127G-1 may be reflected by the second conductive layer 150. Accordingly, it is possible to increase light extraction efficiency by decreasing the area of the second region 127G-2 where the second electrode 246 is disposed and increasing the area of the first regions 127G-1. In this case, it is important to maximally secure a reflective region while securing the area of the second electrode 246 needed to spread electric current.

The area of the second region 127G-2 may range from 35% to 60% of the maximum area of the semiconductor structure 120. When the area of the second region 127G-2 is less than 35%, the contact area of the second electrode 246 is so small that the electric current spreading efficiency may be reduced. Also, when the area of the second region 127G-2 exceeds 60%, the area of the first regions 127G-1 is so small that the light extraction efficiency may decrease.

The area of the first regions 127G-1 may range from 10% to 55% of the maximum area of the semiconductor structure 120. When the area of the first regions 127G-1 is less than 10%, it is difficult to have sufficient reflective efficiency. When the area of the first regions 127G-1 is greater than 55%, the area of the second region 127G-2 is so small that there may be a decrease in electric current injection efficiency.

Accordingly, the ratio of the area of the first regions 127G-1 to the area of the second region 127G-2 may range from 1:0.7 to 1:6. When this relationship is satisfied, the electric current spreading efficiency is sufficient, and thus it is possible to enhance the optical output power. Also, a sufficient reflective region is secured, and thus it is possible to enhance the light extraction effect.

Figure 45:
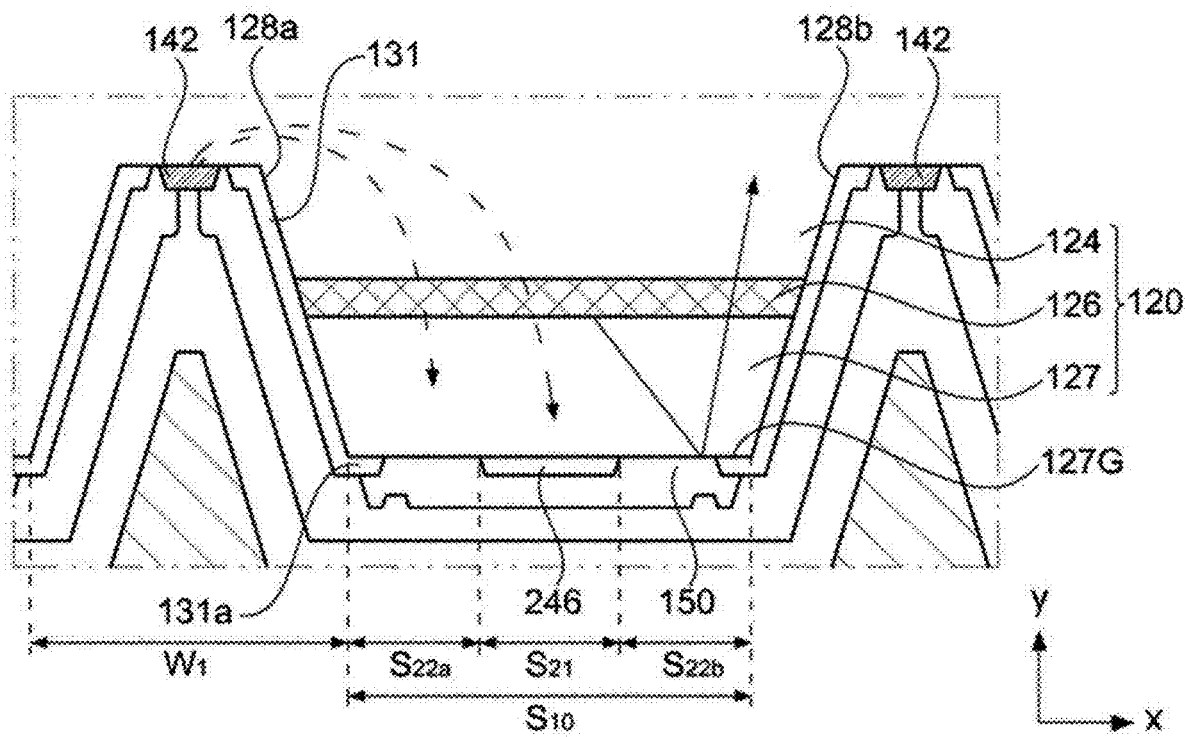
FIG. 45 is a sectional view taken along C-C of FIG. 44.

FIG. 45 is a sectional view taken along C-C of FIG. 44.

The first surface 127G of the second conductive semiconductor layer may include a 1-1 surface S10 disposed between the center of two first and second recesses 128a and 128b that are most adjacent to each other in a first direction (the X direction). In this case, the first direction may be a direction perpendicular to the thickness direction of the semiconductor structure 120.

The 1-1 surface S10 may include a first section S21 and second sections S22a and S22b disposed between the first section S21 and first and second recesses 128a and 128b.

The second sections S22a and S22b may include a 2-1 section S22a disposed between the first section S21 and the first recess 128a and a 2-2 section S22b disposed between the first section S21 and the second recess 128b.

The second electrode 246 may be disposed in the first section S21. When the second electrode 246 is disposed in only the second sections S22a and S22b, the electric current density of the second sections S22a and S22b may increase, but the electric current density of the first section S21 may relatively decrease. Also, when the second electrode 246 is disposed in all of the first section S21 and the second sections S22a and S22b, light absorption may occur in all of the first section S21 and the second sections S22a and S22b. This may not be beneficial to light extraction efficiency.

The second conductive layer may be disposed in the first section S21 and the second sections S22a and S22b. Accordingly, the second sections S22a and S22b where the second electrode 246 is not disposed may perform a reflection function.

According to an embodiment, it is important to appropriately determine a distance between the first electrode 142 and the second electrode 246 in order to secure light extraction efficiency while securing an electric current density needed for light emission.

For example, when the area of the first electrode 142 is large, an electric current spreading region is widened, and thus it is possible to increase the area of the second sections S22a and S22b. Accordingly, it is possible to widen the reflective region. However, when the area of the first electrode 142 is small, the electric current spreading region is narrowed, and thus the second sections S22a and S22b may be narrowed.

The ratio of the width of the 2-1 section S22b in the first direction to the diameter W1 of the first recess 128a may range from 1:1.25 to 1:14. When the ratio is smaller than 1:1.25, the diameter of the recesses 128 is reduced, and thus the area of the first electrode 142 decreases. Accordingly, the strength of electric current injected through the first electrode 142 is weakened, and thus the electric current density of the second sections S22a and S22b may be reduced.

When the ratio is greater than 1:14, the diameter of the recesses 128 is excessively increased, and thus the area of the first surface 127G of the second conductive semiconductor layer decreases. That is, the width of the 1-1 surface S10 decreases. As a result, the area of the active layer 126 decreases, and thus the light emitting region is reduced.

The diameter W1 of the recesses 128 may range from 20 μm to 70 μm. When the diameter of the recesses 128 is less than 20 μm, it is difficult to secure a processing margin for forming the first electrode 142 disposed therein. When the diameter of the recesses 128 is greater than 70 μm, the area of the active layer 126 is so small that the light emission efficiency may deteriorate. Here, the diameter of the recess 128 may be the maximum diameter formed on the first surface 127G of the second conductive semiconductor layer.

The width of the first section S21 in the first direction may range from 6 μm to 12 μm. When the width is less than 6 μm, the area of the second electrode 246 is so small that there may be a decrease in electric current spreading efficiency. When the width is greater than 12 μm, the second sections S22a and S22b are so small that there may be a decrease in reflective efficiency.

The widths of the 2-1 section S22a and the 2-2 section S22b in the first direction may range from 5 μm to 16 μm. That is, the entire width of the second sections S22a and S22b may range from 10 μm to 32 μm. When the widths of the 2-1 section S22a and the 2-2 section S22b in the first direction are less than 5 μm, it is difficult to secure a sufficient reflective region. When the widths are greater than 16 μm, the second electrode 246 is narrowed.

The ratio of the width of the first section S21 to the entire width of the second sections S22a and S22b may range from 1:0.8 to 1:5. When the width ratio range is satisfied, the ratio of the area of the first regions 127G-1 to the area of the second region 127G-2 may be adjusted to be in the range of 1:0.8 to 1:6. Accordingly, it is possible to enhance the electric current spreading efficiency and the light extraction effect.

The first section S21 may include a point corresponding to ½ of the 1-1 surface S10. Since the second electrode 246 is disposed at the center of the 1-1 surface S10, the electric current density of the first section S21 may increase. Also, since the electric current density of the first section S21 increases, electric current is spread in the second sections S22a and S22b disposed therebetween, and it is possible to secure an electric current density needed for light emission.

However, the present invention is not limited thereto. When the diameter of the first recess 128a is different from the diameter of the second recess 128b, the first section S21 may deviate from the point corresponding to ½ of the 1-1 surface S10.

Figure 46:
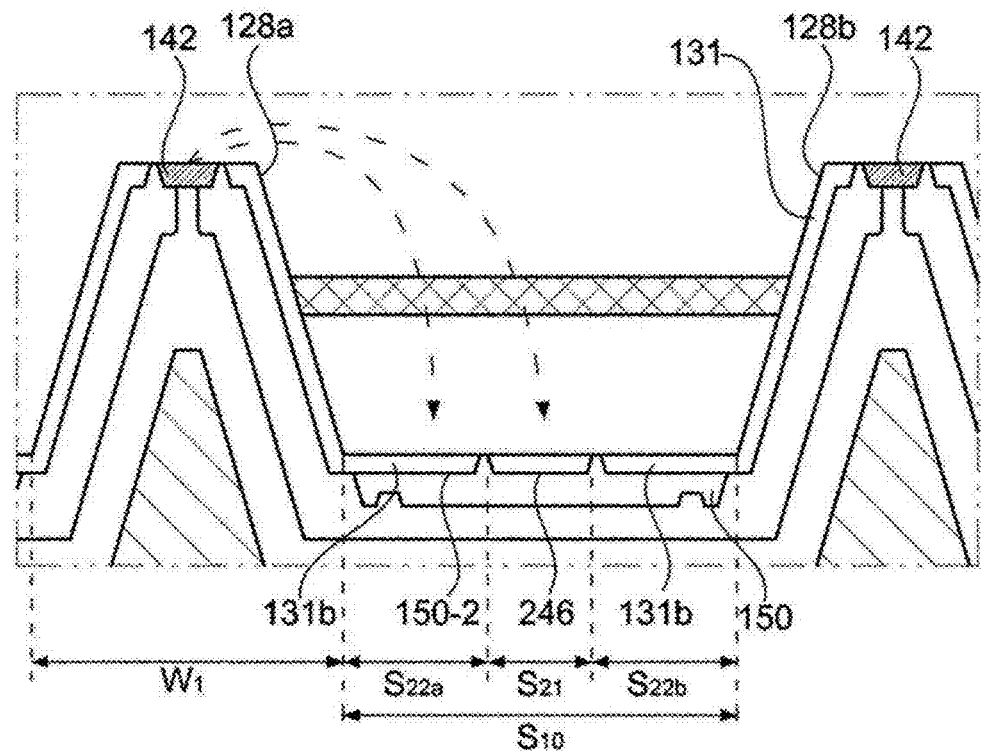
FIG. 46 is a first modification of FIG. 45.
Figure 47:
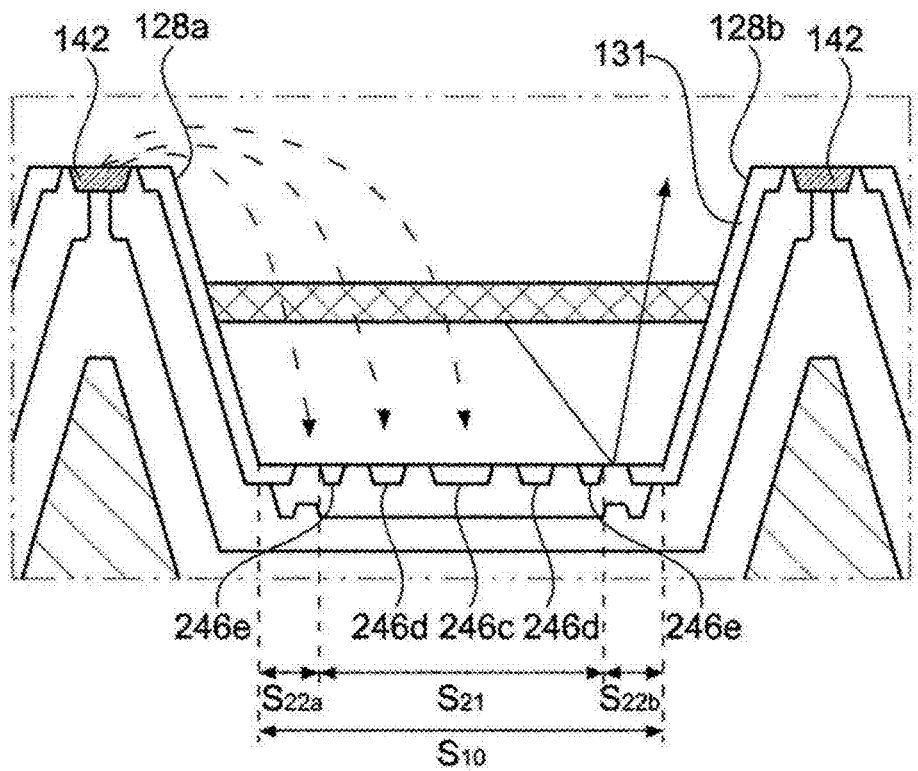
FIG. 47 is a second modification of FIG. 45.

FIG. 46 is a first modification of FIG. 45, and FIG. 47 is a second modification of FIG. 45.

The second conductive layer 150 may include a reflective groove 150-2 in the second sections S22a and S22b. Light incident onto the second sections S22a and S22b may be reflected along a propagation path changed by an inclined surface of the reflective groove 150-2. According to such a configuration, it is possible to enhance light uniformity.

The depth of the reflective groove 150-2 may be the same as the thickness of the first insulation layer 131. The thickness of the first insulation layer 131 may be equal to 110% to 130% of the thickness of the second electrode 246. As described above, the thickness of the second electrode 246 may range from 1 nm to 15 nm.

A light transmitting layer 131b may be disposed in the reflective groove 150-2. The shape of the light transmitting layer 131b may correspond to the shape of the reflective groove 150-2. Accordingly, the thickness of the light transmitting layer 131b may be the same as the thickness of the reflective groove 150-2. For example, the reflective groove 150-2 may be formed by disposing the second conductive layer 150 on the light transmitting layer 131b.

The material of the light transmitting layer 131b may include various materials capable of transmitting ultraviolet wavelength light. For example, the light transmitting layer 131b may include an insulation layer material. The light transmitting layer 131b may include at least one of $SiO_2$, $Si_xO_y$, $Si_3N_4$, $Si_xN_y$, $SiO_xN_y$, $Al_2O_3$, $TiO_2$, and AlN, but is not limited thereto.

The light transmitting layer 131b may be formed by the first insulation layer 131 disposed inside the first recess 128a extending to the second conductive semiconductor layer. However, the present invention is not limited thereto, and a separate dielectric layer may be disposed.

Referring to FIG. 47, the second electrode 246 may have a density decreasing away from the center point of the 1-1 surface S10. That is, partitioned second electrodes 246, 246d, and 246e may be disposed to have a size decreasing away from the center. The partitioned second electrodes 246c, 246d, and 246e may be produced through selective etching by means of a mask.

According to such a configuration, it is possible to increase the electric current density of the second sections S22a and S22b while maintaining the electric current density of the first section S21. Also, it is possible to obtain both electric current spreading efficiency and reflective efficiency by maintaining the area ratio of the first section S21 to the second sections S22a and S22b in the range of 1:0.8 to 1:6.

Figure 48:
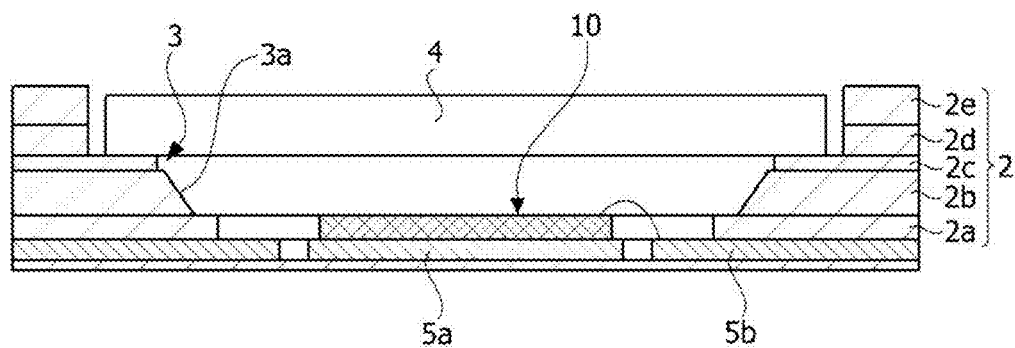
FIG. 48 is a conceptual view of a semiconductor device package according to an embodiment of the present invention.
Figure 49:
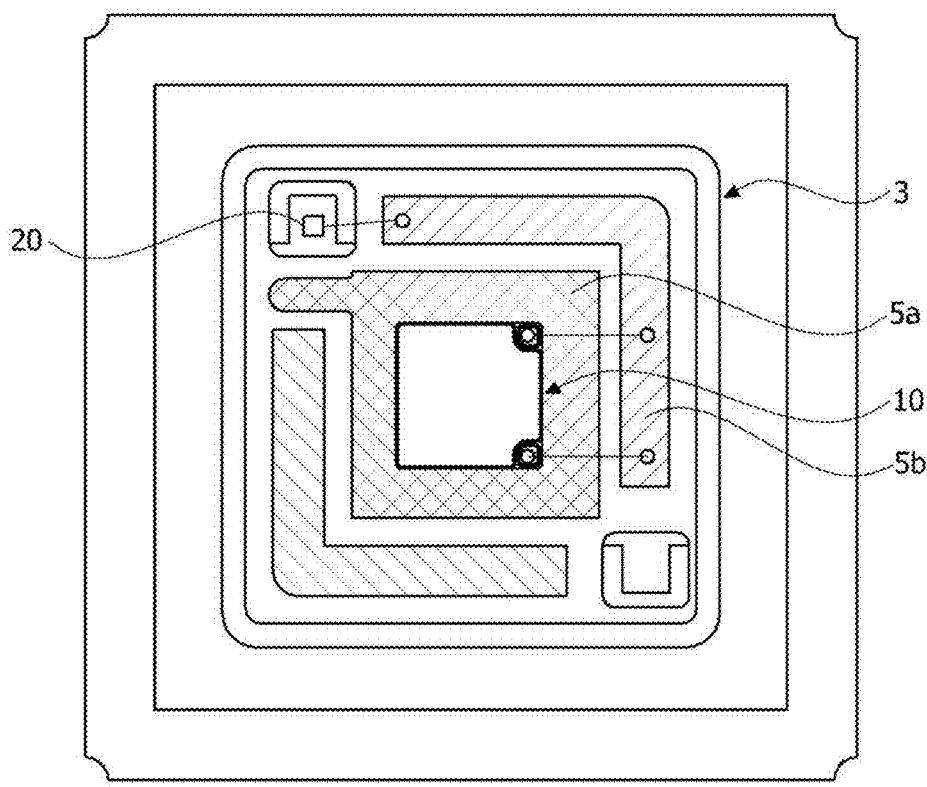
FIG. 49 is a plan view of a semiconductor device package according to an embodiment of the present invention.
Figure 50:
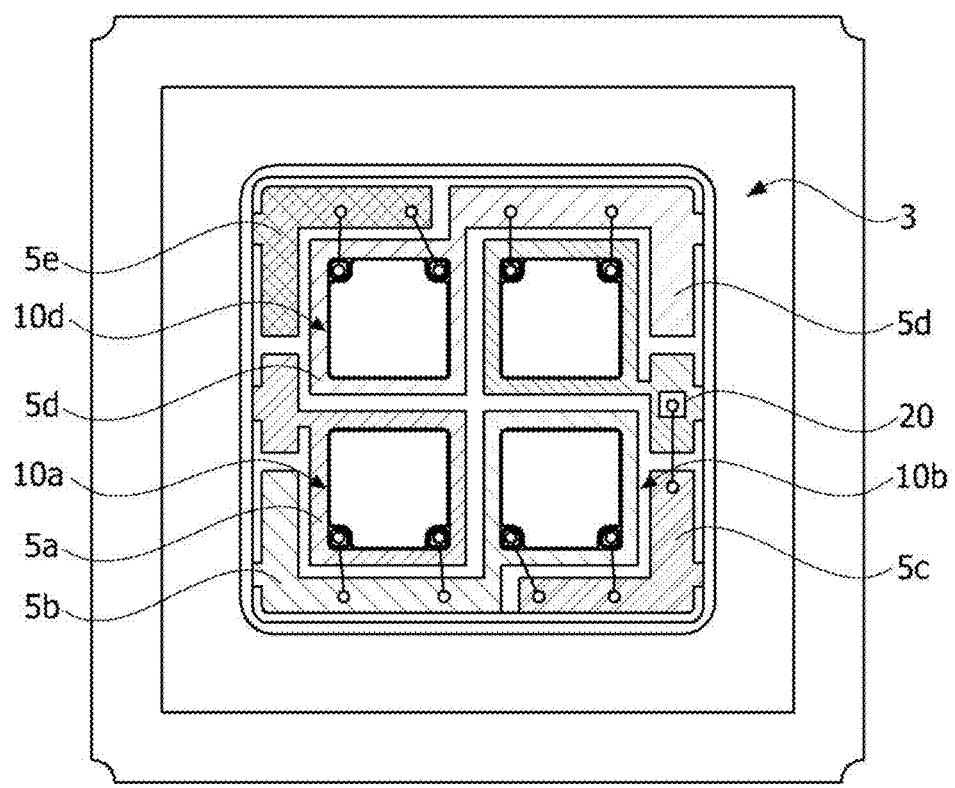
FIG. 50 is a modification of FIG. 49.

FIG. 48 is a conceptual view of a semiconductor device package according to an embodiment of the present invention, FIG. 49 is a plan view of the semiconductor device package according to an embodiment of the present invention, and FIG. 50 is a modification of FIG. 49.

Referring to FIG. 48, the semiconductor device package may include a body 2 with a groove (an opening) 3, a semiconductor device 1 disposed in the body 2, and a pair of lead frames 5a and 5b disposed in the body 2 and electrically connected to the semiconductor device 1. The semiconductor device 1 may include all of the above-described elements.

The body 2 may contain a material or a coating layer that reflects ultraviolet light. The body 2 may be formed by stacking a plurality of layers 2a, 2b, 2c, 2d, and 2e. The plurality of layers 2a, 2b, 2c, 2d, and 2e may be made of the same material or contain different materials. For example, the plurality of layers 2a, 2b, 2c, 2d, and 2e may contain an aluminum material.

The groove 3 may have a width increasing away from the semiconductor device and may have an inclined surface having a stepped portion formed therein.

A light transmitting layer 4 may cover the groove 3. The light transmitting layer 4 may be made of glass, but is not limited thereto. The material of the light transmitting layer 4 is not particularly limited as long as the material can effectively transmit ultraviolet light. The groove 3 may have an empty space formed therein.

Referring to FIG. 49, a semiconductor device 10 may be disposed on a first lead frame 5a and connected with a second lead frame 5b by means of a wire. In this case, the second lead frame 5b may be disposed to surround the side surface of the first lead frame.

Referring to FIG. 50, the semiconductor device package may have a plurality of semiconductor devices 10a, 10b, 10c, and 10d disposed therein. In this case, the lead frame may include a first lead frame 5a, a second lead frame 5b, a third lead frame 5c, a fourth lead frame 5d, and a fifth lead frame 5e.

The first semiconductor device 10a may be disposed on the first lead frame 5a and connected with the second lead frame 5b by means of a wire. The second semiconductor device 10b may be disposed on the second lead frame 5b and connected with the third lead frame 5c by means of a wire. The third semiconductor device 10c may be disposed on the third lead frame 5c and connected with the fourth lead frame 5d by means of a wire. The fourth semiconductor device 10d may be disposed on the fourth lead frame 5d and connected with the fifth lead frame 5e by means of a wire.

The semiconductor device may be applied to various kinds of light source devices. For example, conceptually, the light source devices may include a sterilizing device, a curing device, a lighting device, a display device, and a vehicle lamp. That is, the semiconductor device may be applied to various electronic devices configured to provide light by being disposed in housing thereof.

The sterilizing device may have a semiconductor device of an embodiment to sterilize a desired region. The sterilizing device may be applied to home appliances such as a water purifiers, air conditioners, and refrigerators, but is not limited thereto. That is, the sterilizing device may be applied in various products needing to be sterilized (e.g., medical apparatuses).

For example, a water purifier may have the sterilizing device of an embodiment to sterilize circulating water. The sterilizing device may be placed at a nozzle or a discharging port through which water circulates and configured to emit ultraviolet light. In this case, the sterilizing device may include a waterproof structure.

The curing device may have a semiconductor device of an embodiment to cure various kinds of liquids. Conceptually, the liquids may include various materials that are cured when ultraviolet light is emitted. For example, the curing device may cure various types of resins. Alternatively, the curing device may also be applied to cure beauty products such as manicure products.

The lighting device may include a light source module including a substrate and a semiconductor device of an embodiment, a heat dissipation unit configured to dissipate heat of the light source module, and a power supply unit configured to process or convert an electric signal from the outside and provide the electric signal to the light source module. Also, the lighting device may include a lamp, a headlamp, or a streetlight.

The display device may include a bottom cover, a reflective plate, a light emitting module, a light guide plate, an optical sheet, a display panel, an image signal output circuit, and a color filter. The bottom cover, the reflective plate, the light emitting module, the light guide plate, and the optical sheet may constitute a backlight unit.

The reflective plate may be placed on the bottom cover, and the light emitting module may emit light. The light guide plate may be placed in front of the reflective plate to guide light emitted by the light emitting module forward. The optical sheet may include a prism sheet or the like and may be placed in front of the light guide plate. The display panel may be placed in front of the optical sheet. The image signal output circuit may supply an image signal to the display panel. The color filter may be placed in front of the display panel.

When the semiconductor device is used as a backlight unit of a display device, the semiconductor device may be used as an edge-type backlight unit or a direct-type backlight unit.

The semiconductor device may be a laser diode rather than the above-described light emitting diode.

Like the light emitting device, the laser diode may include a first conductive semiconductor layer, an active layer, and a second conductive semiconductor layer that have the above-described structures. The laser diode may also utilize an electroluminescence phenomenon in which light is emitted when electric current flows after a p-type first conductive semiconductor and an n-type second conductive semiconductor are brought in contact with each other, but has a difference in the directionality and phase of the emitted light. That is, the laser diode uses stimulated emission and constructive interference so that light having a specific single wavelength may be emitted at the same phase and in the same direction. Due to these characteristics, the laser diode may be used for an optical communication device, a medical device, a semiconductor processing device, or the like.

A light receiving device may include, for example, a photodetector, which is a kind of transducer configured to detect light and convert intensity of the light into an electric signal. The photodetector may include a photocell (silicon and selenium), an optical output element (cadmium sulfide and cadmium selenide), a photodiode (e.g., a PD with a peak wavelength in a visible blind spectral region or a true blind spectral region), a photo transistor, a photomultiplier, a photoelectric tube (vacuum and gas filling), an infra-red (IR) detector, or the like, but is not limited thereto.

Generally, a semiconductor device such as the photodetector may be produced using a direct bandgap semiconductor having good photoelectric transformation efficiency. Alternatively, the photodetector may have various structures. As the most common structure, the photodetector may include a pin-type photodetector using a p-n junction, a Schottky photodetector using a Schottky junction, a metal-semiconductor-metal (MSM) photodetector, or the like.

Like the light emitting device, the photodiode may include a first conductive semiconductor layer and a second conductive semiconductor layer that have the above-described structures and may be formed as a p-n junction or a pin structure. The photodiode operates when a reverse bias or a zero bias is applied. When light is incident on the photodiode, electrons and holes are generated such that electric current flows. In this case, the magnitude of electric current may be approximately proportional to the intensity of the light incident on the photodiode.

A photocell or a solar cell, which is a kind of photodiode, may convert light into electric current. Like the light emitting device, the solar cell may include a first conductive semiconductor layer, an active layer, and a second conductive semiconductor layer that have the above-described structures.

Also, the solar cell may be used as a rectifier of an electronic circuit through the rectification characteristics of a general diode using a p-n junction and may be applied to an oscillation circuit or the like of a microwave circuit.

Also, the above-described semiconductor device is not necessarily implemented only with semiconductors. Depending on the case, the semiconductor device may additionally include a metal material. For example, a semiconductor device such as the light receiving device may be implemented using at least one of Ag, Al, Au, In, Ga, N, Zn, Se, P, and As and may be implemented using an intrinsic semiconductor material or a semiconductor material doped with a p-type dopant or an n-type dopant.

While the present invention has been described with reference to exemplary embodiments, these are just examples and do not limit the present invention. It will be understood by those skilled in the art that various modifications and applications may be made therein without departing from the essential characteristics of the embodiments. For example, elements described in the embodiments above in detail may be modified and implemented. Furthermore, differences associated with such modifications and applications should be construed as being included in the scope of the present invention defined by the appended claims.

What is claimed is:
1. A semiconductor device comprising:
a semiconductor structure including a first semiconductor layer, a second semiconductor layer, and an active layer;
a first electrode provided on a first surface of the first semiconductor layer;
a second electrode provided on a first surface of the second semiconductor layer, the active layer being provided between the first surface of the first semiconductor layer and a second surface of the second semiconductor layer that is opposite to the first surface of the second semiconductor layer;
a first insulation layer provided on the first surface of the first semiconductor layer, the first surface of the second semiconductor layer, and a side surface of the active layer;
a first cover electrode provided on the first electrode;
a second cover electrode provided on the second electrode,
a second insulation layer provided on the first cover electrode, the second cover electrode, and the first insulation layer,
wherein:
the second insulation layer includes a first opening over the first cover electrode and a second opening over the second cover electrode, and
a plan view of the semiconductor device includes a light emitting region that includes a surface of the second cover electrode in the second opening of the second insulation layer, and a non-light emitting region that includes a surface of the first cover electrode in the first opening of the second insulation layer, and a first area of the non-light emitting region is smaller than a second area of the light emitting region, wherein the second cover electrode includes a plurality of second branch electrodes extending in a first plan direction and a second connection electrode extending in a second plan direction to connect the plurality of branch electrodes, and the first cover electrode includes a plurality of first branch electrodes extending in the first plan direction and provided between the second branch electrodes and a first connection electrode in the second plan direction to connect the plurality of first branch electrodes.

2. The semiconductor device of claim 1, wherein a ratio of the first area of the non-light emitting region to the second area of the light emitting region ranges between 1:1.1 and 1:1.15.

3. The semiconductor device of claim 1, a ratio of a perimeter of the light emitting region to the second area of the light emitting region ranges between 0.02 and 0.05 (1/um).

4. The semiconductor device of claim 1, further comprising:
 a first bump electrode provided in the first opening of the second insulation layer and on the first cover electrode; and
 a second bump electrode provided in the second opening of the second insulation layer and on the second cover electrode.

* * * * *